(12) United States Patent
Mizutani et al.

(10) Patent No.: US 11,569,259 B2
(45) Date of Patent: Jan. 31, 2023

(54) THREE-DIMENSIONAL MEMORY DEVICE WITH DOUBLE-SIDED STEPPED SURFACES AND METHOD OF MAKING THEREOF

(71) Applicant: SANDISK TECHNOLOGIES LLC, Addison, TX (US)

(72) Inventors: Yuki Mizutani, San Jose, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 92 days.

(21) Appl. No.: 16/985,305

(22) Filed: Aug. 5, 2020

(65) Prior Publication Data

US 2022/0045089 A1 Feb. 10, 2022

(51) Int. Cl.

| | |
|---|---|
| *H01L 27/11582* | (2017.01) |
| *H01L 23/528* | (2006.01) |
| *H01L 27/11565* | (2017.01) |
| *H01L 23/522* | (2006.01) |
| *H01L 27/1157* | (2017.01) |

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11565* (2013.01)

(58) Field of Classification Search
CPC .......................................... H01L 27/115–11597
See application file for complete search history.

(56) References Cited

U.S. PATENT DOCUMENTS

| | | |
|---|---|---|
| 9,224,747 B2 | 12/2015 | Mizutani et al. |
| 9,960,181 B1 | 5/2018 | Cui et al. |
| 10,115,681 B1 | 10/2018 | Ariyoshi |
| 10,283,493 B1 | 5/2019 | Nishida |
| 10,290,803 B2 | 5/2019 | Sano et al. |

(Continued)

OTHER PUBLICATIONS

Notification of Transmittal of the International Search Report and the Written Opinion of the International Searching Authority for International Patent Application No. PCT/US2021/035315, dated Aug. 19, 2021, 10 pages.

(Continued)

*Primary Examiner* — Didarul A Mazumder
*Assistant Examiner* — Gustavo G Ramallo
(74) *Attorney, Agent, or Firm* — The Marbury Law Group PLLC

(57) ABSTRACT

A memory die can include an alternating stack of insulating layers and electrically conductive layers located over a substrate, and memory stack structures vertically extending through the alternating stack. A first layer stack within the alternating stack includes a first staircase region in which the first electrically conductive layers have respective lateral extents that increase with a vertical distance from the substrate to provide first stepped surfaces. A second layer stack within the alternating stack includes a second staircase region in which the second electrically conductive layers have respective lateral extents that decrease with the vertical distance from the substrate to provide second stepped surfaces. The second layer stack can be more distal from the substrate than the first layer stack. Contact via structures can be formed from the top side and the bottom side of the alternating stack.

8 Claims, 60 Drawing Sheets

(56) References Cited

U.S. PATENT DOCUMENTS

| | | | |
|---|---|---|---|
| 10,304,852 B1* | 5/2019 | Cui | H01L 27/11565 |
| 10,483,280 B1 | 11/2019 | Xiao et al. | |
| 10,629,606 B2 | 4/2020 | Sugawara et al. | |
| 2011/0201167 A1 | 8/2011 | Satonaka et al. | |
| 2014/0264906 A1 | 9/2014 | Fai et al. | |
| 2015/0325560 A1 | 11/2015 | Fai et al. | |
| 2016/0148946 A1 | 5/2016 | Hironaga | |
| 2019/0057974 A1 | 2/2019 | Lu et al. | |
| 2019/0221557 A1* | 7/2019 | Kim | H01L 27/1157 |
| 2019/0221558 A1 | 7/2019 | Chen et al. | |
| 2019/0319040 A1 | 10/2019 | Ishii et al. | |
| 2020/0006377 A1* | 1/2020 | Chu | H01L 23/528 |
| 2020/0027509 A1 | 1/2020 | Chen et al. | |
| 2020/0203364 A1 | 6/2020 | Totoki et al. | |

OTHER PUBLICATIONS

U.S. Appl. No. 16/827,990, filed Mar. 24, 2020, SanDisk Technologies LLC.
U.S. Appl. No. 16/782,307, filed Feb. 5, 2020, SanDisk Technologies LLC.
U.S. Appl. No. 16/774,372, filed Jan. 28, 2020, SanDisk Technologies LLC.
U.S. Appl. No. 16/747,943, filed Jan. 21, 2020, SanDisk Technologies LLC.
U.S. Appl. No. 16/675,459, filed Nov. 6, 2019, SanDisk Technologies LLC.
Endoh, T. et al., "Novel Ultra High Density Flash Memory with a Stacked-Surrounding Gate Transistor (S-GT) Structured Cell," IEDM Proc., pp. 33-36, (2001).
U.S. Appl. No. 16/671,561, filed Nov. 1, 2019, SanDisk Technologies LLC.
U.S. Appl. No. 16/547,971, filed Aug. 22, 2019, SanDisk Technologies LLC.
U.S. Appl. No. 16/589,404, filed Oct. 1, 2019, SanDisk Technologies LLC.
U.S. Appl. No. 16/261,869, filed Jan. 30, 2019, SanDisk Technologies LLC.

* cited by examiner

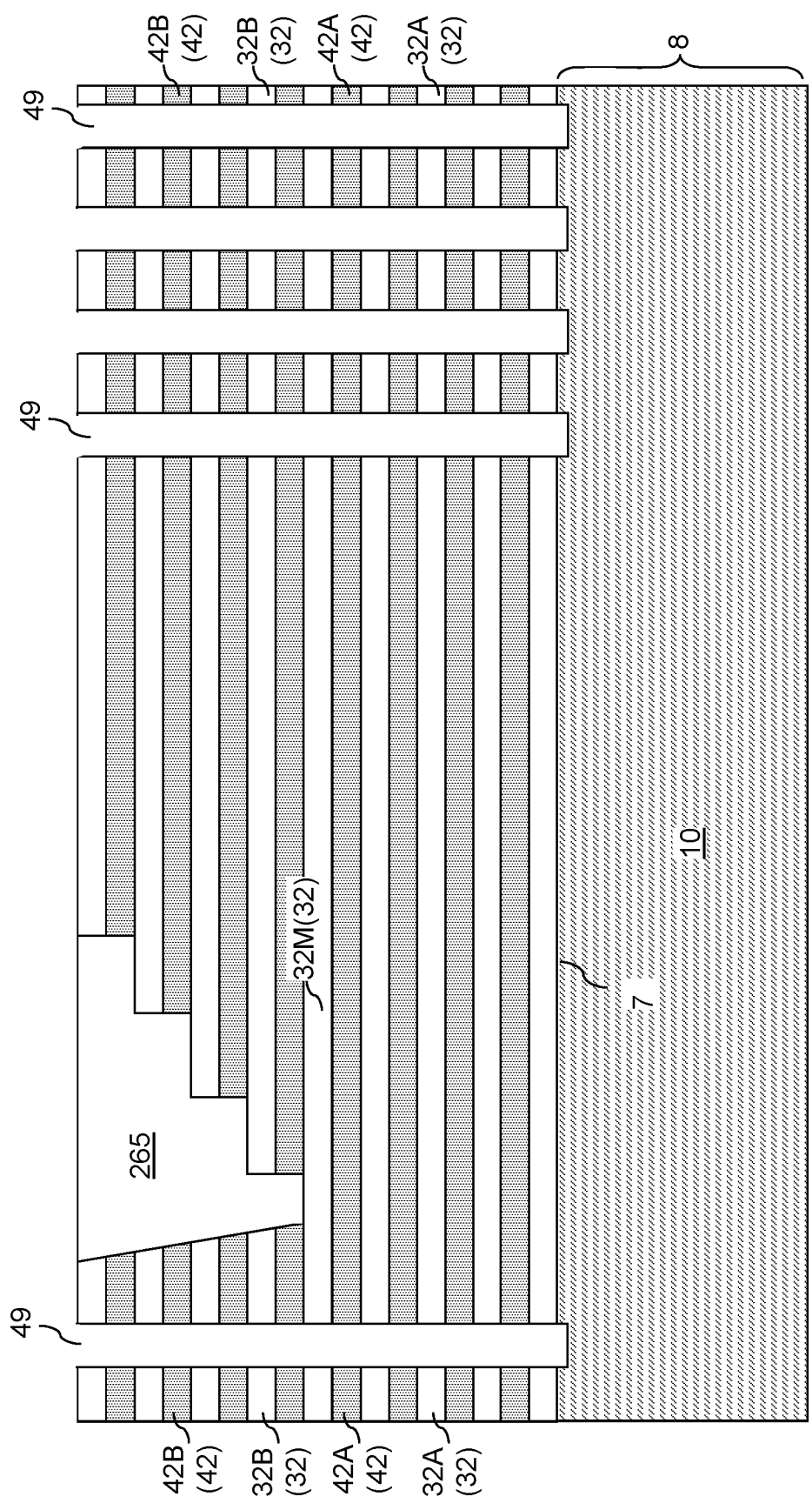

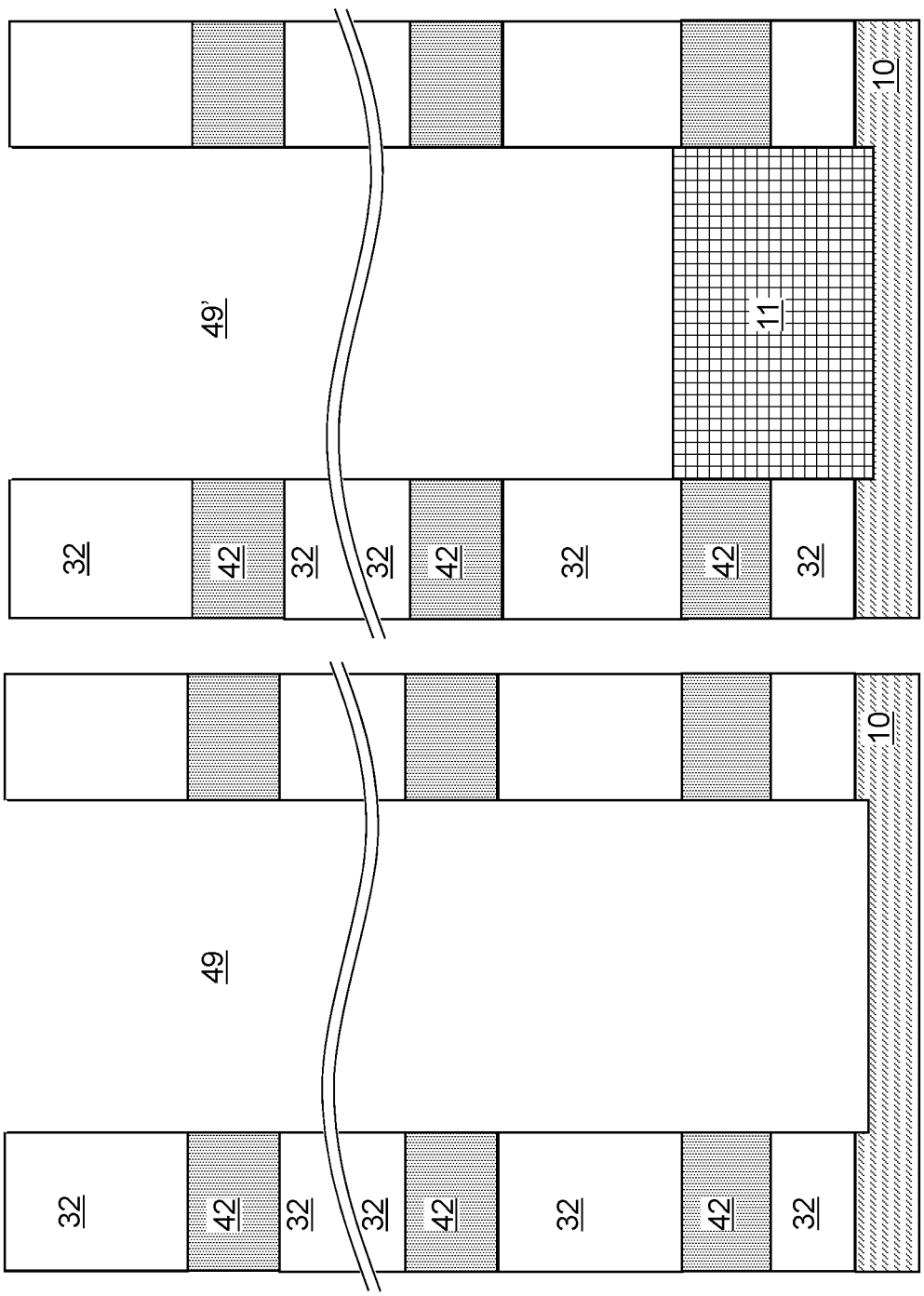

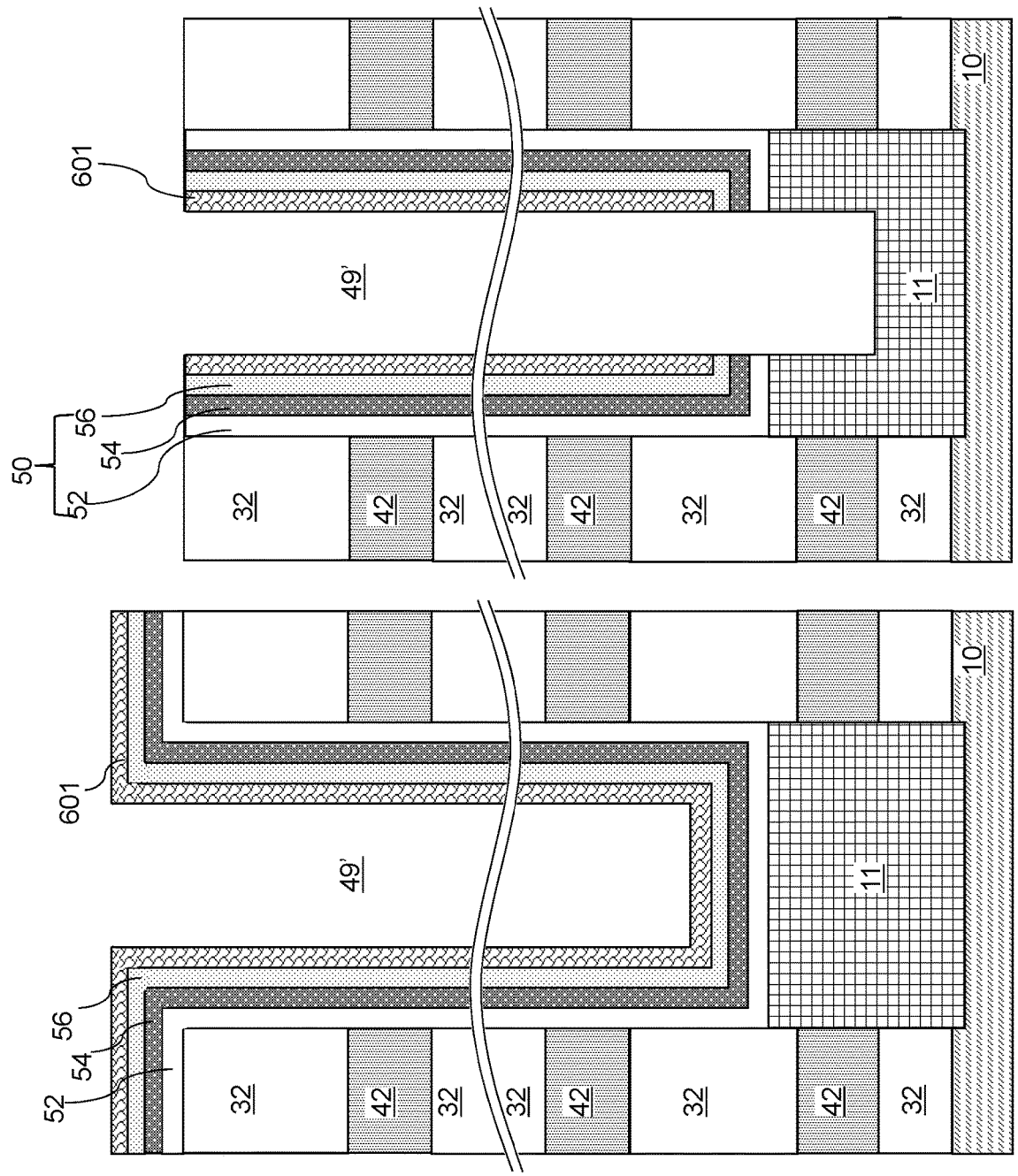

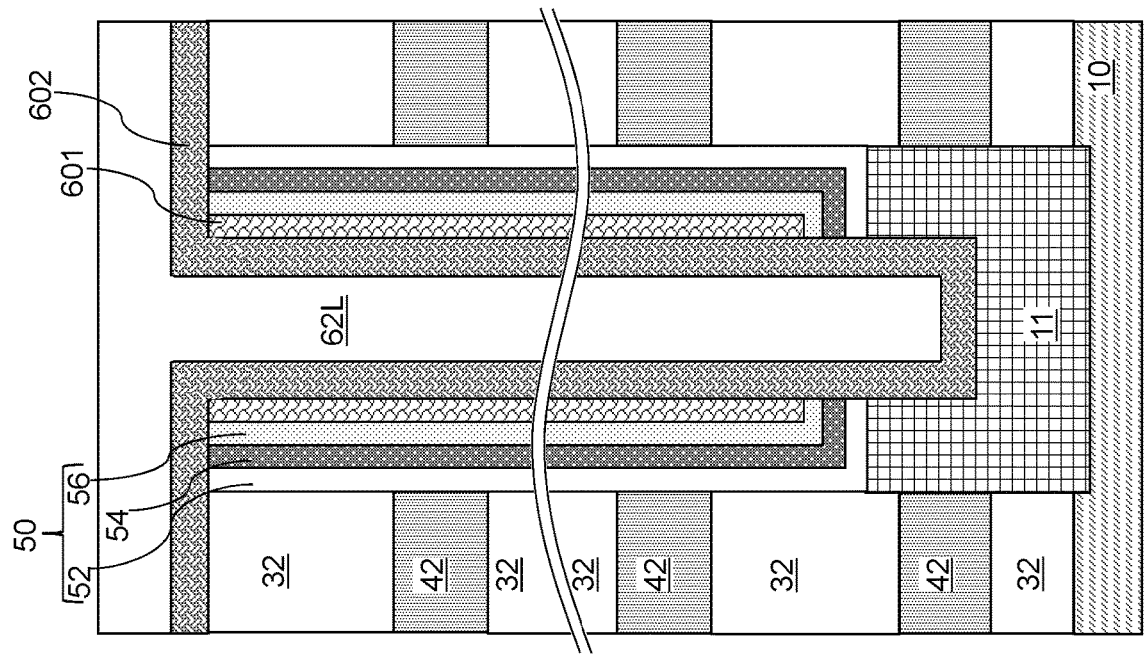
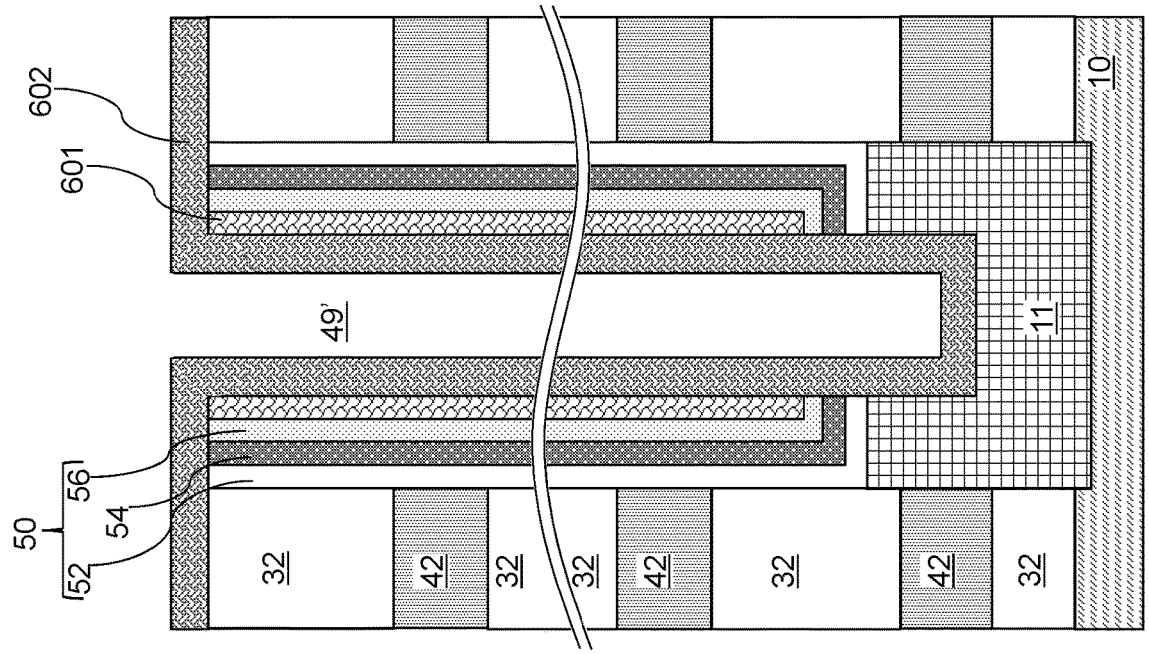

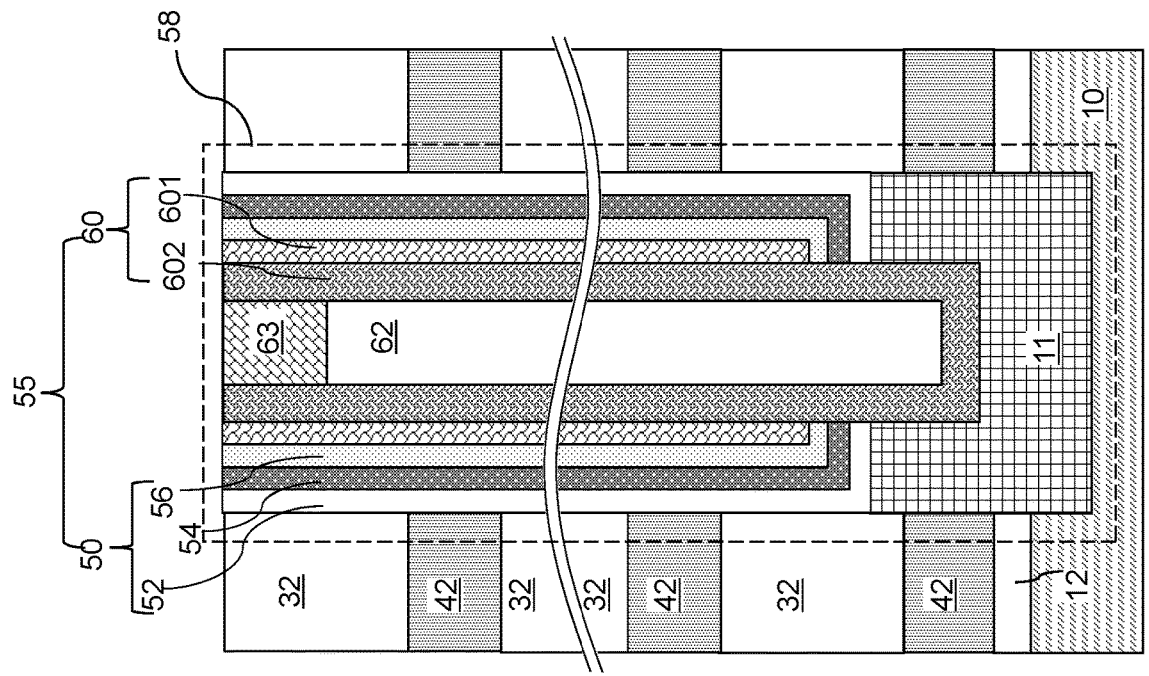
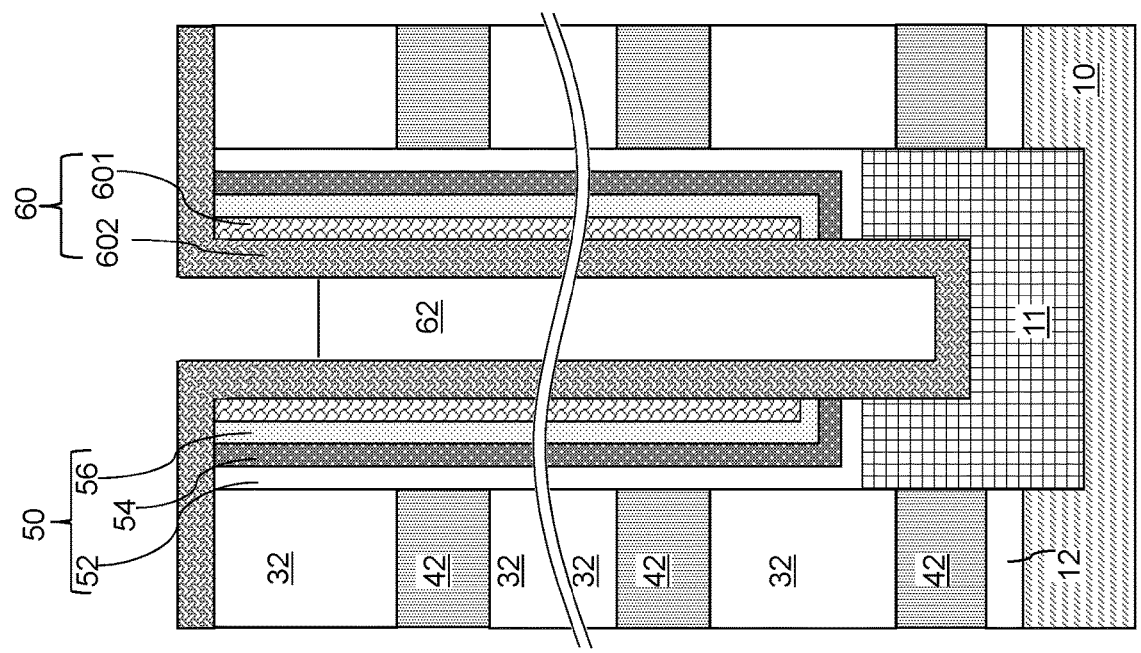

THREE-DIMENSIONAL MEMORY DEVICE WITH DOUBLE-SIDED STEPPED SURFACES AND METHOD OF MAKING THEREOF

FIELD

The present disclosure relates generally to the field of semiconductor devices, and particular to a three-dimensional memory device employing double-sided stepped surfaces and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure comprising a memory die is provided. The memory die comprises: an alternating stack of insulating layers and electrically conductive layers located over a substrate; and memory stack structures vertically extending through the alternating stack, wherein: the alternating stack comprises a first layer stack including first insulating layers and first electrically conductive layers and a second layer stack including second insulating layers and second electrically conductive layers and vertically spaced from the substrate by the first alternating stack; the first layer stack comprises a first staircase region in which the first electrically conductive layers have respective lateral extents that increase with a vertical distance from the substrate to provide first stepped surfaces; and the second layer stack comprises a second staircase region in which the second electrically conductive layers have respective lateral extents that decrease with the vertical distance from the substrate to provide second stepped surfaces.

According to another aspect of the present disclosure, a method of forming a semiconductor structure is provided, which comprises: forming an alternating stack of insulating layers and spacer material layers over a substrate comprising a semiconductor material layer, the alternating stack comprising a first layer stack of first insulating layers and first spacer material layers and a second layer stack of second insulating layers and second spacer material layers that is more distal from the substrate than the first layer stack is from the substrate, and the first spacer material layers and the second spacer material layers are formed as, or are subsequently replaced with, first electrically conductive layers and second electrically conductive layers, respectively; forming distal stepped surfaces by patterning the second layer stack, wherein lateral extents of the second spacer material layers decrease with a vertical distance from the substrate upon formation of the distal stepped surfaces; forming memory stack structures through the alternating stack, wherein each of the memory stack structures comprises a vertical semiconductor channel and a memory film; forming an opening through the semiconductor material layer; forming proximal stepped surfaces by patterning a portion of the first layer stack located within an area of the opening through the semiconductor material layer employing a plurality of masked anisotropic etch processes that etches unmasked regions of the portion of the first layer stack along a direction that points from the substrate toward the alternating stack; and forming an upright-stepped dielectric material portion on the proximal stepped surfaces of the first layer stack.

BRIEF DESCRIPTION OF THE DRAWINGS

FIG. 3B is a vertical cross-sectional view of the exemplary structure along the hinged vertical plane B-B' of FIG. 3A.

FIGS. 4A-4H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
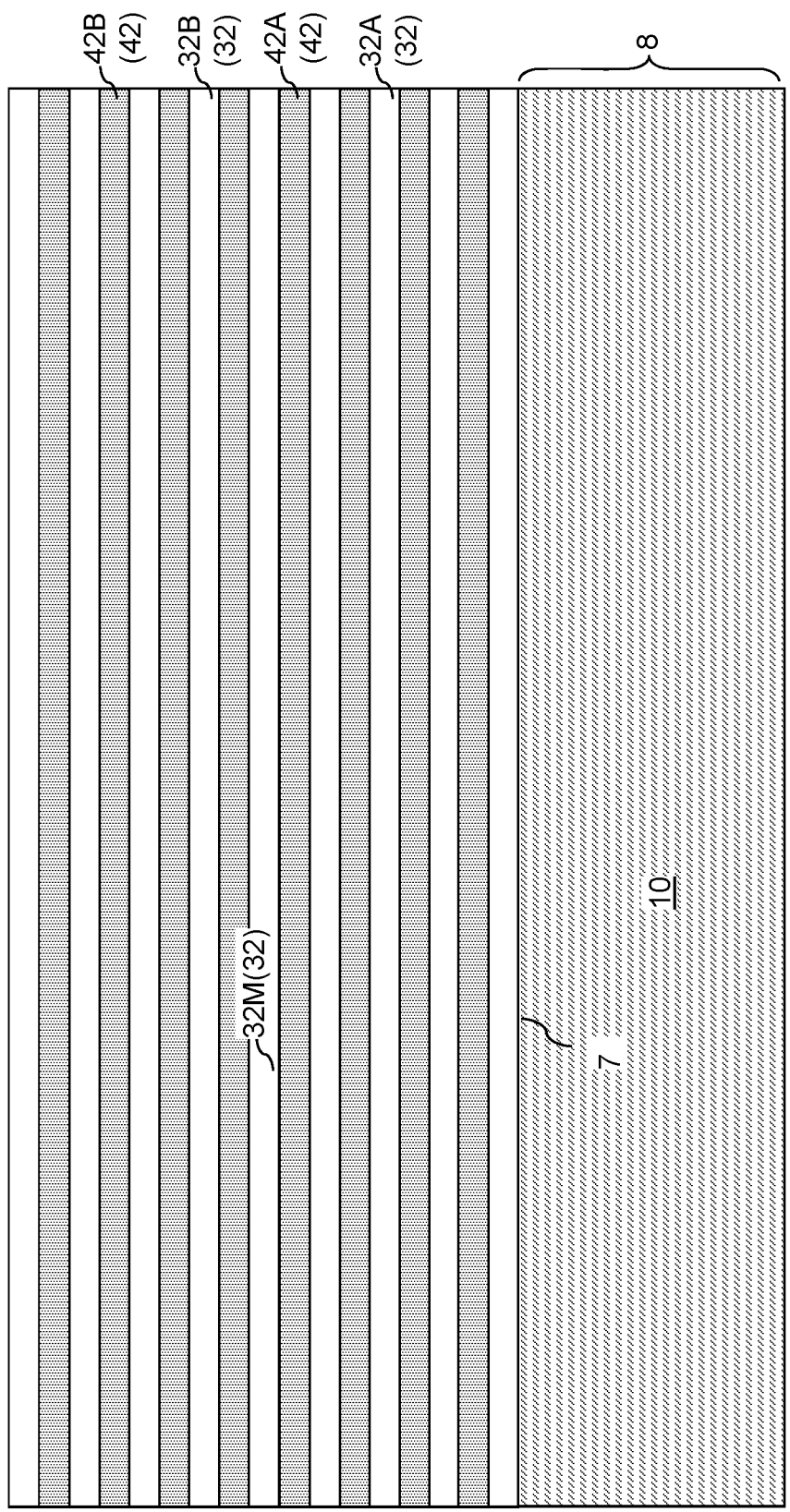
FIG. 1 is a schematic vertical cross-sectional view of an exemplary structure after formation of an alternating stack of insulating layers and spacer material layers over a substrate according to an embodiment of the present disclosure.

As discussed above, the present disclosure is directed to a three-dimensional memory device employing double-sided stepped surfaces and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings. A memory die incorporating the three-dimensional memory device may be bonded to a logic die to provide a bonded assembly of the memory die and the logic die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate 8, which can be a semiconductor substrate, such as a single crystal silicon wafer. The substrate 8 can include a semiconductor material layer 10 at least at an upper portion thereof. The semiconductor material layer 10 can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The semiconductor material layer 10 can have a major surface 7, which can be, for example, a front surface of the semiconductor material layer 10. In one embodiment, the semiconductor material layer 10 may be a single crystalline semiconductor layer such as a single crystalline silicon layer deposited on the substrate (e.g., single crystal silicon wafer) 8 or a doped well in the upper portion of the substrate (e.g., single crystal silicon wafer) 8. The thickness of the semiconductor material layer 10 may be in a range from 300 microns to 1 mm in case the substrate 8 consists of the semiconductor material layer 10. Alternatively, in case the substrate 8 comprises at least one additional layer (not shown) such as a combination of handle substrate and a buried insulating layer in a silicon-on-insulator configuration, the semiconductor material layer 10 may be a top silicon layer having a thickness in a range from 50 nm to 2,000 nm. Generally, the thickness of the semiconductor material layer 10 may be in a range from 50 nm to 1 mm, although lesser and greater thicknesses may also employed. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. The thickness of each insulating layer 32 may be in a range from 10 nm to 60 nm, although lesser and greater thicknesses may also be employed.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium. The thickness of each sacrificial layer 42 may be in a range from 10 nm to 60 nm, although lesser and greater thicknesses may also be employed.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

According to an aspect of the present disclosure, the alternating stack of insulating layers 32 and spacer material layers (such as the sacrificial material layers 42) include a first layer stack of first insulating layers 32A and first spacer material layers (such as first sacrificial material layers 42A) and a second layer stack of second insulating layers 32B and second spacer material layers (such as second sacrificial material layers 42B) that is more distal from the substrate 8 than the first layer stack (32A, 42A) is from the substrate 8. A mid-level insulating layer 32M (which is one of the insulating layers 32) may be provided between the first layer stack (32A, 42A). Generally, the first spacer material layers and the second spacer material layers are formed as, or are subsequently replaced with, first electrically conductive layers and second electrically conductive layers, respectively.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

The total number of pairs of a first insulating layer 32A and a first spacer material layer within the first layer stack (32A, 42A) can be in a range from 2 to 512, such as from 4 to 128, although lesser and greater numbers of pairs of a first insulating layer 32A and a first spacer material layer can be employed within the first layer stack (32A, 42A). The total number of pairs of a second insulating layer 32B and a second spacer material layer within the second layer stack (32B, 42B) can be in a range from 2 to 512, such as from 4 to 128, although lesser and greater numbers of pairs of a second insulating layer 32B and a second spacer material layer can be employed within the second layer stack (32B, 42B). The semiconductor material layer 10 can have a front surface (i.e., the major surface 7) in contact with a proximal planar surface of the alternating stack (32, 42) and a backside surface located on an opposite side of the front surface. In the instant application, the interface between the semiconductor material layer 10 and the alternating stack (32, 42) is employed as a reference plane for determining proximity or distance of elements, and as such, a proximal surface of an element refers to a surface that is proximal to the major surface 7 and a distal surface of an element refers to a surface that is distal from the major surface 7.

Figure 2A:
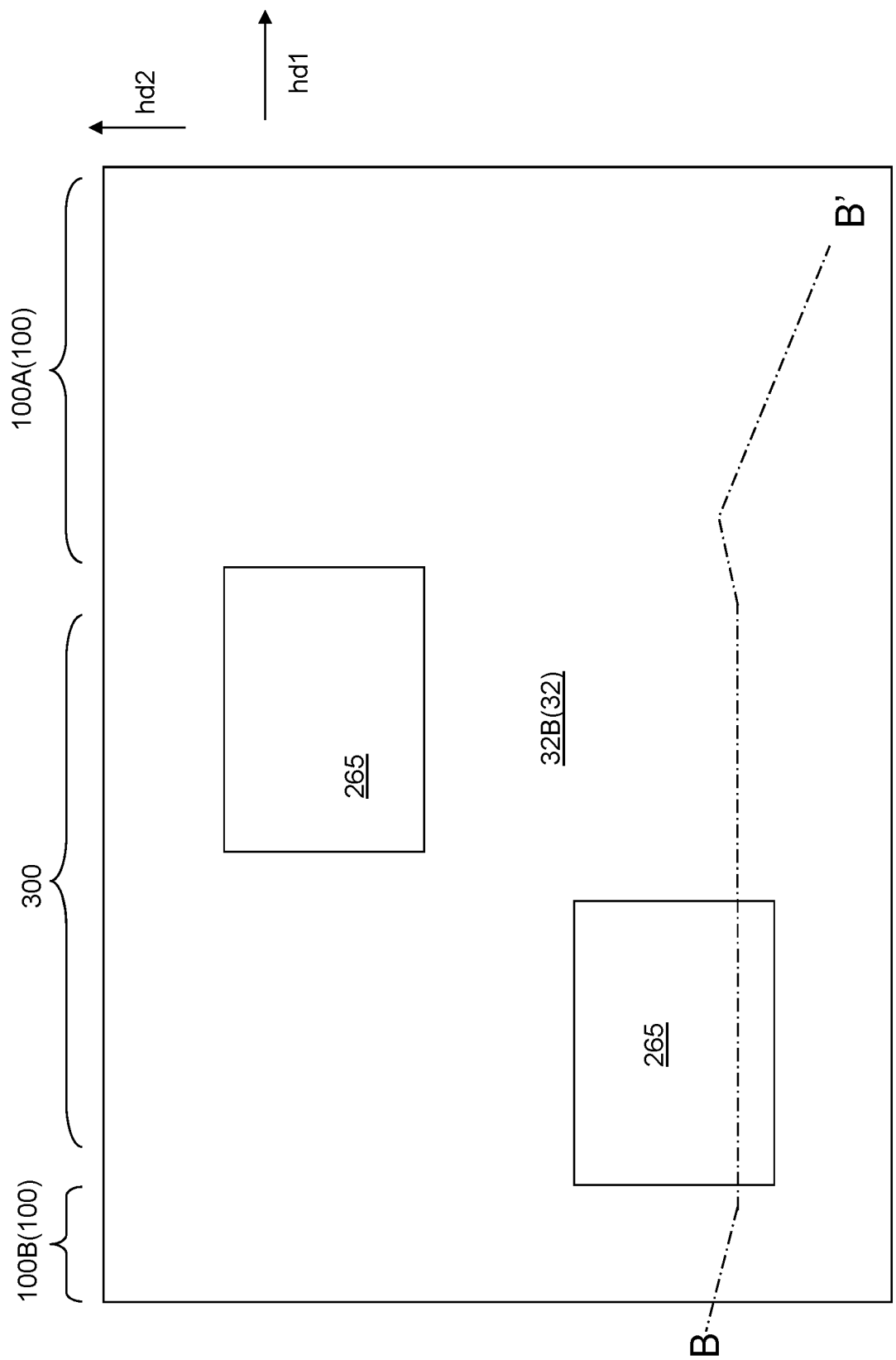
FIG. 2A is a top-down view of the exemplary structure after formation of retro-stepped dielectric material layers at levels of a second layer stack including second insulating layers and second sacrificial material layers.
Figure 2B:
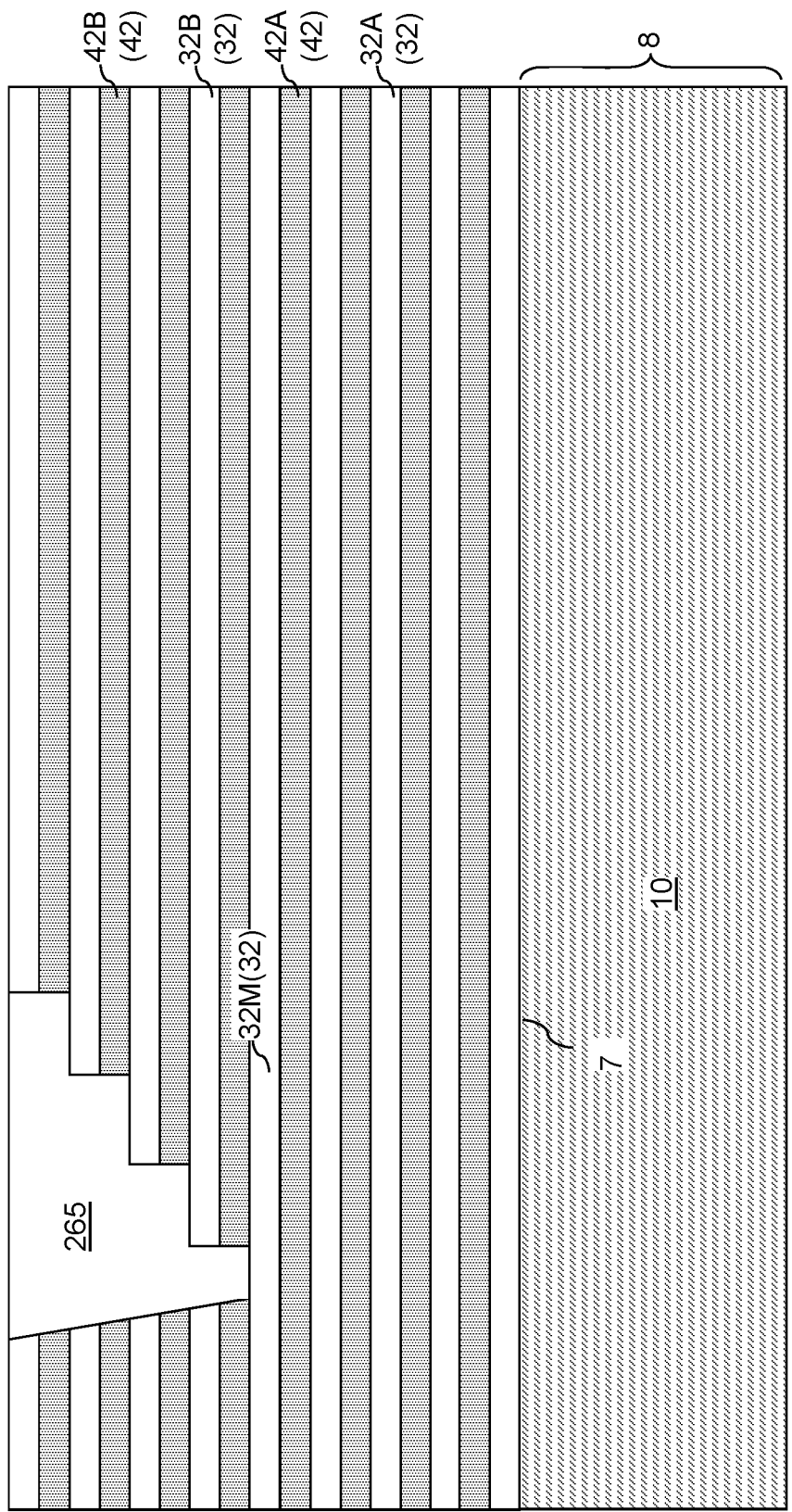
FIG. 2B is a vertical cross-sectional view of the exemplary structure along the hinged vertical plane B-B' of FIG. 2A.

Referring to FIGS. 2A and 2B, portions of the second layer stack (32B, 42B) located in a connection region 300 can be patterned to form stepped surfaces, which are herein referred to as distal stepped surfaces or second stepped surfaces. The connection region 300 can be provided between a pair of memory array regions 100, which can include a first memory array region 100A and a second memory array region 100B that are laterally spaced apart along a first horizontal direction hd1. The distal stepped surfaces can be formed within a respective area of a rectangular well by depositing a patterned hard mask layer (not shown) including a set of rectangular openings, applying a trimmable etch mask layer including a trimmable etch mask material (such as a trimmable photoresist material), and repeatedly performing a set of an anisotropic etch process and a mask trimming process. A stepped cavity having stepped bottom surfaces can be formed within each patterned region of the second layer stack (32B, 42B). As used herein, "stepped surfaces" refer to a staircase region containing a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the second layer stack (32B, 42B) are removed through formation of the stepped surfaces. A "stepped cavity" refers to a cavity having stepped surfaces located in a staircase region. The staircase regions and the stepped cavities are laterally offset along a second horizontal direction hd2 (e.g., bit line direction) that is perpendicular to the first horizontal direction hd1 (e.g., word line direction). In one embodiment, the neighboring staircase regions that are offset along the second horizontal direction hd2 may have stepped surfaces that step up in opposite directions along the first horizontal direction hd1. For example, the staircase region in the lower portion of FIG. 2A which is also shown in FIG. 2B may step up from left to right along the first horizontal direction hd1, while the staircase region in the upper portion of FIG. 2A may step up from right to left along the first horizontal direction hd1 (as shown in FIG. 5C which is described below), or vice-versa. The neighboring staircases and stepped cavities may, or may not, be laterally offset along the first horizontal direction hd1. Each stepped cavity may vertically extend to a top surface of the mid-level insulating layer 32M.

Each stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each second sacrificial material layer 42B other than the topmost second sacrificial material layer 42B within the second layer stack (32B, 42B) laterally extends farther than any overlying second sacrificial material layer 42B within the second layer stack (32B, 42B). Each stepped cavity includes stepped surfaces of the second layer stack (32B, 42B) that continuously extend from a bottommost layer within the second layer stack (32B, 42B) to a topmost layer within the second layer stack (32B, 42B). Each vertical step of the stepped surfaces can have the height of one or more pairs of a second insulating layer 32B and a second sacrificial material layer 42B. In one embodiment, the vertical steps within distal stepped surfaces within each stepped cavity may be arranged along the first horizontal direction hd1. Each opening within the patterned hard mask layer defines the lateral extent of each distal stepped surfaces within a respective one of the stepped cavities. The trimmable etch mask layer and the patterned hard mask layer can be removed after formation of the distal stepped surfaces and the stepped cavities. The stepped surfaces formed within each stepped cavity include distal stepped surfaces, which are stepped surfaces of the second layer stack (32B, 42B). Lateral extents of the second spacer material layers (such as second sacrificial material layers 42B) decrease with a vertical distance from the substrate 8 upon formation of the distal stepped surfaces. Each overlying second spacer material layer has a lesser area than any underlying second spacer material layer.

A retro-stepped dielectric material portion 265 (i.e., an insulating fill material portion) can be formed in each stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). Each remaining portion of the deposited dielectric material filling the stepped cavity constitutes the retro-stepped dielectric material portion 265. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portions 265, the silicon oxide of the retro-stepped dielectric material portions 265 may, or may not, be doped with dopants such as B, P, and/or F.

Generally, a retro-stepped dielectric material portion 265 can be formed on each contiguous set of distal stepped surfaces. Each retro-stepped dielectric material portion 265 has a variable horizontal cross-sectional area that increases with a vertical distance from the substrate 8. Each retro-stepped dielectric material portion 265 contacts the distal stepped surfaces (which are also referred to as second stepped surfaces) having a variable horizontal-cross-sectional area that increases with the vertical distance from the substrate 8.

Figure 3A:
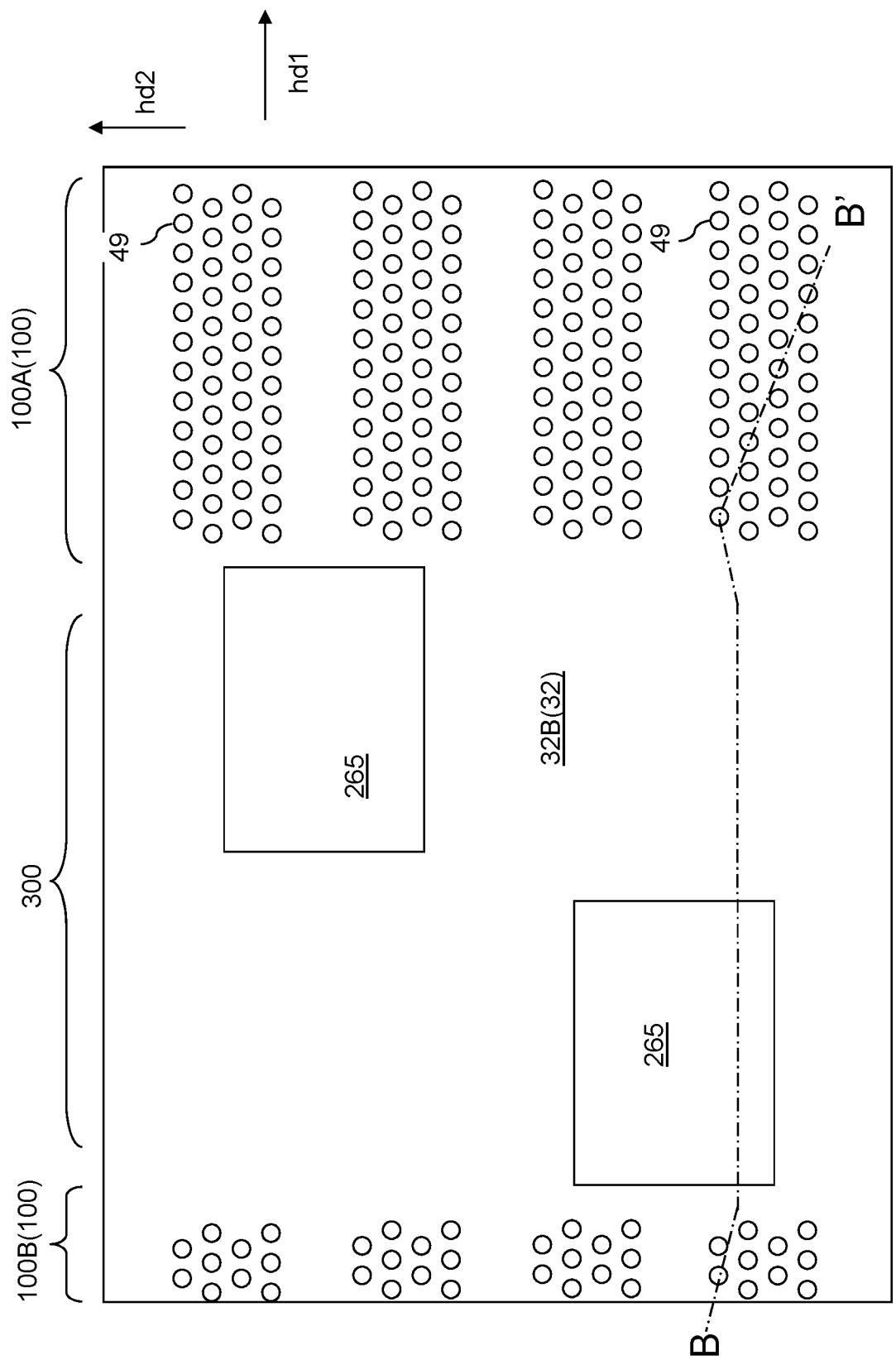
FIG. 3A is a top-down view of the exemplary structure after formation of memory openings according to an embodiment of the present disclosure.

Referring to FIGS. 3A and 3B, a lithographic material stack (not shown) including at least a photoresist layer can be formed over the alternating stack (32, 42) and the retro-stepped dielectric material portions 265, and can be lithographically patterned to form openings therein. The openings include memory openings 49 formed over the memory array regions 100 and optional support openings (not illustrates for the sake of simplicity) in portions of the memory array regions 100 and the connection region 300 such that areas that are not filled with the memory openings 49 include support openings. The support openings are employed to form support pillar structures that provide structural support in case the spacer material layers comprise sacrificial material layers 42 and lateral recesses are temporarily formed between vertically neighboring pairs of insulating layers 32 during a subsequent processing step.

The pattern in the lithographic material stack can be transferred through the alternating stack (32, 42) and the retro-stepped dielectric material portions 265 by at least one anisotropic etch that employs the patterned lithographic material stack as an etch mask. Portions of the alternating stack (32, 42) underlying the openings in the patterned lithographic material stack are etched to form memory openings 49 and support openings (not illustrated). As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the alternating stack (32, 42) and the entirety of the alternating stack (32, 42) in the memory array regions 100. The support openings are formed in areas that do not include, or are laterally spaced from, the memory openings 49.

The memory openings 49 vertically extend through each layer within of the alternating stack (32, 42). The support openings may vertically extend through each layer within the alternating stack (32, 42), or may extend through a subset of layers within the alternating stack (32, 42) and a retro-stepped dielectric material portion 265. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings can be substantially vertical, or can be tapered. The patterned lithographic material stack can be subsequently removed, for example, by ashing.

The memory openings 49 and the support openings can extend from the top surface of the alternating stack (32, 42) to at least the horizontal plane including the major surface 7, i.e., the top surface, of the semiconductor material layer 10. In one embodiment, an overetch into the semiconductor material layer 10 may be optionally performed after the top surface of the semiconductor material layer 10 is physically exposed at a bottom of each memory opening 49 and each support opening. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings can be coplanar with the topmost surface of the semiconductor material layer 10.

Each of the memory openings 49 and the support openings may include a sidewall (or a plurality of sidewalls) that extends substantially perpendicular to the topmost surface of the substrate 8, i.e., the top surface of the semiconductor material layer 10. A two-dimensional array of memory openings 49 can be formed in each memory array regions 100. A two-dimensional array of support openings (not shown) can be formed in the connection region 300.

FIGS. 4A-4H illustrate structural changes in a memory opening 49, which is one of the memory openings 49 in the exemplary structure of FIGS. 3A and 3B. The same structural change occurs simultaneously in each of the other memory openings 49 and in each support opening.

Referring to FIG. 4A, a memory opening 49 in the exemplary device structure of FIGS. 4A and 4B is illustrated. The memory opening 49 extends through the alternating stack (32, 42), the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 4B, an optional pedestal channel portion (e.g., an epitaxial pedestal) 11 can be formed at the bottom portion of each memory opening 49 and each support openings, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate 8 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the semiconductor material layer 10, which can have a doping of the first conductivity type.

Referring to FIG. 4C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of lateral recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 4D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the alternating stack (32, 42) can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 4E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 4F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4G, the horizontal portion of the dielectric core layer 62L can be removed, for example, by a recess etch from above the top surface of the alternating stack (32, 42). Each remaining portion of the dielectric core layer 62L constitutes a dielectric core 62. Further, the horizontal portion of the second semiconductor channel layer 602 located above the top surface of the alternating stack (32, 42) can be removed by a planarization process, which can employ a recess etch or chemical mechanical planarization (CMP). Each remaining portion of the second semiconductor channel layer 602 can be located entirety within a memory opening 49 or entirely within a support opening.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of lateral recesses. As used herein, a macroscopic retention time refers to a retention time suitable for operation of a memory device as a permanent memory device such as a retention time in excess of 24 hours.

Referring to FIG. 4H, the top surface of each dielectric core 62 can be further recessed within each memory opening, for example, by a recess etch to a depth that is located between the top surface of the alternating stack (32, 42) and the bottom surface of the alternating stack (32, 42). Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the alternating stack (32, 42), for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening fills the respective support openings, and constitutes a support pillar structure.

Figure 5A:
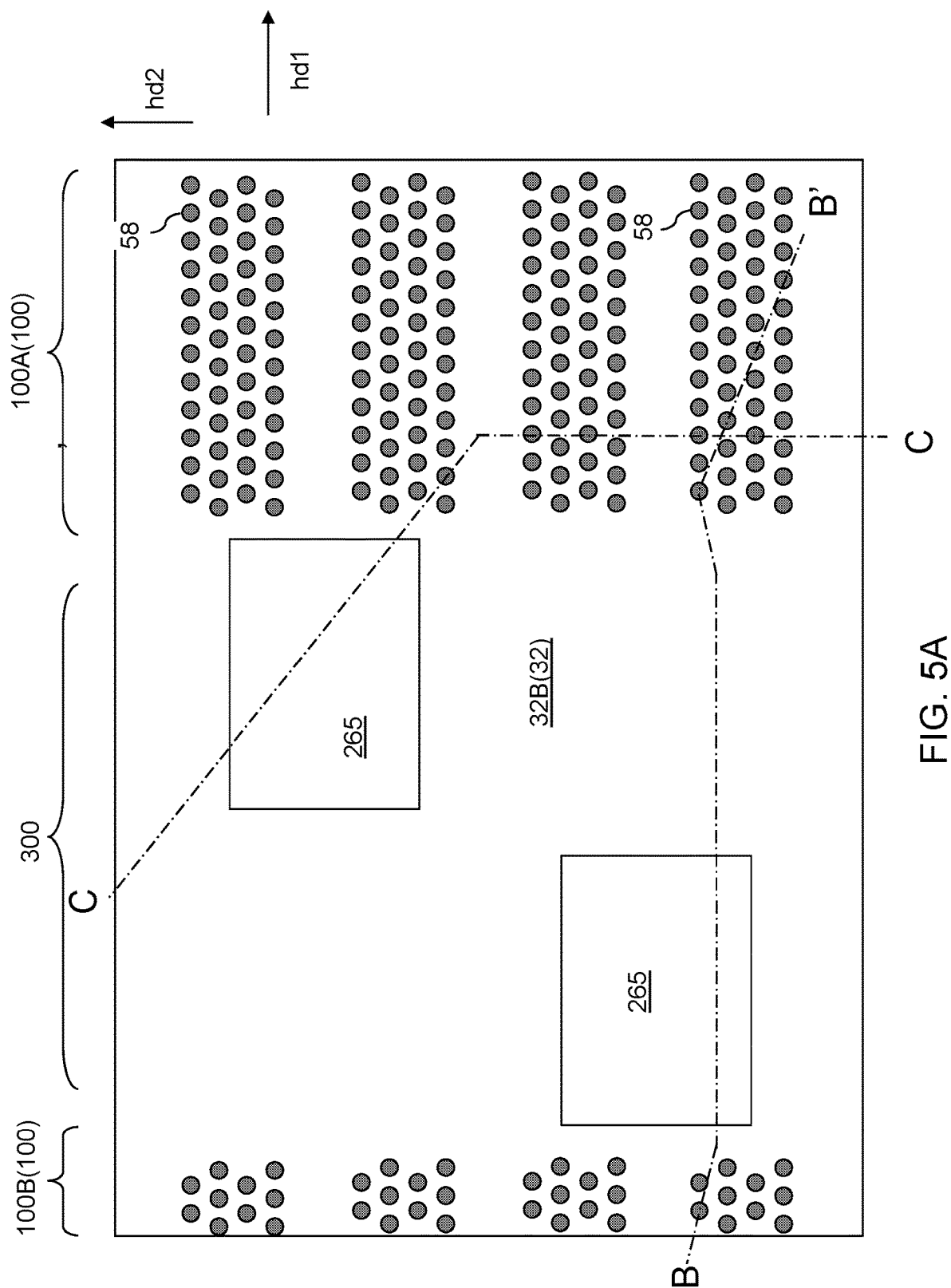
FIG. 5A is a top-down view of the exemplary structure after formation of memory opening fill structures according to an embodiment of the present disclosure.
Figure 5B:
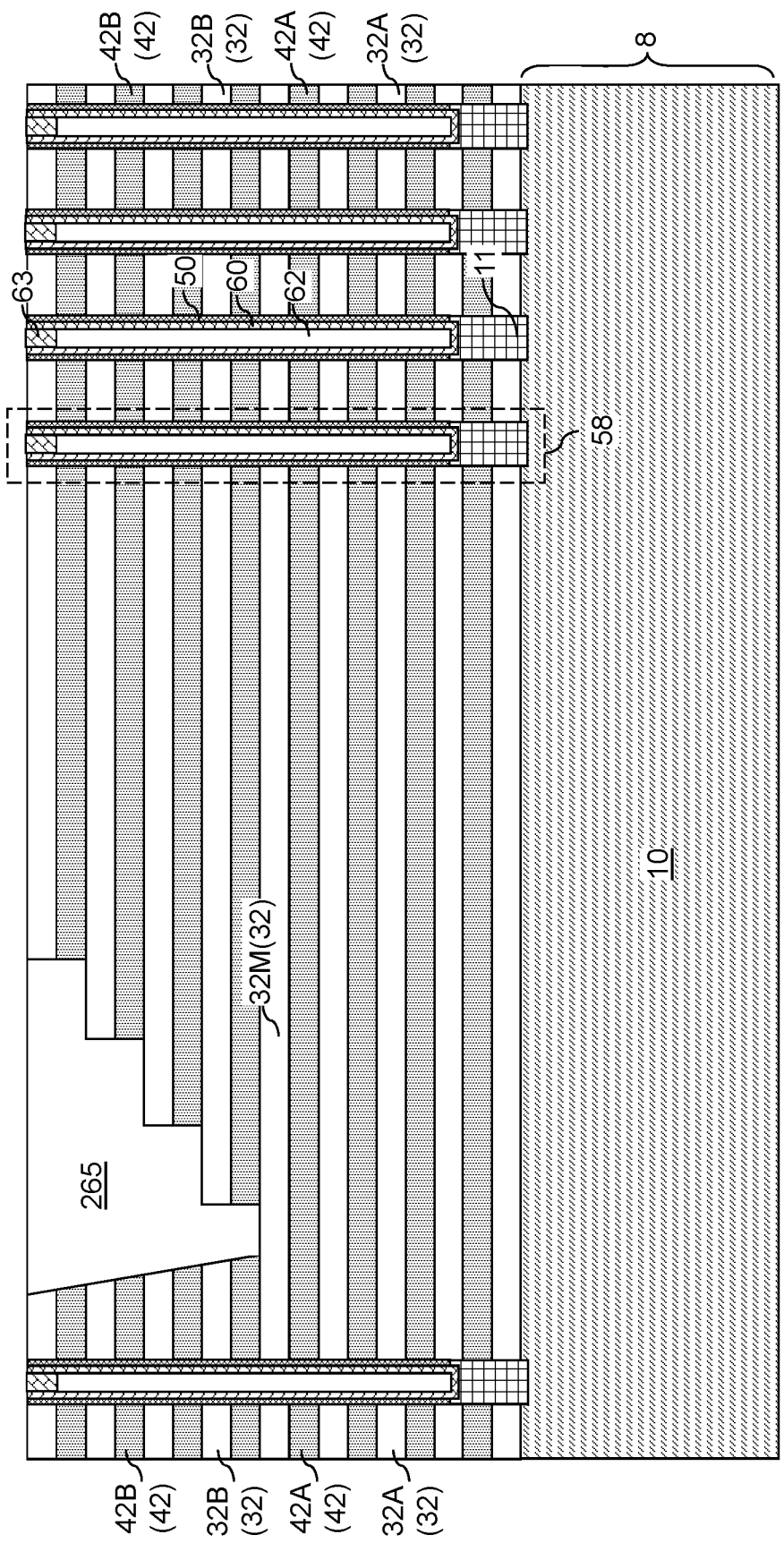
FIG. 5B is a vertical cross-sectional view of the exemplary structure along the hinged vertical plane B-B' of FIG. 5A.
Figure 5C:
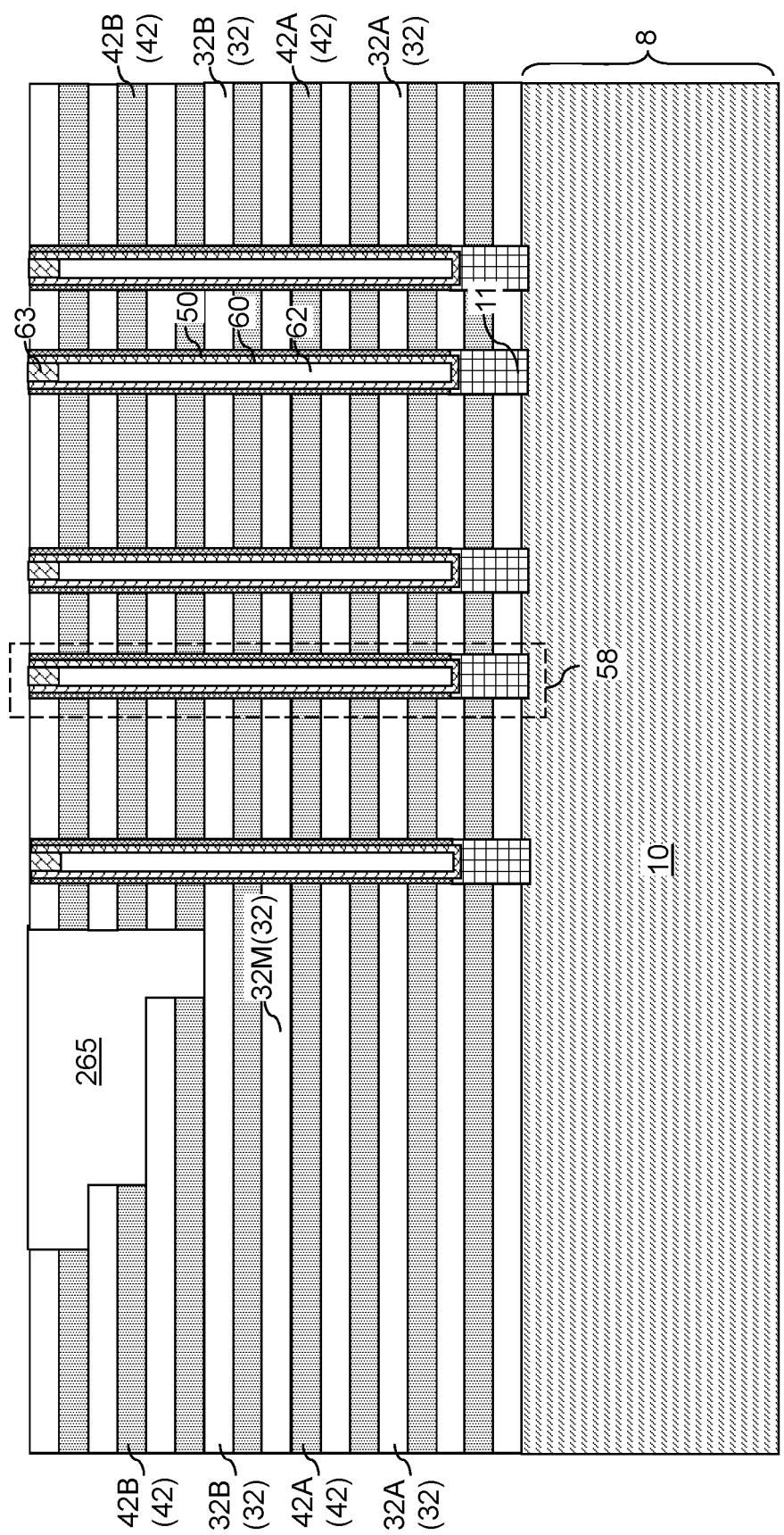
FIG. 5C is a vertical cross-sectional view of the exemplary structure along the hinged vertical plane C-C' of FIG. 5A.

Referring to FIGS. 5A-5C, the exemplary structure is illustrated after formation of memory opening fill structures 58 and support pillar structure within the memory openings 49 and the support openings, respectively. An instance of a memory opening fill structure 58 can be formed within each memory opening 49 of the structure of FIGS. 3A and 3B. An instance of the support pillar structure can be formed within each support opening of the structure of FIGS. 3A and 3B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as portions of the charge storage layer 54 located at the levels of the sacrificial material layers 42) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60. Generally, each memory opening fill structure 58 includes a memory stack structure 55. Each memory stack structure 55 includes a vertical stack of memory elements such as portions of a charge storage layer 54 located at levels of the sacrificial material layers 42.

Figure 6A:
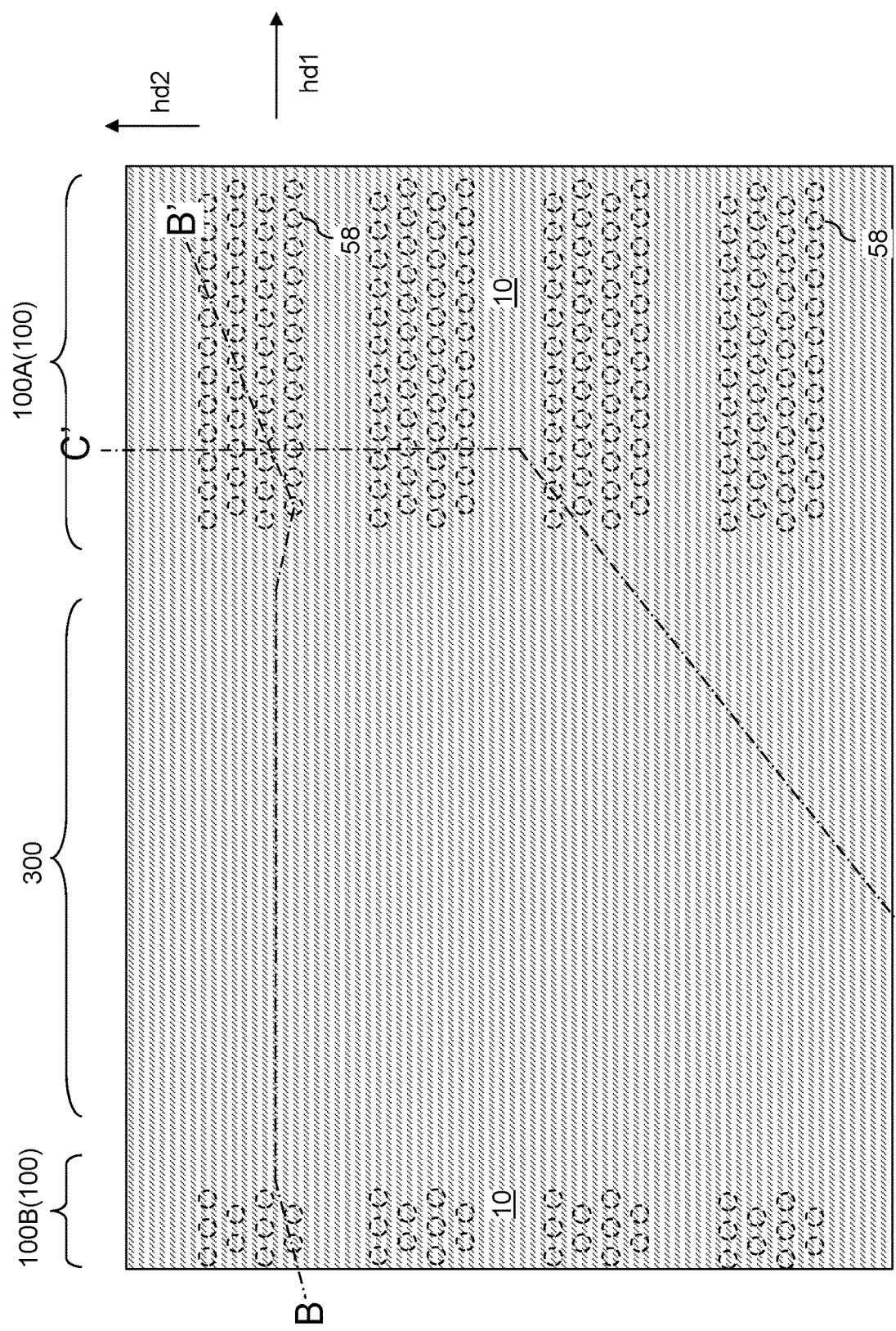
FIG. 6A is a top-down view of the exemplary structure after formation of a contact-level dielectric layer, attachment of a first, and thinning of the backside of a semiconductor material layer in the substrate according to an embodiment of the present disclosure.
Figure 6B:
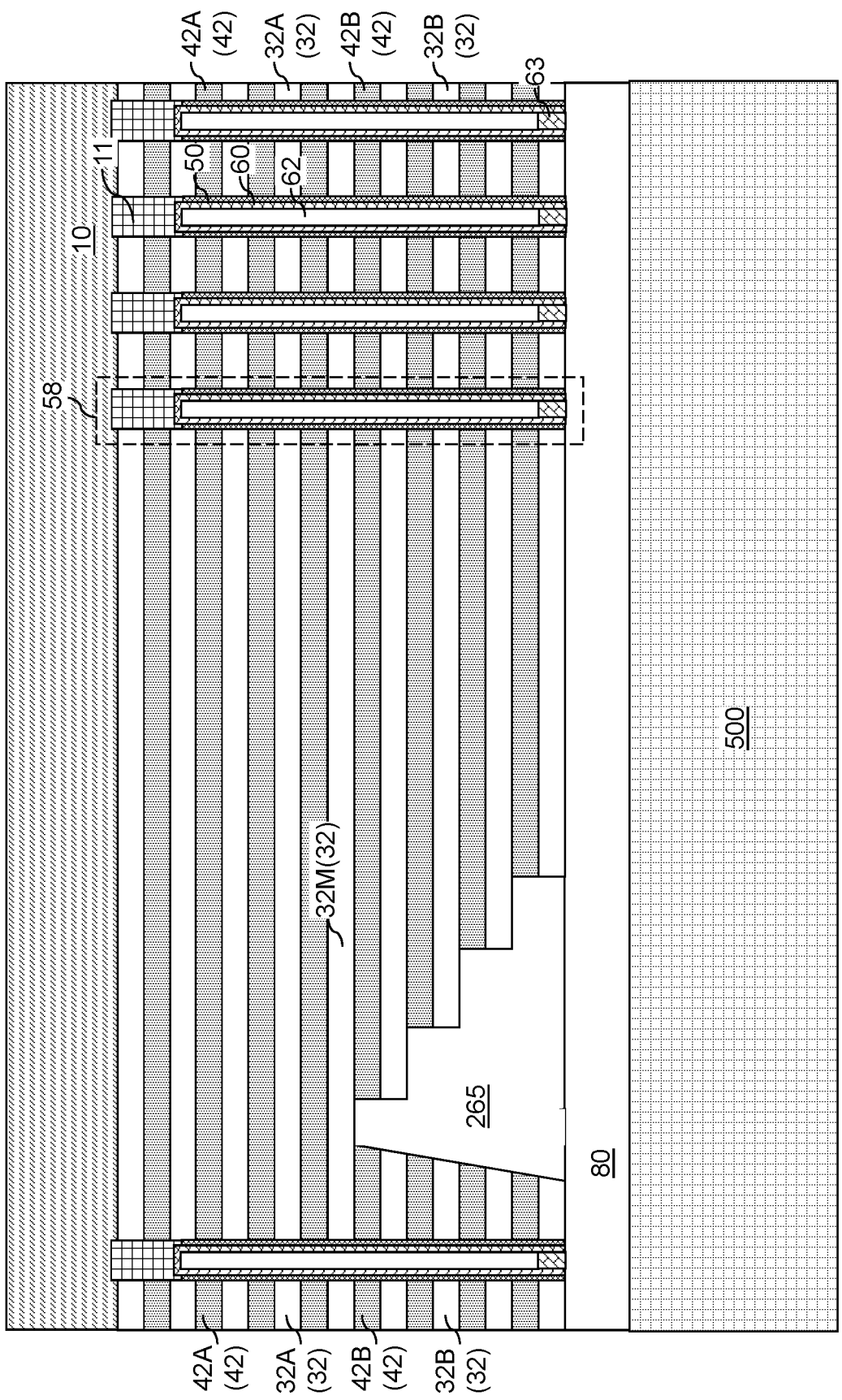
FIG. 6B is a vertical cross-sectional view of the exemplary structure along the hinged vertical plane B-B' of FIG. 6A.
Figure 6C:
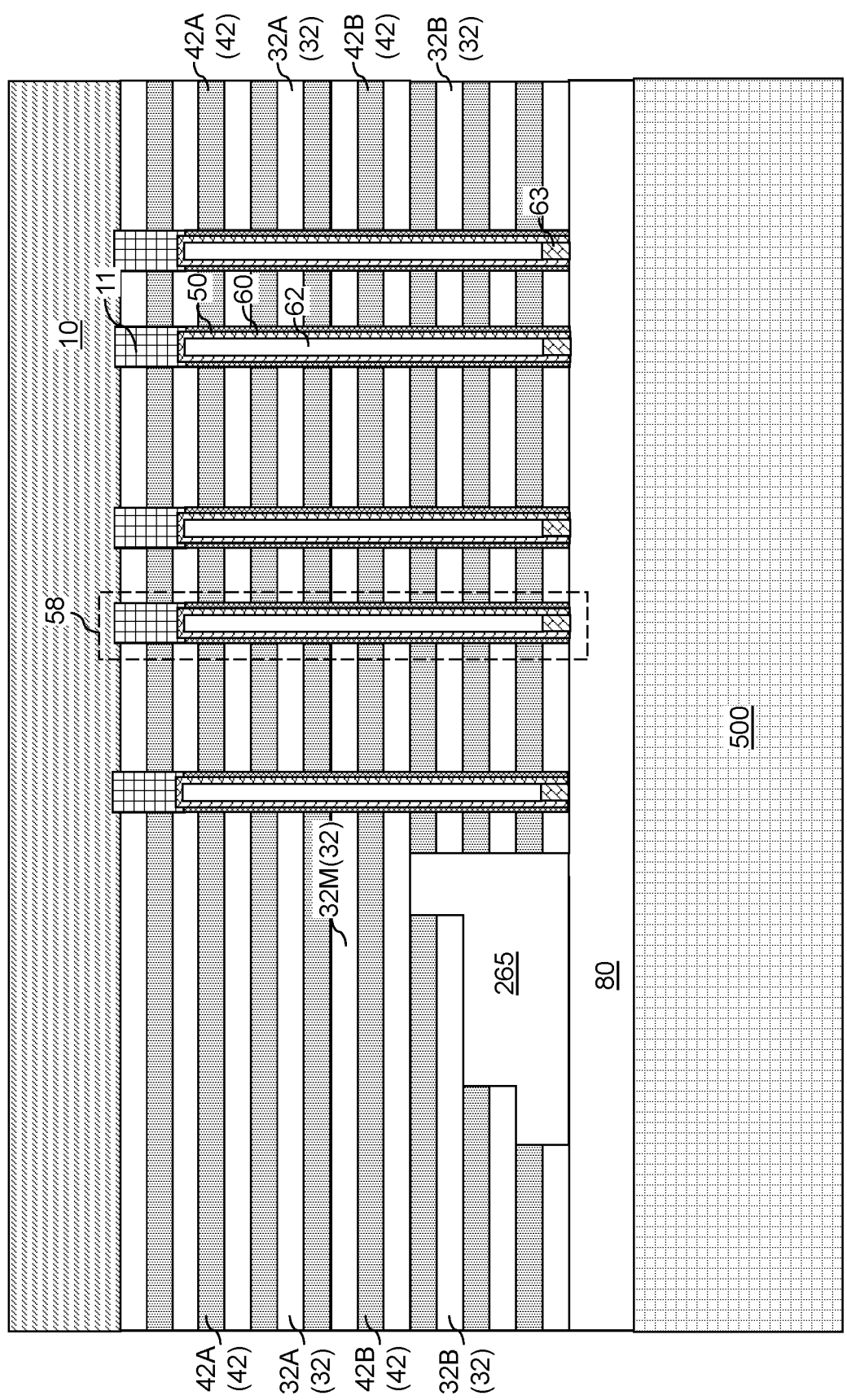
FIG. 6C is a vertical cross-sectional view of the exemplary structure along the hinged vertical plane C-C' of FIG. 6A.

Referring to FIGS. 6A-6C, a contact-level dielectric layer 80 can be deposited on a distal planar surface of the alternating stack (32, 42). The contact-level dielectric layer 80 includes a dielectric material such as undoped silicate glass or a doped silicate glass. The thickness of the contact-level dielectric layer 80 may be in a range from 100 nm to 1,000 nm, such as from 200 nm to 500 nm, although lesser and greater thicknesses may also be employed.

A first carrier substrate 500 can be attached to the physically exposed surface (i.e., a distal surface) of the contact-level dielectric layer 80. The first carrier substrate 500 can have a thickness in a range from 300 microns to 1 mm, and includes a material that can provide structural support to the alternating stack (32, 42) and the substrate 8 during subsequent thinning of the backside of the substrate 8. The first carrier substrate 500 may include a semiconductor (e.g., silicon) substrate, an insulating (e.g., glass or plastic) substrate, or a conductive substrate. In case the first carrier substrate 500 comprises a silicon substrate, the bonding between the contact-level dielectric layer 80 and the first carrier substrate 500 may comprise, for example, silicon oxide-to-silicon bonding. In some embodiments, a temporary adhesive layer (not shown) may be employed to bond the contact-level dielectric layer 80 and the first carrier substrate 500. In some embodiment, the first carrier substrate 500 may include a network of microchannels having a width in a range from 100 nm to 1,000 nm and a depth in a range from 100 nm to 1,000 nm and an inter-channel spacing in a range from 300 nm to 3,000 nm, and a sacrificial high etch rate silicon oxide material such as borosilicate glass may be deposited on a bonding surface of the first carrier substrate 500 to facilitate bonding with the contact-level dielectric layer 80 and subsequent detachment of the first carrier substrate 500.

The substrate 8 can be thinned from the backside. Thinning of the backside of the substrate may be performed employing various methods. For example, grinding, polishing, an anisotropic etch process, an isotropic etch process, or combination thereof may be employed to remove the backside portion of the substrate 8. In some embodiments, a bottom portion of the substrate 8 may be cleaved off. The first carrier substrate 500 provides structural support to the alternating stack (32, 42) and the semiconductor material layer 10 during thinning of the backside of the semiconductor material layer 10. The thickness of the semiconductor material layer 10 after the thinning process may be in a range from 100 nm to 3,000 nm, such as from 200 nm to 1,000 nm, although lesser and greater thicknesses may also be employed.

Figure 7A:
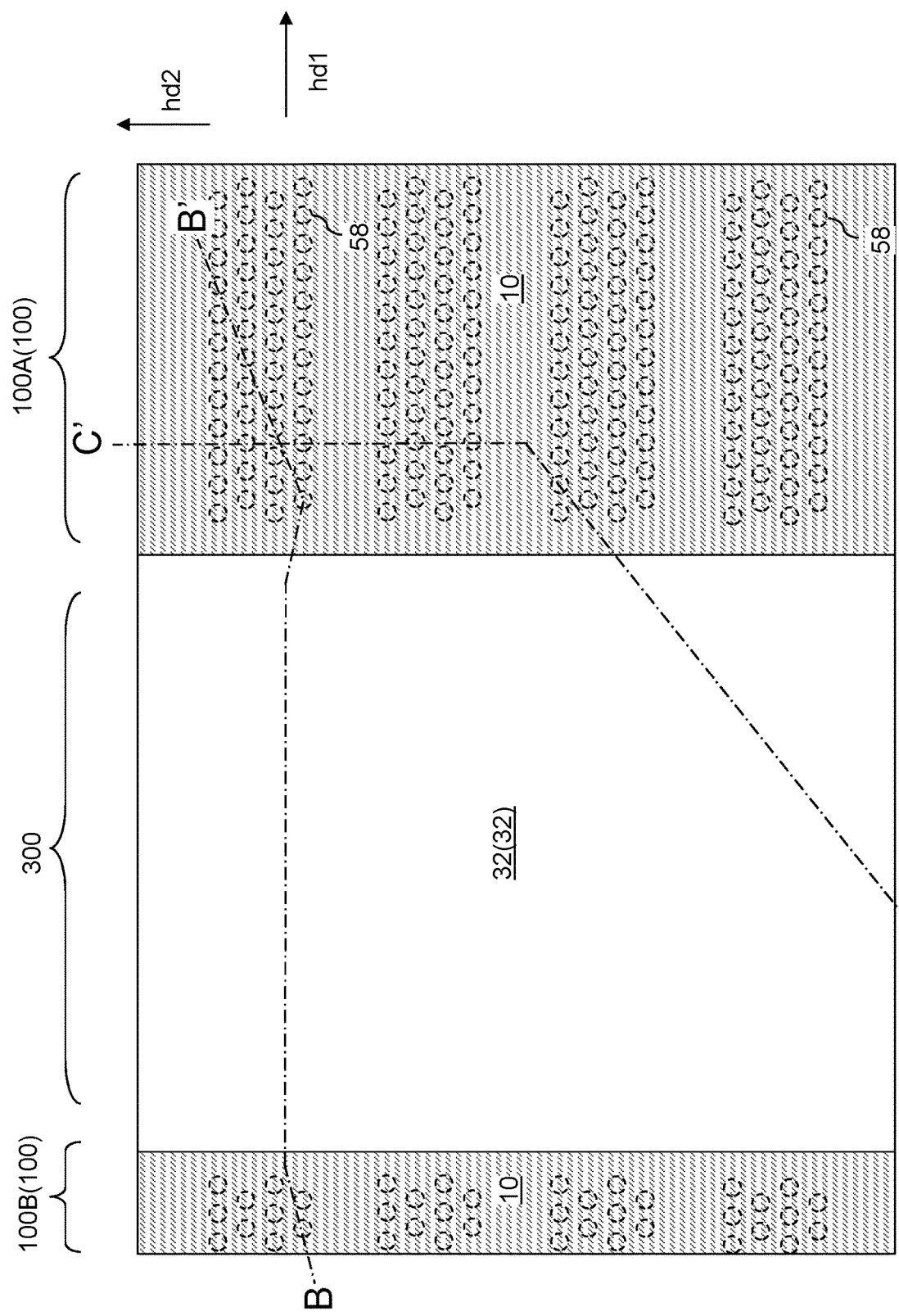
FIG. 7A is a top-down view of the exemplary structure after formation of a through-substrate opening through the semiconductor material layer according to an embodiment of the present disclosure.
Figure 7B:
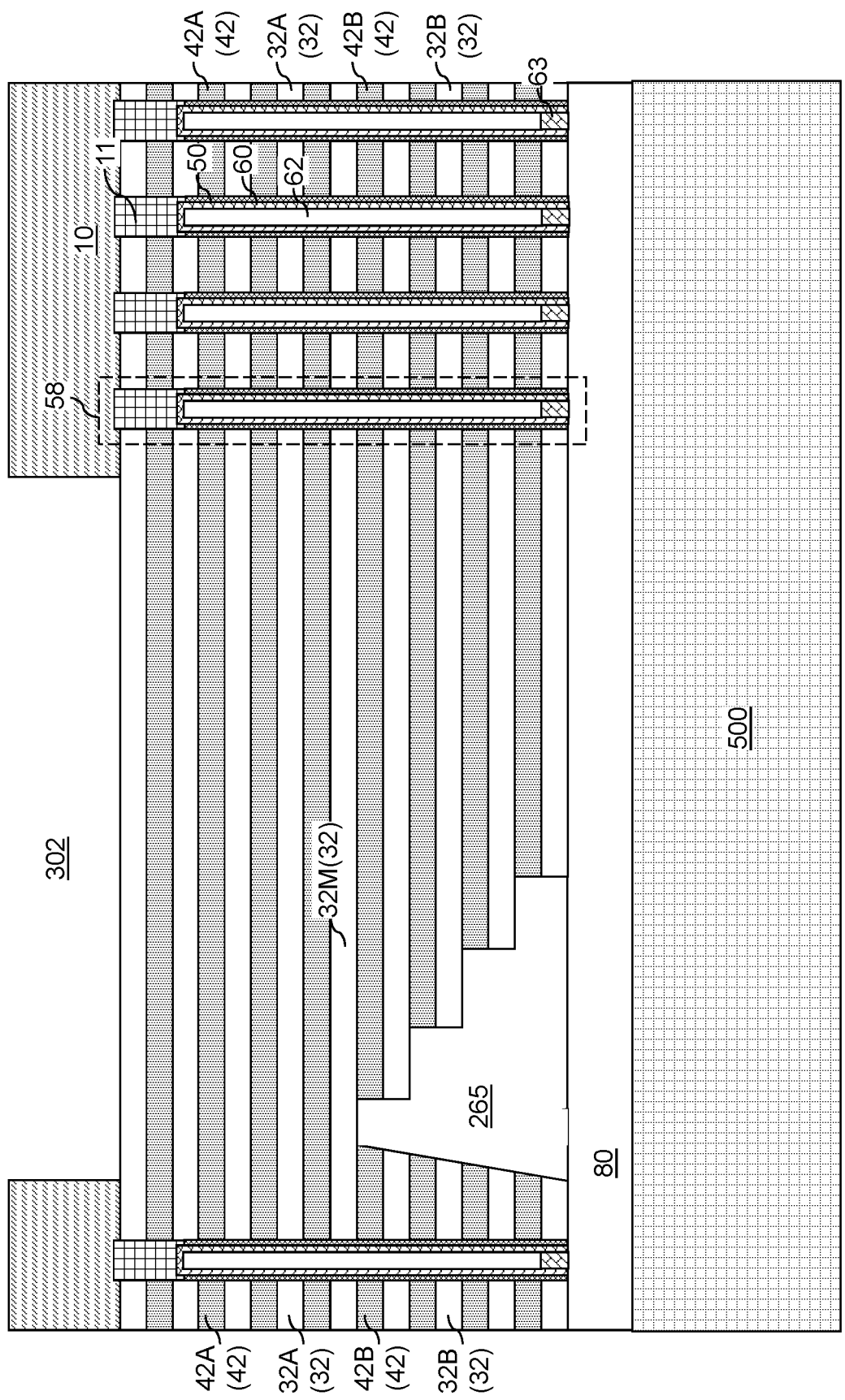
FIG. 7B is a vertical cross-sectional view of the exemplary structure along the hinged vertical plane B-B' of FIG. 7A.
Figure 7C:
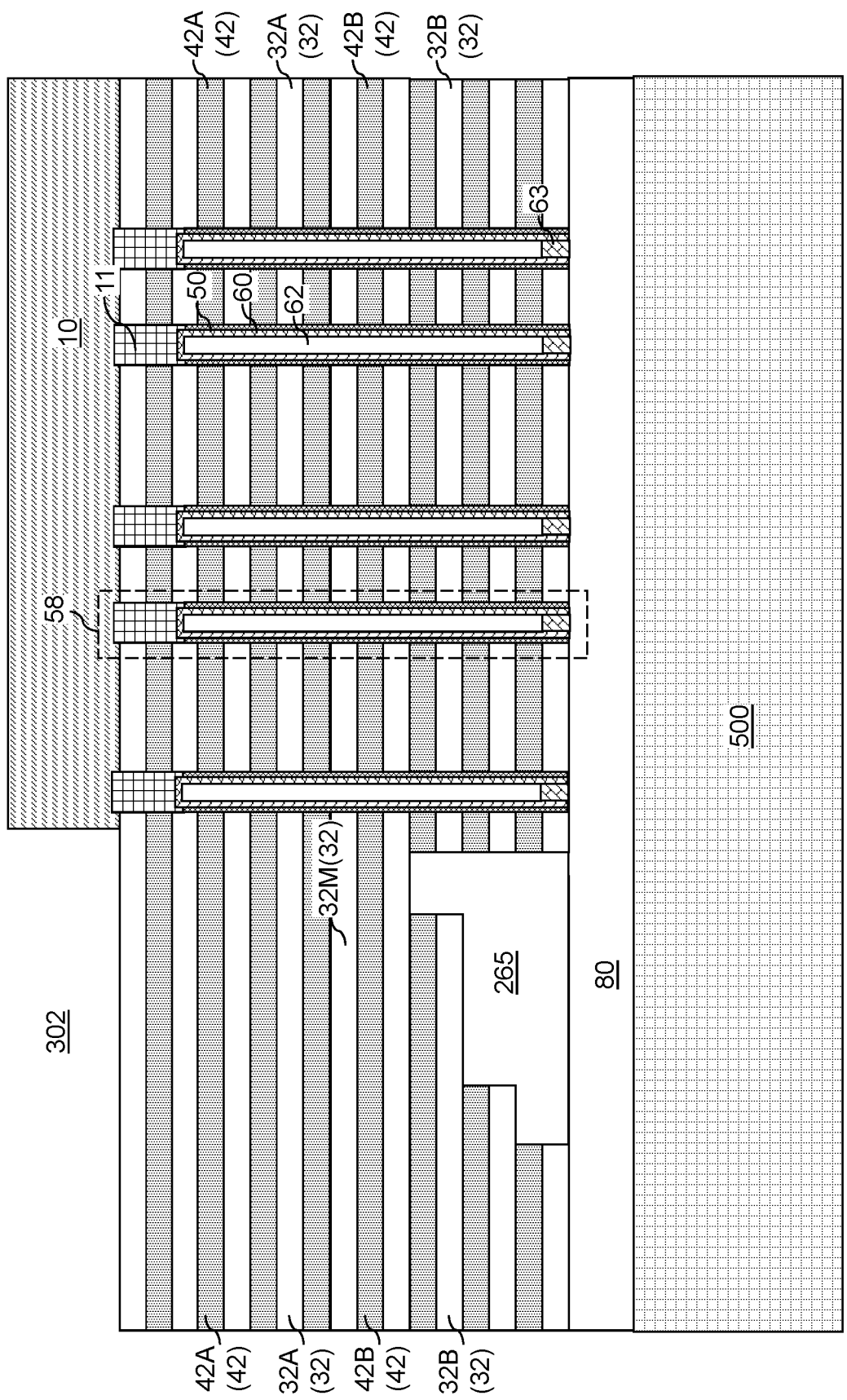
FIG. 7C is a vertical cross-sectional view of the exemplary structure along the hinged vertical plane C-C' of FIG. 7A.

Referring to FIGS. 7A-7C, a photoresist layer (not shown) can be applied on the backside surface of the semiconductor material layer 10, and can be lithographically patterned to cover the memory array regions 100 and not to cover the connection regions 300. An etch process such as an anisotropic etch process can be performed to remove unmasked portions of the semiconductor material layer 10 from the connection region 300. The etch process can be selective to the material of the insulating layers 32. Thus, a most proximal insulating layer 32 in contact with the semiconductor material layer 10. Generally, an opening 302 through the semiconductor material layer 10 can be formed within each connection region 300, which can be provided between a pair of memory array regions 100 that are laterally spaced apart, for example, along the first horizontal direction hd1. The opening 302 through the semiconductor material layer 10 can be formed after thinning the semiconductor material layer 10. A first portion of a proximal surface of the alternating stack (32, 42) located within an area of the opening 302 located in the connection region 300 can be physically exposed, and a second portion of the proximal surface of the alternating stack (32, 42) located outside the area of the opening 302 contacts a major surface of the semiconductor material layer 10, which is the front surface of the semiconductor material layer 10. The front surface (i.e., a major surface) of the semiconductor material layer 10 is in contact with a proximal planar surface of the alternating stack (32, 42). A physically exposed backside surface of the semiconductor material layer 10 can be located on an opposite side of the front surface of the semiconductor material layer 10.

Figure 8A:
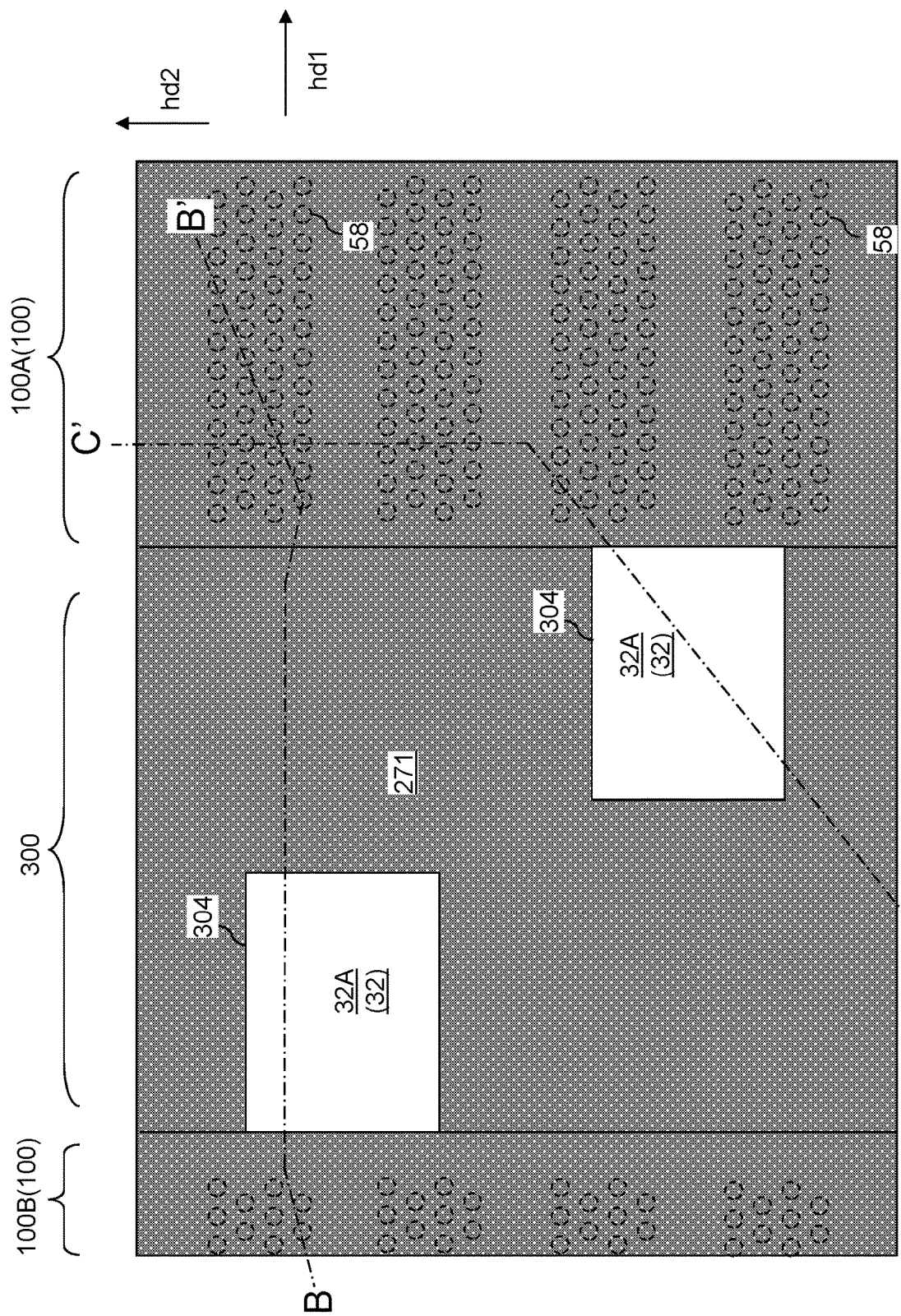
FIG. 8A is a top-down view of the exemplary structure after formation of a patterned hard mask layer according to an embodiment of the present disclosure.
Figure 8B:
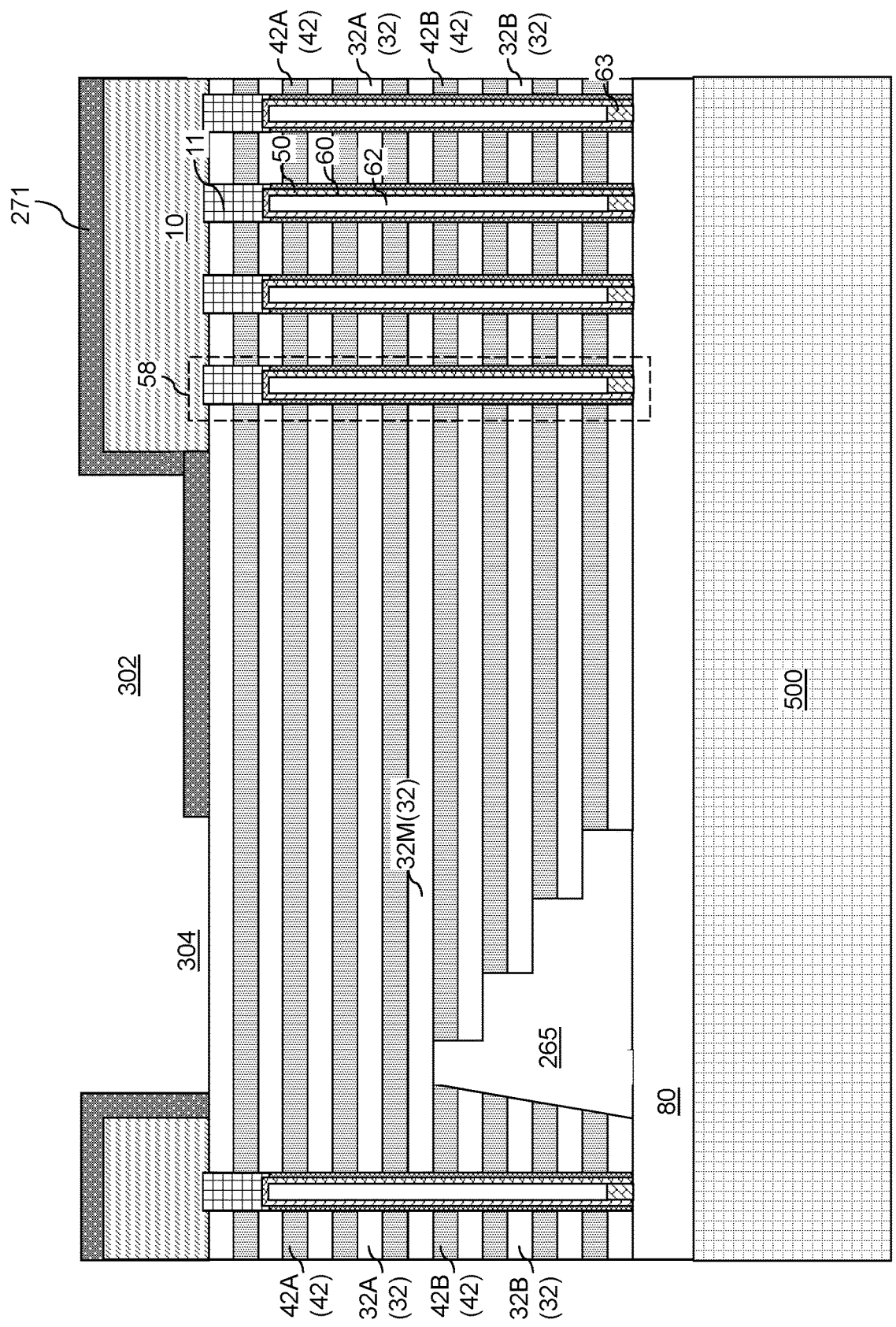
FIG. 8B is a vertical cross-sectional view of the exemplary structure along the hinged vertical plane B-B' of FIG. 8A.
Figure 8C:
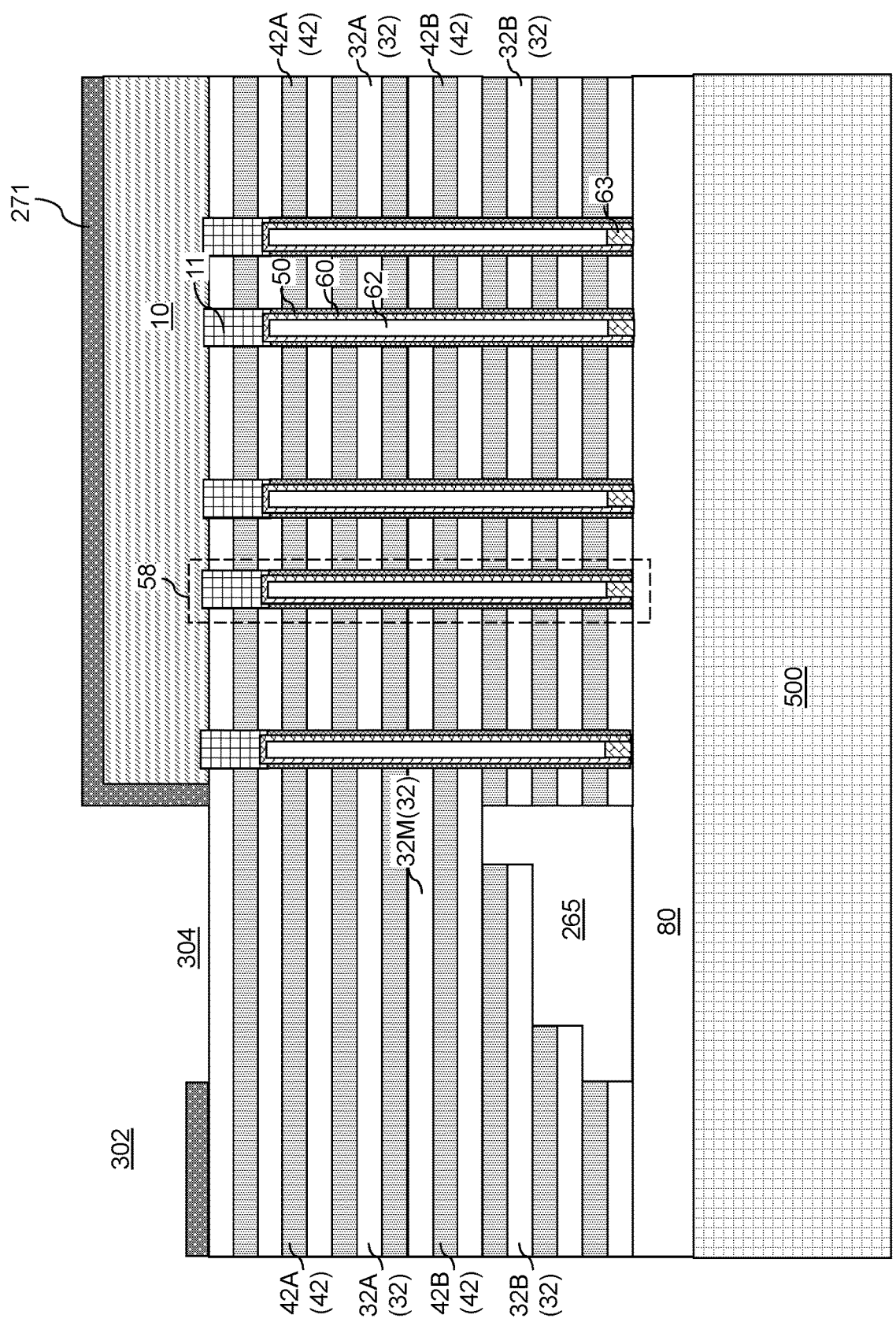
FIG. 8C is a vertical cross-sectional view of the exemplary structure along the hinged vertical plane C-C' of FIG. 8A.

Referring to FIGS. 8A-8C, an optional patterned hard mask layer 271 can be formed over the first portion of the proximal surface of the alternating stack (32, 42), a sidewall of the semiconductor material layer 10, and a backside surface of the semiconductor material layer 10. The patterned hard mask layer 271 includes an etch mask material such as dielectric metal oxide (such as amorphous aluminum oxide layer), amorphous carbon or diamond-like carbon, a layer stack of a silicon oxide layer and a polysilicon layer, or a patterning film. The patterned hard mask layer 271 includes openings 304 within the connection region 300, i.e., the region of the first portion of the proximal surface of the alternating stack (32, 42) located within the area of opening 302 in the semiconductor material layer 10. Each opening 304 through the patterned hard mask layer 271 is smaller than the area of the connection region 300 or the opening 302. A plurality of openings 304 that are laterally spaced part along the second horizontal direction hd2 can be formed through the patterned hard mask layer 271. Each opening 304 defines an area in which a set of proximal stepped surfaces is to be subsequently formed by patterning the first layer stack (32A, 42A). In one embodiment, each opening 304 through the patterned hard mask layer 271 may have a rectangular shape with a pair of lengthwise sidewalls that laterally extend along the first horizontal direction hd1 and a pair of widthwise sidewalls that laterally extend long the second horizontal direction hd2.

Figure 9A:
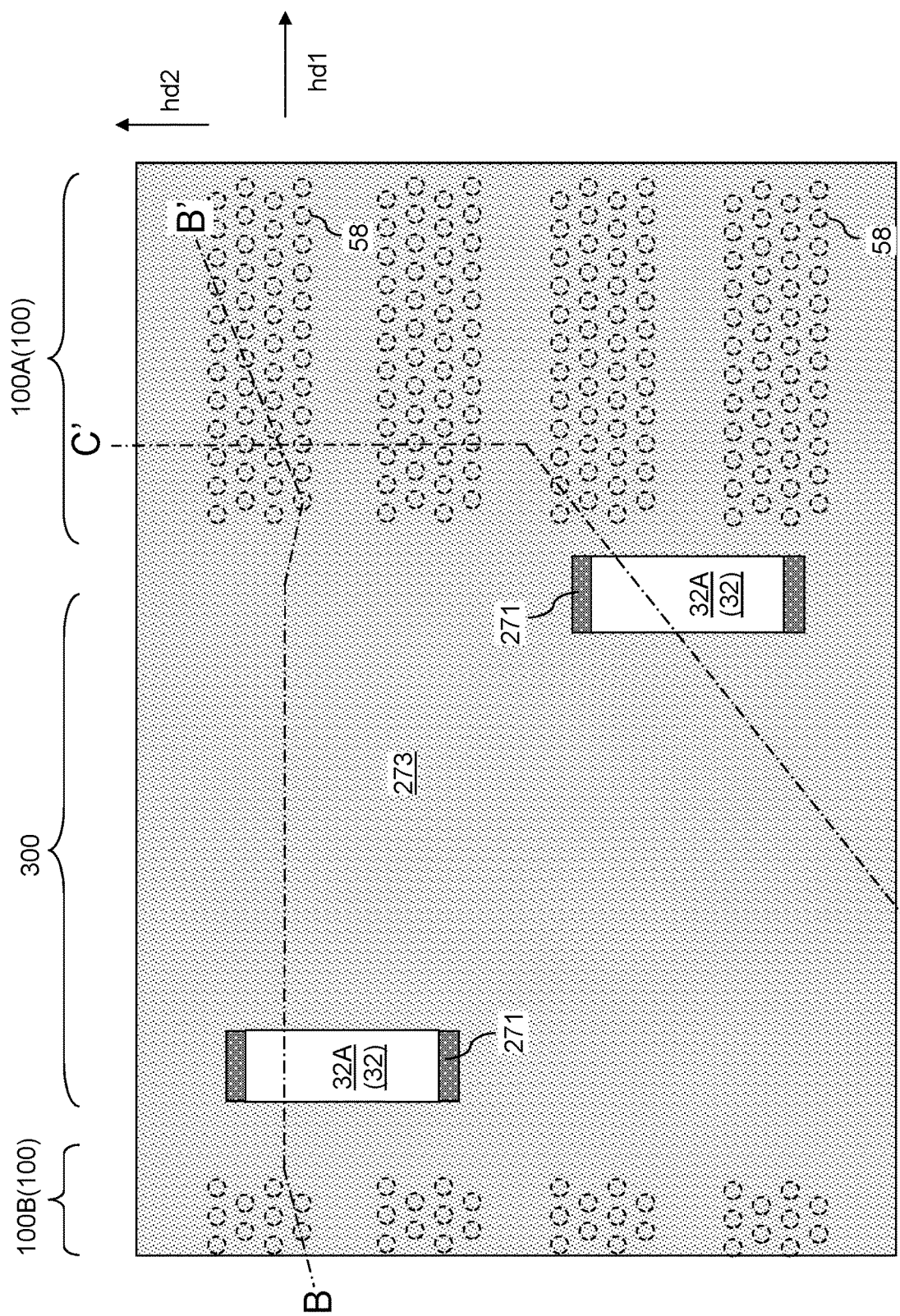
FIG. 9A is a top-down view of the exemplary structure after formation of a trimmable etch mask layer and a first anisotropic etch process according to an embodiment of the present disclosure.
Figure 9B:
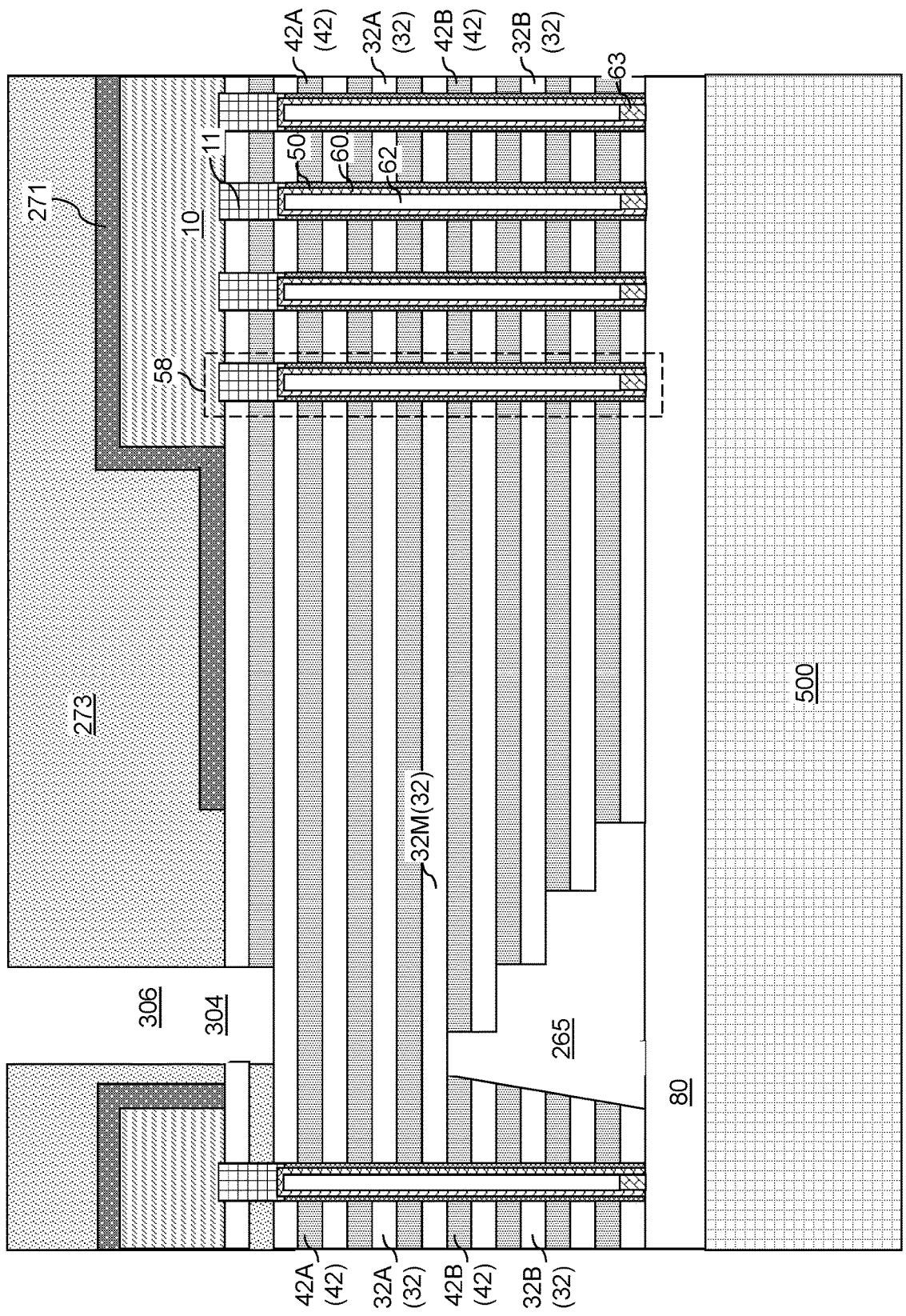
FIG. 9B is a vertical cross-sectional view of the exemplary structure along the hinged vertical plane B-B' of FIG. 9A.
Figure 9C:
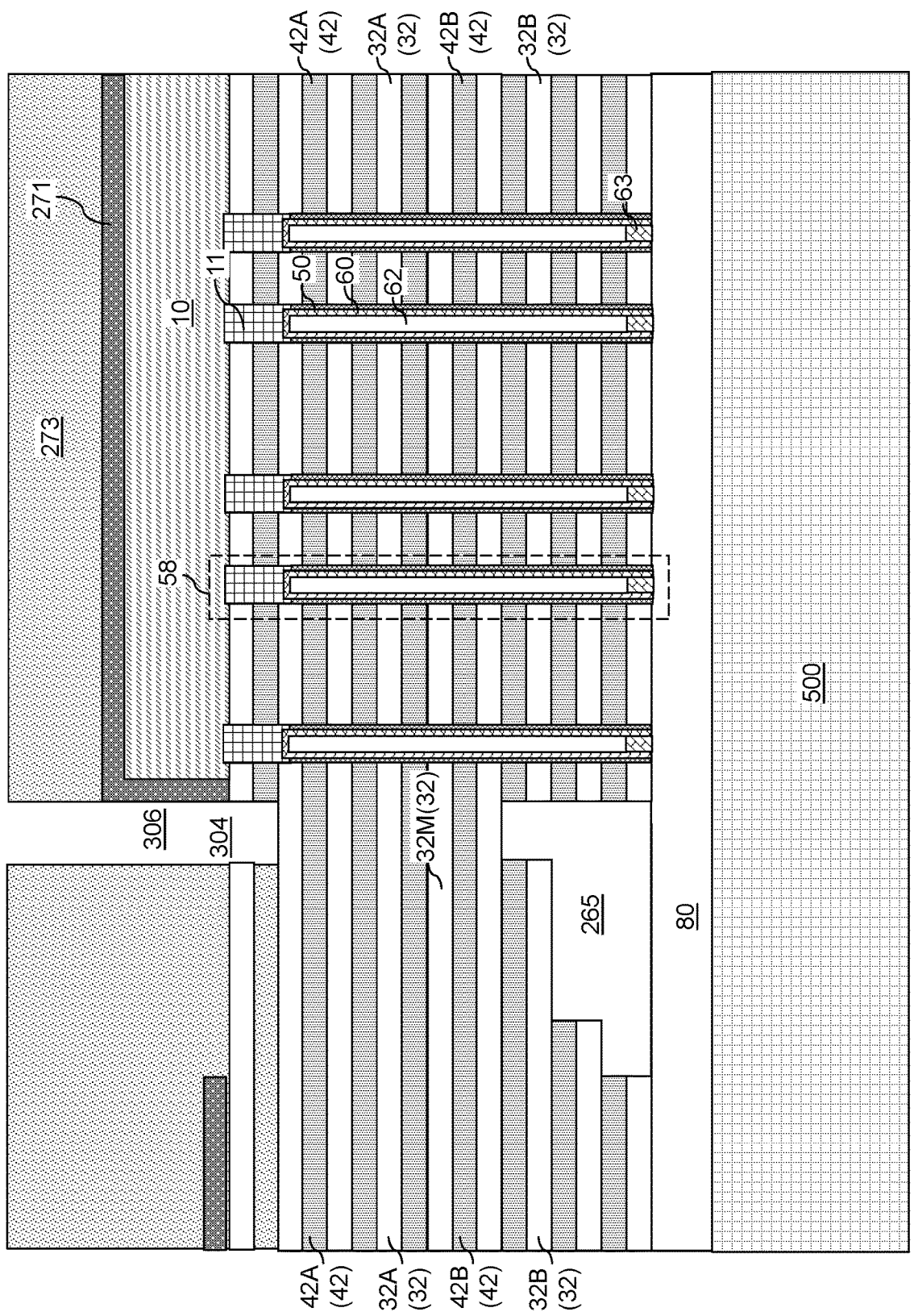
FIG. 9C is a vertical cross-sectional view of the exemplary structure along the hinged vertical plane C-C' of FIG. 9A.

Referring to FIGS. 9A-9C, a trimmable etch mask layer 273 can be applied over the patterned hard mask layer 271, and can be lithographically patterned to form openings 306 having edges that laterally extend along the second horizontal direction hd2 over a respective one of the openings 304 in the patterned hard mask layer 271. The trimmable etch mask layer 273 includes an etch mask material that can be controllably trimmed during subsequent processing steps. For example, the trimmable etch mask layer 273 may include a photoresist material providing a slow ash rate. A first anisotropic etch process can be performed to transfer a composite pattern formed by intersections of the openings 306 in the trimmable etch mask layer 273 and the openings 304 the patterned hard mask layer 271. A pair of a first insulating layer 32A and a first sacrificial material layer 42A that is most proximal to the semiconductor material layer 10 can be etched with each area of the intersections of the openings 306 in the trimmable etch mask layer 273 and the openings 304 in the patterned hard mask layer 271 by the first anisotropic etch process.

Figure 10A:
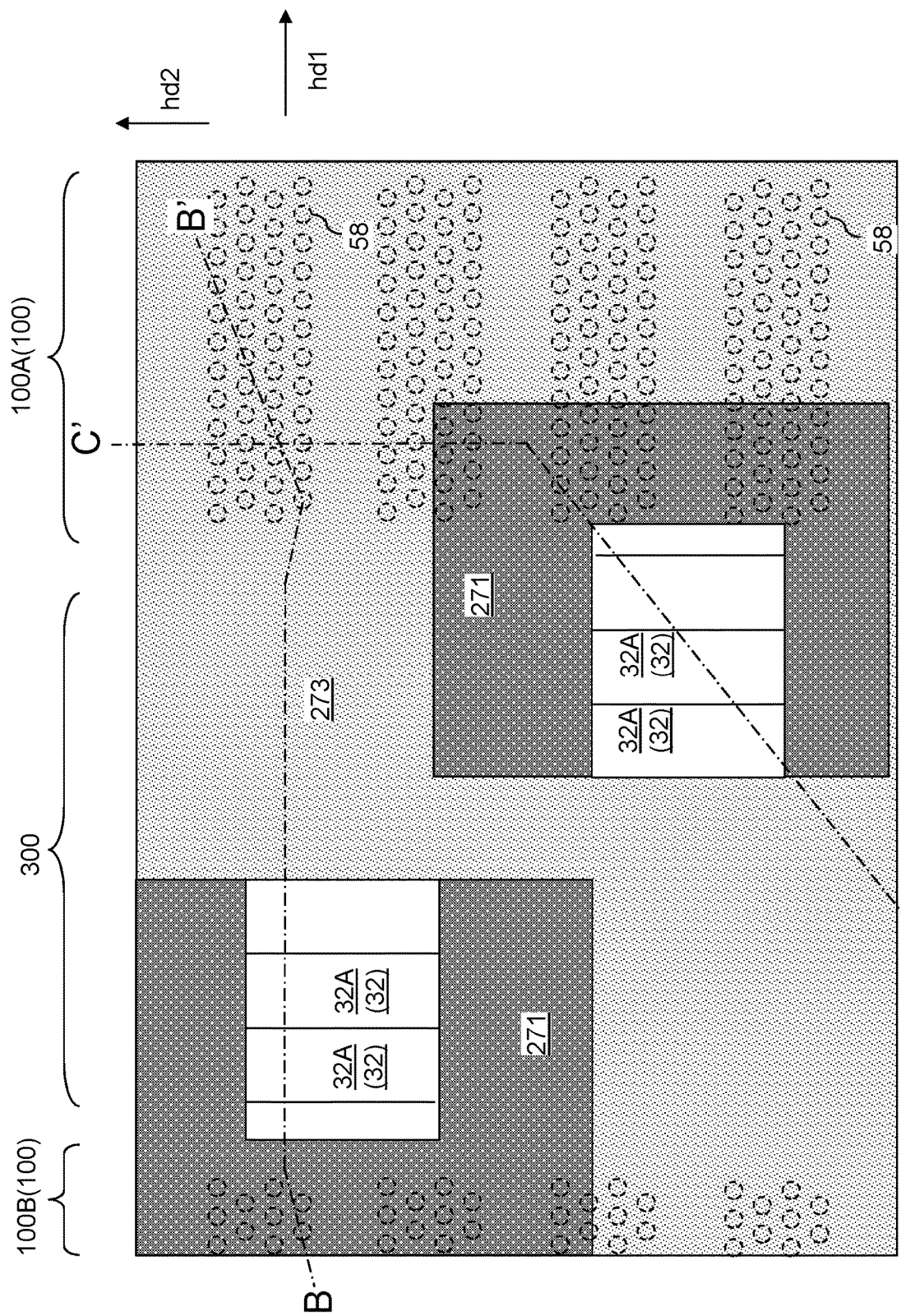
FIG. 10A is a top-down view of the exemplary structure after a terminal anisotropic etch process within an alternating series of etch mask trimming processes and anisotropic etch processes that forms proximal stepped surfaces according to an embodiment of the present disclosure.
Figure 10B:
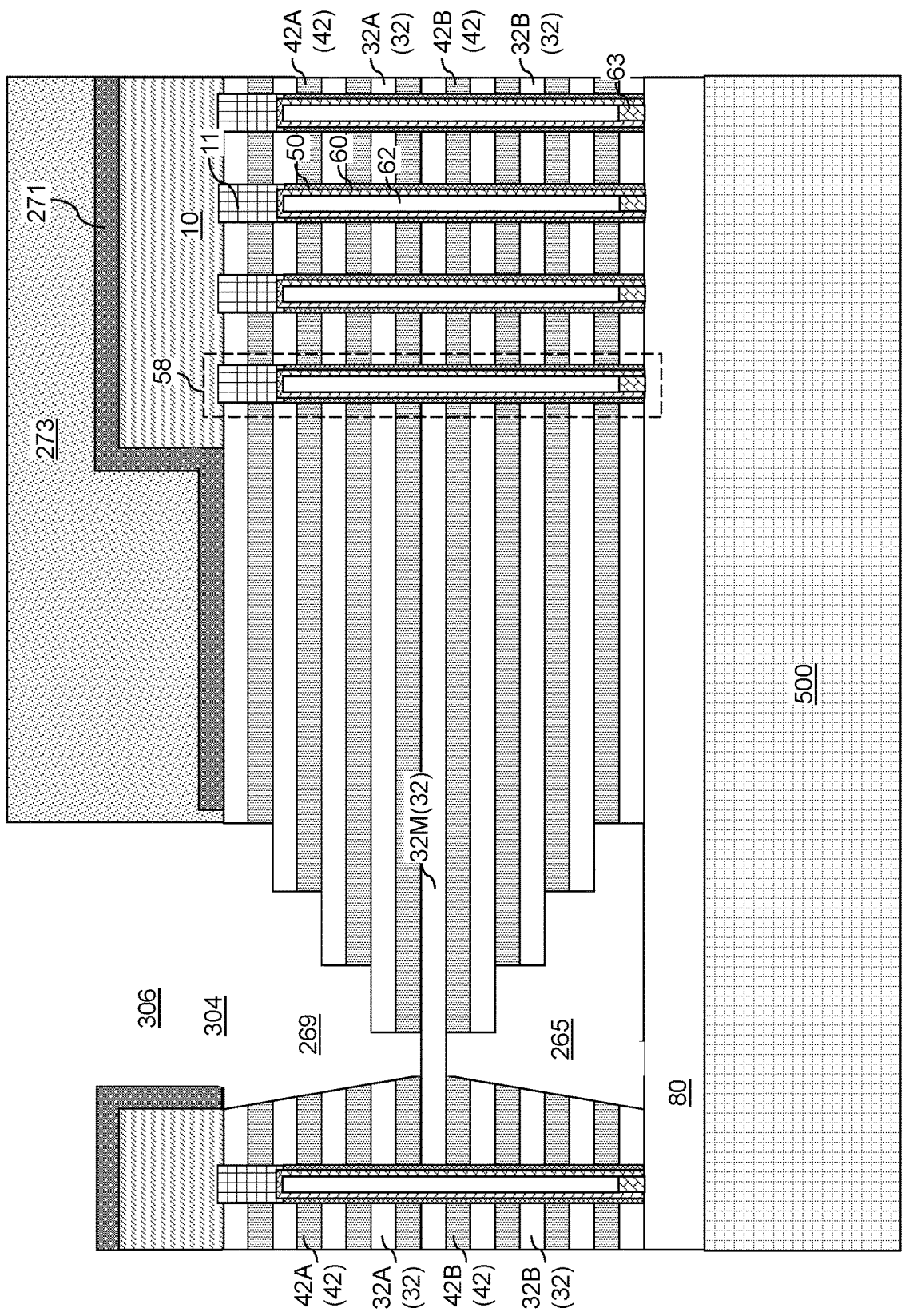
FIG. 10B is a vertical cross-sectional view of the exemplary structure along the hinged vertical plane B-B' of FIG. 10A.
Figure 10C:
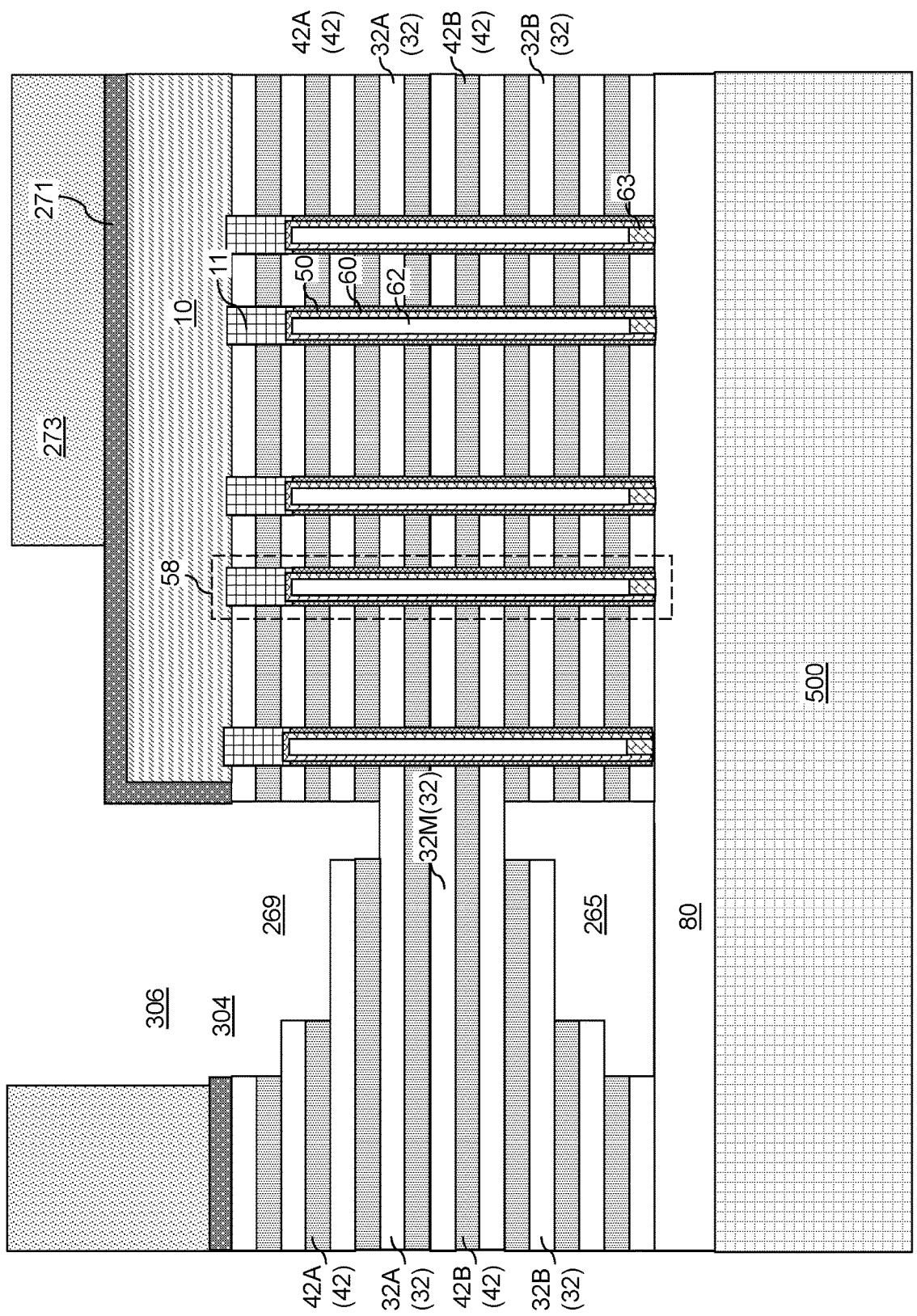
FIG. 10C is a vertical cross-sectional view of the exemplary structure along the hinged vertical plane C-C' of FIG. 10A.

Referring to FIGS. 10A-10C, an alternating series of etch mask trimming processes and anisotropic etch processes can be performed to form a set of proximal stepped surfaces (also referred to as first stepped surfaces) within each area of the openings through the patterned hard mask layer 271. Generally, a plurality of masked anisotropic etch processes can be performed. Each masked anisotropic etch process employs a combination of the trimmable etch mask layer 273 and the patterned hard mask layer 271 as an etch mask. The trimmable etch mask layer 273 is employed as an etch mask, in addition to the patterned hard mask layer 271, for each of the masked anisotropic etch processes. The trimmable etch mask layer 273 is trimmed between each sequentially neighboring pair of masked anisotropic etch processes, i.e., a pair of a masked anisotropic etch process and another masked anisotropic etch process that immediately follows the masked anisotropic etch process without any intervening masked anisotropic etch process therebetween. The plurality of masked anisotropic etch processes etches unmasked regions of the portion of the first layer stack (32A, 42A) underlying an opening in the semiconductor material layer 10 along a direction that points from the substrate (i.e., the semiconductor material layer 10) toward the alternating stack (32, 42), i.e., along a vertical direction pointing from the semiconductor material layer toward the contact-level dielectric layer 80.

A set of proximal stepped surfaces is formed within each area of an opening in the patterned hard mask layer 271 by patterning a respective portion of the first layer stack (32A, 42A). Each set of proximal stepped surfaces is located within an area of an opening through the semiconductor material layer 10. A stepped cavity 269 is formed above each set of proximal stepped surfaces. Each set of proximal stepped surfaces may include proximal horizontal surfaces of the first insulating layers 32A and sidewalls of the first insulating layers 32A and the first sacrificial material layers 42A. Alternatively, each set of proximal stepped surfaces may include proximal horizontal surfaces of the first sacrificial material layers 42A and sidewalls of the first insulating layers 32A and the first sacrificial material layers 42A. In one embodiment, a stepped cavity 269 may overlie, and may have an areal overlap with, a retro-stepped dielectric material portion 265.

Figure 11A:
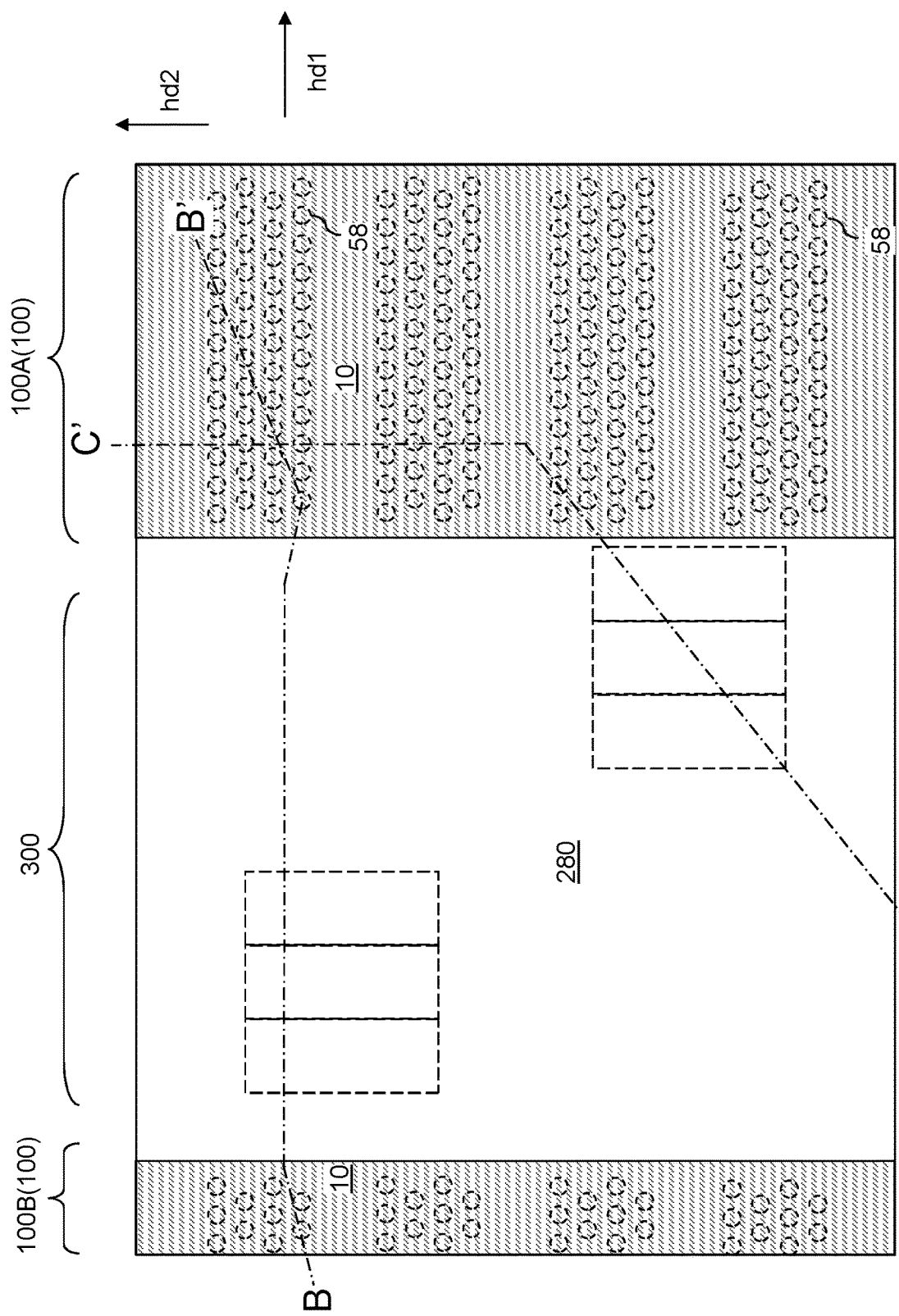
FIG. 11A is a top-down view of the exemplary structure after formation of upright-stepped dielectric material portions according to an embodiment of the present disclosure.
Figure 11B:
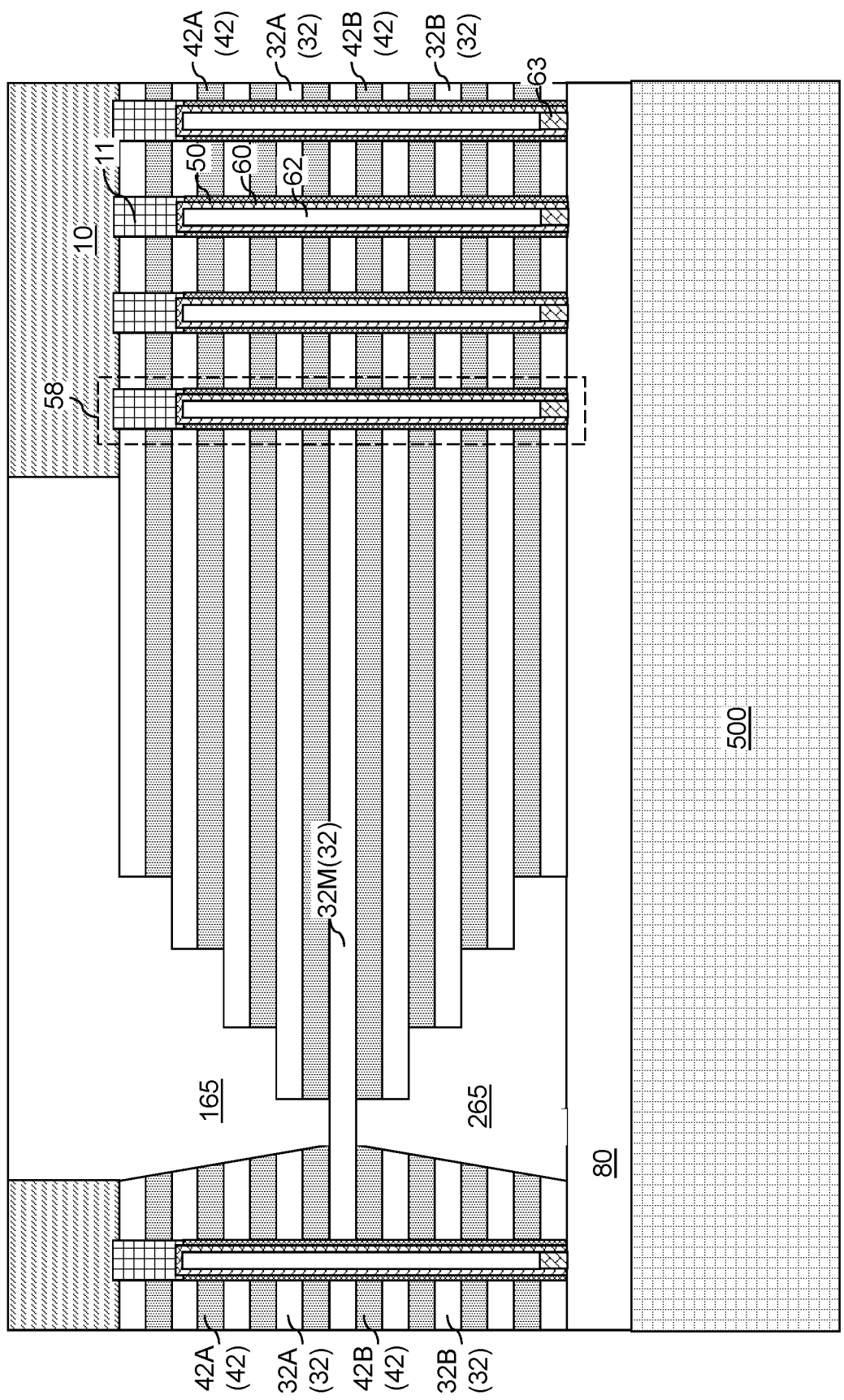
FIG. 11B is a vertical cross-sectional view of the exemplary structure along the hinged vertical plane B-B' of FIG. 11A.
Figure 11C:
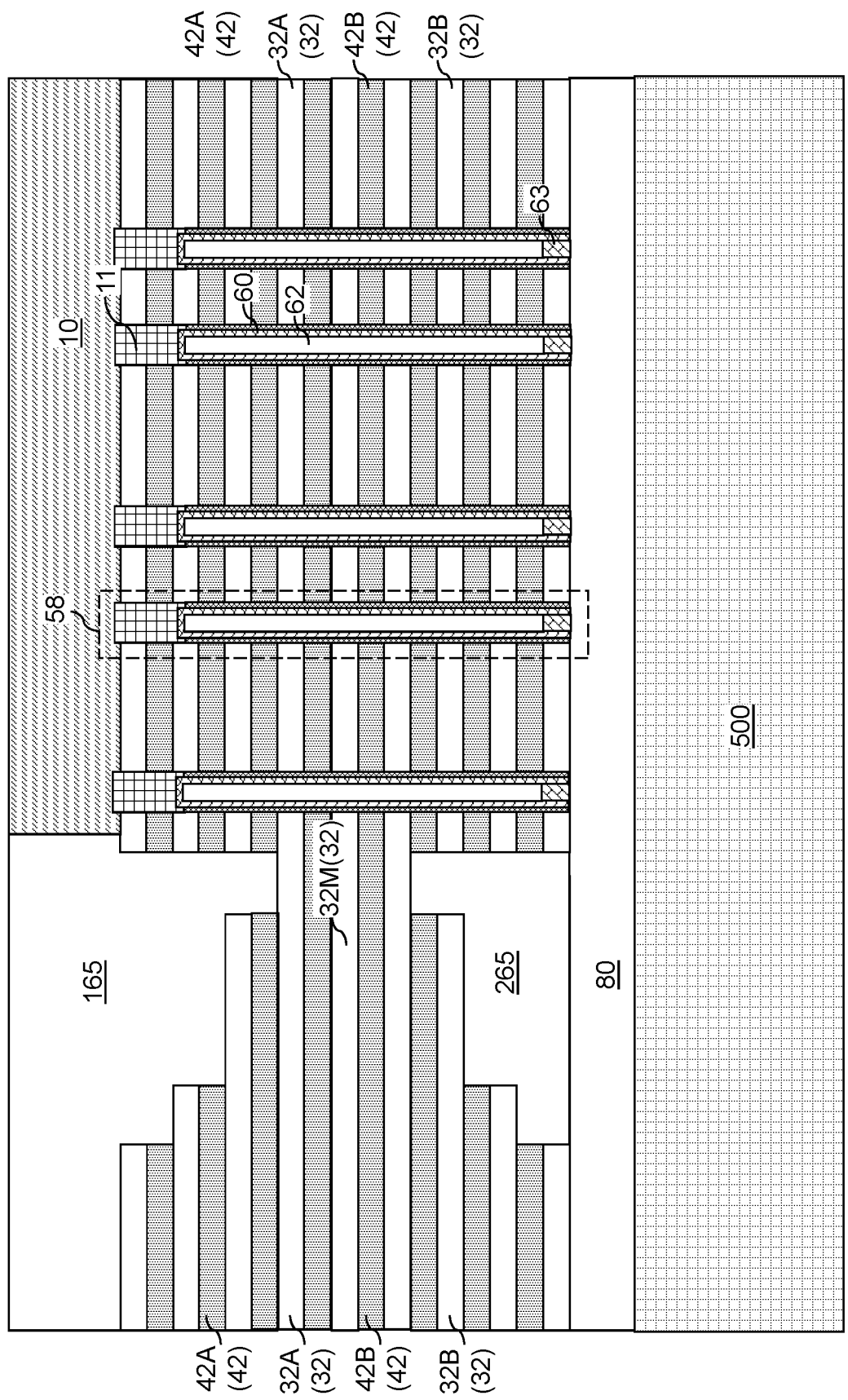
FIG. 11C is a vertical cross-sectional view of the exemplary structure along the hinged vertical plane C-C' of FIG. 11A.

Referring to FIGS. 11A-11C, remaining portions of the trimmable etch mask layer 273 can be etched, for example, by ashing or dissolution in an organic solvent. The patterned hard mask layer 271 can be removed by selective etching to the materials of the alternating stack (32, 42) and the semiconductor material layer 10.

A dielectric fill material such as undoped silicate glass or a doped silicate glass can be deposited in the stepped cavities 269 and within each opening 302 through the semiconductor material layer 10. Excess portions of the dielectric fill material located above the horizontal plane including the backside surface of the semiconductor material layer 10 can be removed by a planarization process such as a chemical mechanical planarization process. A remaining portion of the dielectric fill material that fill an opening 302 through the semiconductor material layer 10 and a set of stepped cavities 269 underlying the opening constitutes an upright-stepped dielectric material portion 165. Each upright-stepped dielectric material portion 165 can have a planar surface (which is herein referred to as a substrate-side planar surface) that is located within a horizontal plane including the backside surface of the semiconductor material layer 10. The upright-stepped dielectric material portion 165 can contact proximal stepped surfaces of the first layer stack (32A, 42A) around each stepped cavity.

Each upright-stepped dielectric material portion 165 can have a uniform horizontal cross-sectional area that is uniform between the horizontal plane including the backside surface of the semiconductor material layer 10 and the horizontal plane including the front surface of the semiconductor material layer 10, and a variable horizontal cross-sectional area that decrease with a vertical distance from the horizontal plane including the front surface of the semiconductor material layer 10 toward the distal planar surface of the alternating stack (32, 42) that contacts the contact-level dielectric layer 80. Thus, when viewed in an orientation in which the semiconductor material layer 10 is located at the bottom and the contact-level dielectric layer 80 is located at the top, each upright-stepped dielectric material portion 165 can have a vertical cross-sectional profile in which the top portion has a lesser width than the bottom portion, and the vertical cross-sectional profile appears to an observer to be in an "upright" position to form the "upright-stepped" dielectric material portion 165. In one embodiment, the backside surface of the semiconductor material layer 10 can be located within the horizontal plane including a substrate-side planar surface (which is also referred to as a backside planar surface) of the upright-stepped dielectric material portion 165. A sidewall of the upright-stepped dielectric material portion 165 can contact the semiconductor material layer 10.

Figure 12A:
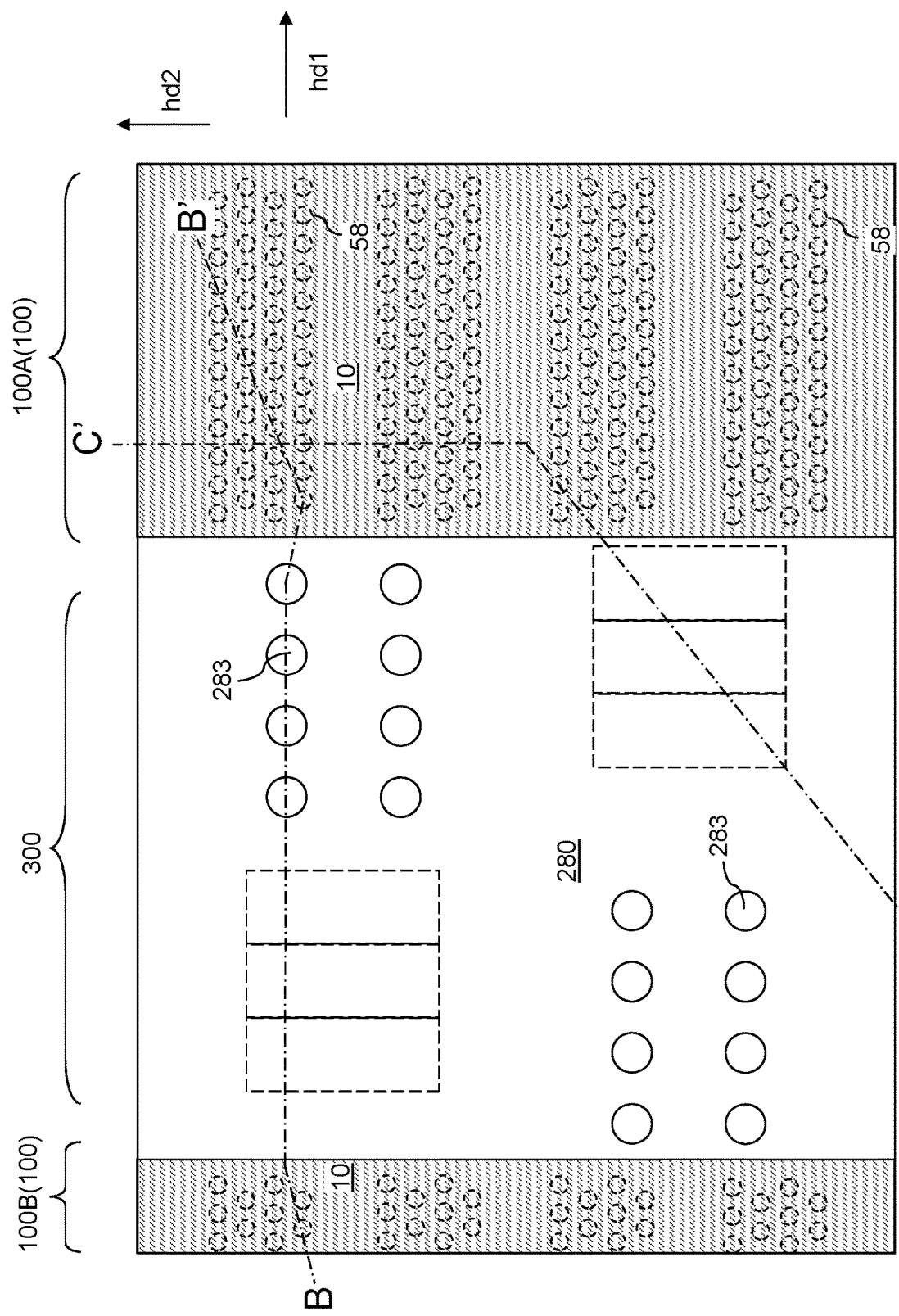
FIG. 12A is a top-down view of the exemplary structure after formation of through-stack connection via cavities according to an embodiment of the present disclosure.
Figure 12B:
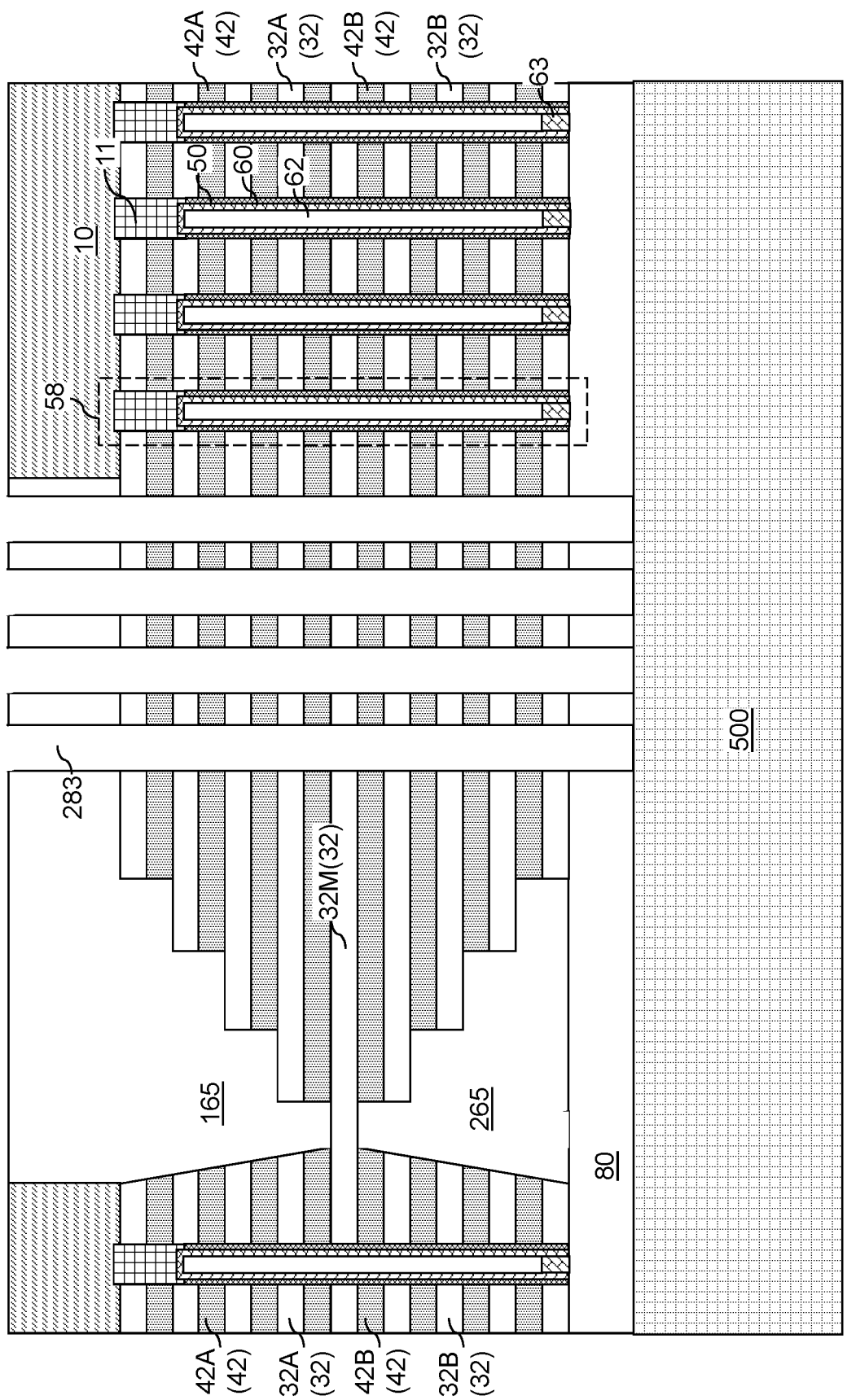
FIG. 12B is a vertical cross-sectional view of the exemplary structure along the hinged vertical plane B-B' of FIG. 12A.
Figure 12C:
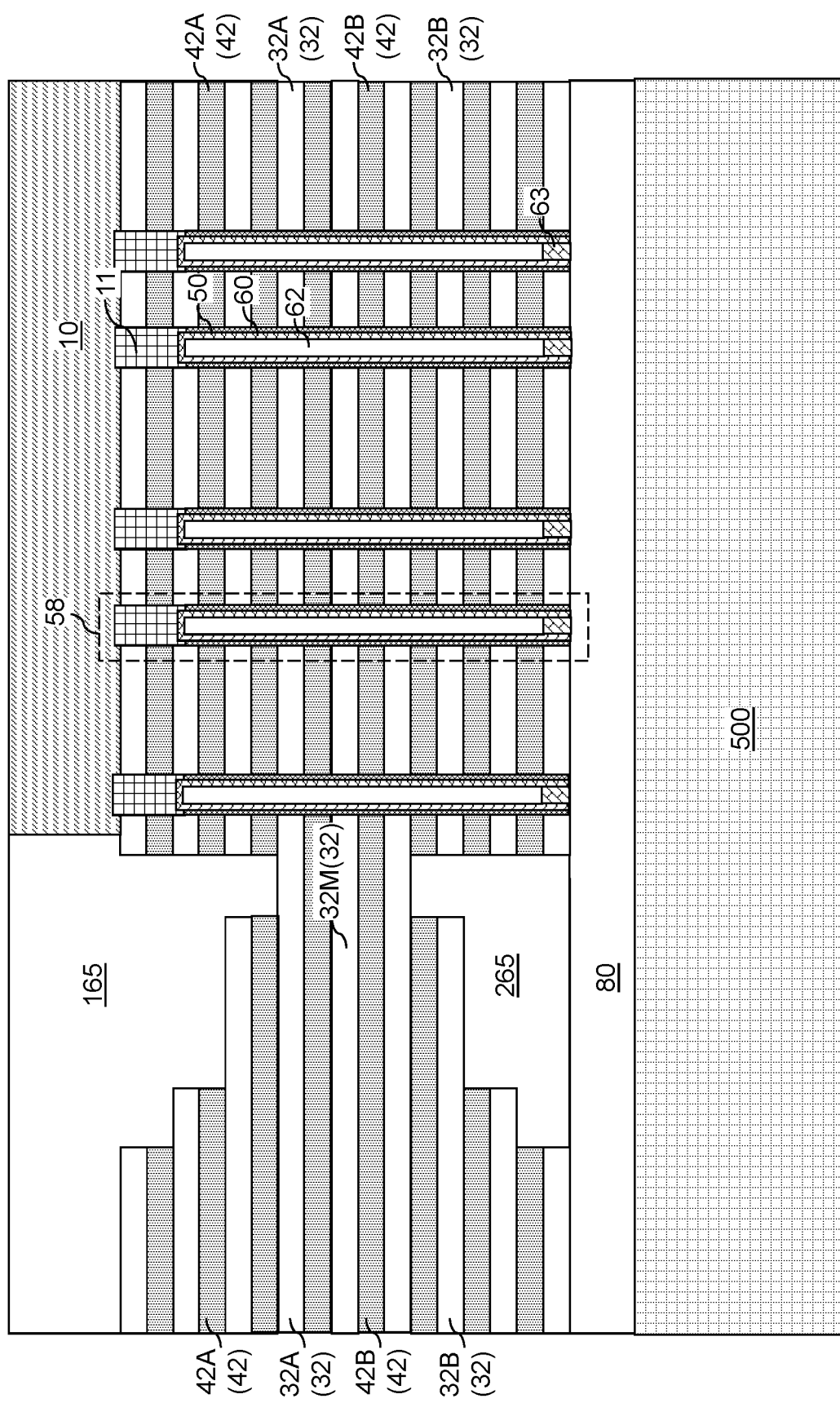
FIG. 12C is a vertical cross-sectional view of the exemplary structure along the hinged vertical plane C-C' of FIG. 12A.

Referring to FIGS. 12A-12C, a photoresist layer (not shown) can be applied over the backside surface of the semiconductor material layer 10 and the substrate-side planar surface of the upright-stepped dielectric material portion 165, and can be lithographically patterned to form an array of openings within the connection region 300 in areas that do not overlap with the retro-stepped dielectric material portions 265 and the upright-stepped dielectric material portion 165. Each opening in the photoresist layer can be formed within an area in which each layer of the alternating stack (32, 42) is present.

An anisotropic etch process can be performed to form an array of via cavities that extend through the upright-stepped dielectric material portion 165, the alternating stack (32, 42), and the contact-level dielectric layer 80. Via cavities vertically extending to the first carrier substrate 500 are formed. The via cavities vertically extend through the alternating stack (32, 42), and are subsequently employed to form a conductive via structure that provides electrical connection between metal interconnect structures to be formed on a proximal side of the alternating stack (32, 42) and on a distal side of the alternating stack (32, 42), and thus, are herein referred to as through-stack connection via cavities 283.

Figure 13A:
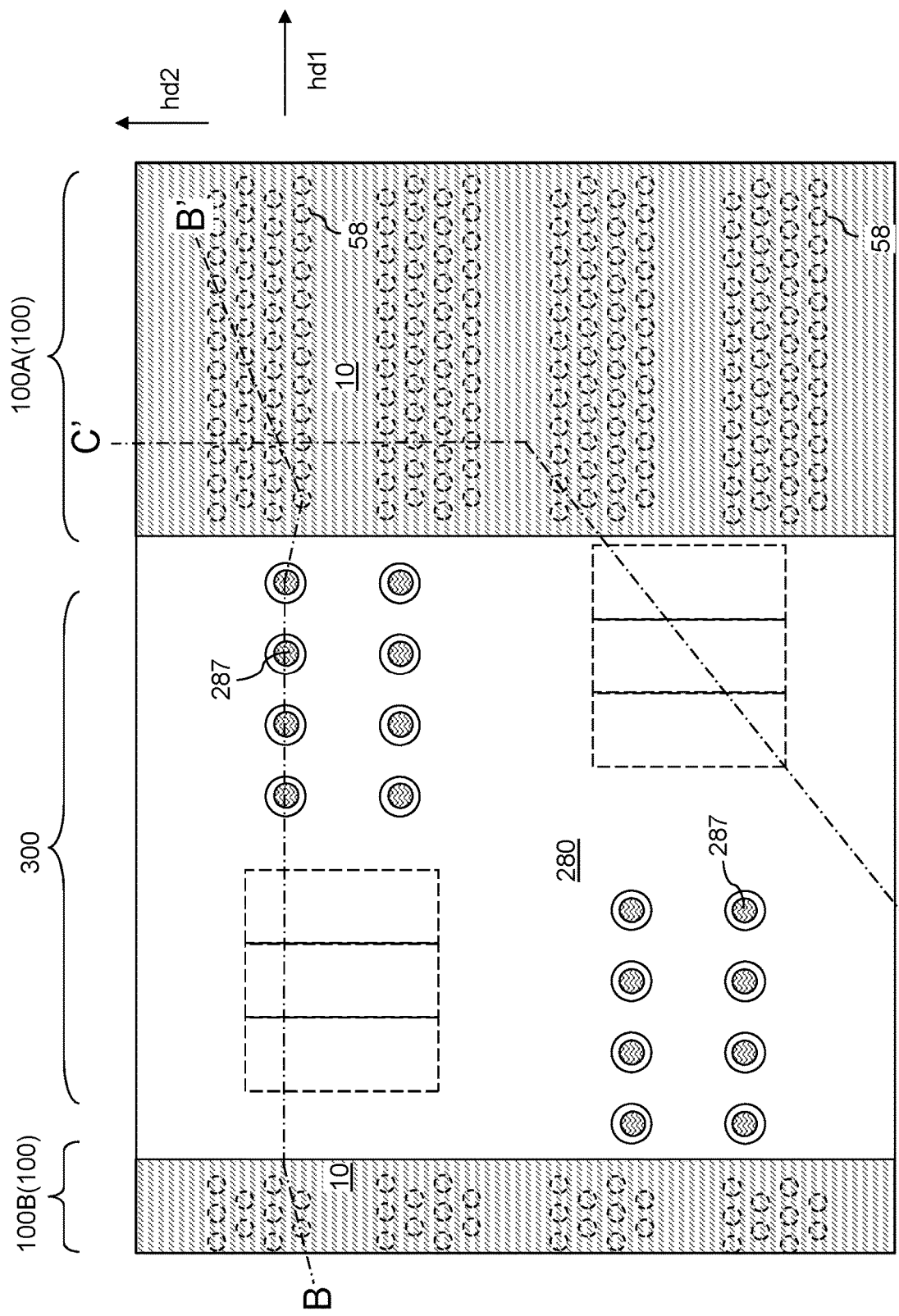
FIG. 13A is a top-down view of the exemplary structure after formation of in-process laterally-isolated through-stack connection via structures including a respective combination of a sacrificial via structure and a tubular dielectric spacer according to an embodiment of the present disclosure.
Figure 13B:
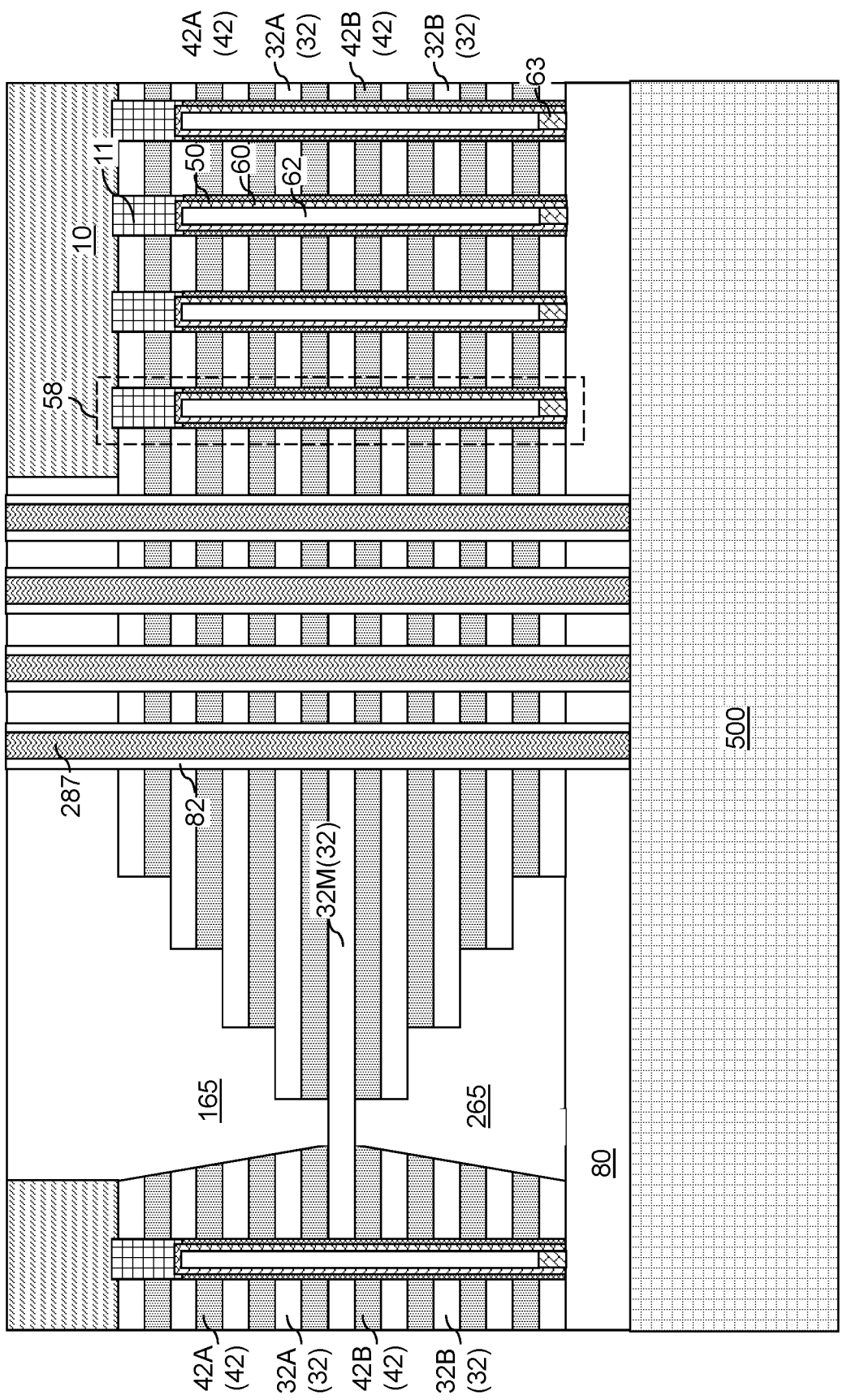
FIG. 13B is a vertical cross-sectional view of the exemplary structure along the hinged vertical plane B-B' of FIG. 13A.
Figure 13C:
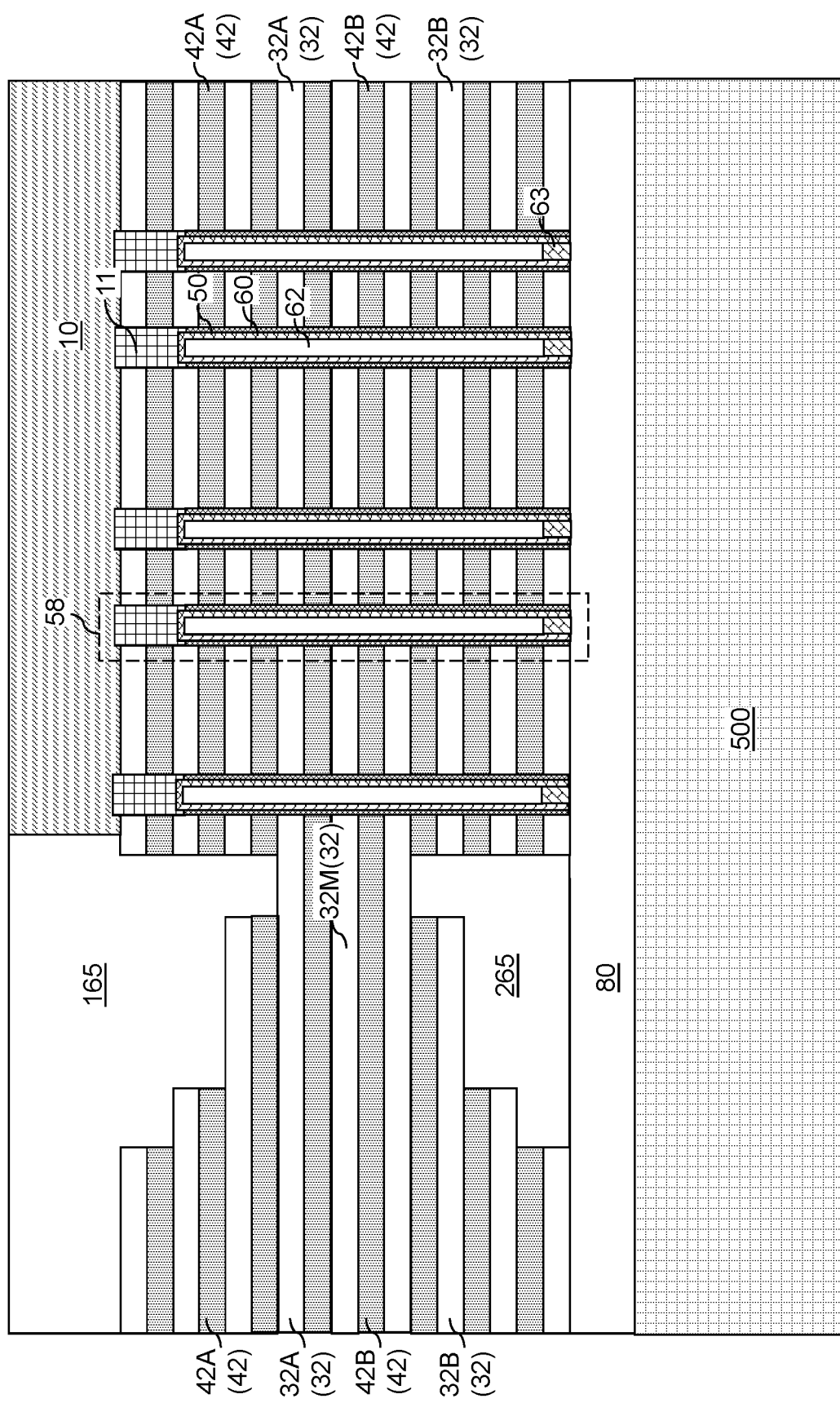
FIG. 13C is a vertical cross-sectional view of the exemplary structure along the hinged vertical plane C-C' of FIG. 13A.

Referring to FIGS. 13A-13C, a conformal dielectric material layer including a dielectric material such as silicon oxide can be deposited in the through-stack connection via cavities 283 and over the backside surface of the semiconductor material layer 10 and over the substrate-side planar surface of the upright-stepped dielectric material portion 165. An anisotropic etch process can be performed to remove horizontal portions of the conformal dielectric material layer. Each remaining tubular portion of the conformal dielectric material layer constitutes a tubular dielectric spacer 82. Each tubular dielectric spacer 82 can vertically extend through, and can contact sidewalls of, the upright-stepped dielectric material portion 165, the alternating stack (32, 42), and the contact-level dielectric layer 80. Each tubular dielectric spacer 82 can have a thickness in a range from 5 nm to 100 nm between an inner cylindrical sidewall and an outer cylindrical sidewall, although lesser and greater thicknesses may also be employed.

A sacrificial fill material such as amorphous silicon or amorphous carbon can be deposited in the remaining volumes of the through-stack connection via cavities 283. Excess portions of the sacrificial fill material can be removed from above the horizontal plane including the substrate-side planar surface of the upright-stepped dielectric material portion 165 by a planarization process, which may employ a recess etch process and/or a chemical mechanical planarization process. Each remaining portion of the sacrificial fill material located within a respective one of the through-stack connection via cavities 283 comprises a sacrificial via structure 287. Each contiguous combination of a sacrificial via structure 287 and a tubular dielectric spacer 82 constitutes an in-process laterally-isolated through-stack connection via structure (287, 82), which is subsequently modified to form a laterally-isolated through-stack connection via structure. Alternatively, an electrically conductive material can be deposited in the remaining volumes of the through-stack connection via cavities 283 instead of the sacrificial fill material. In this case, the laterally-isolated through-stack connection via structures are formed at this step.

Figure 14A:
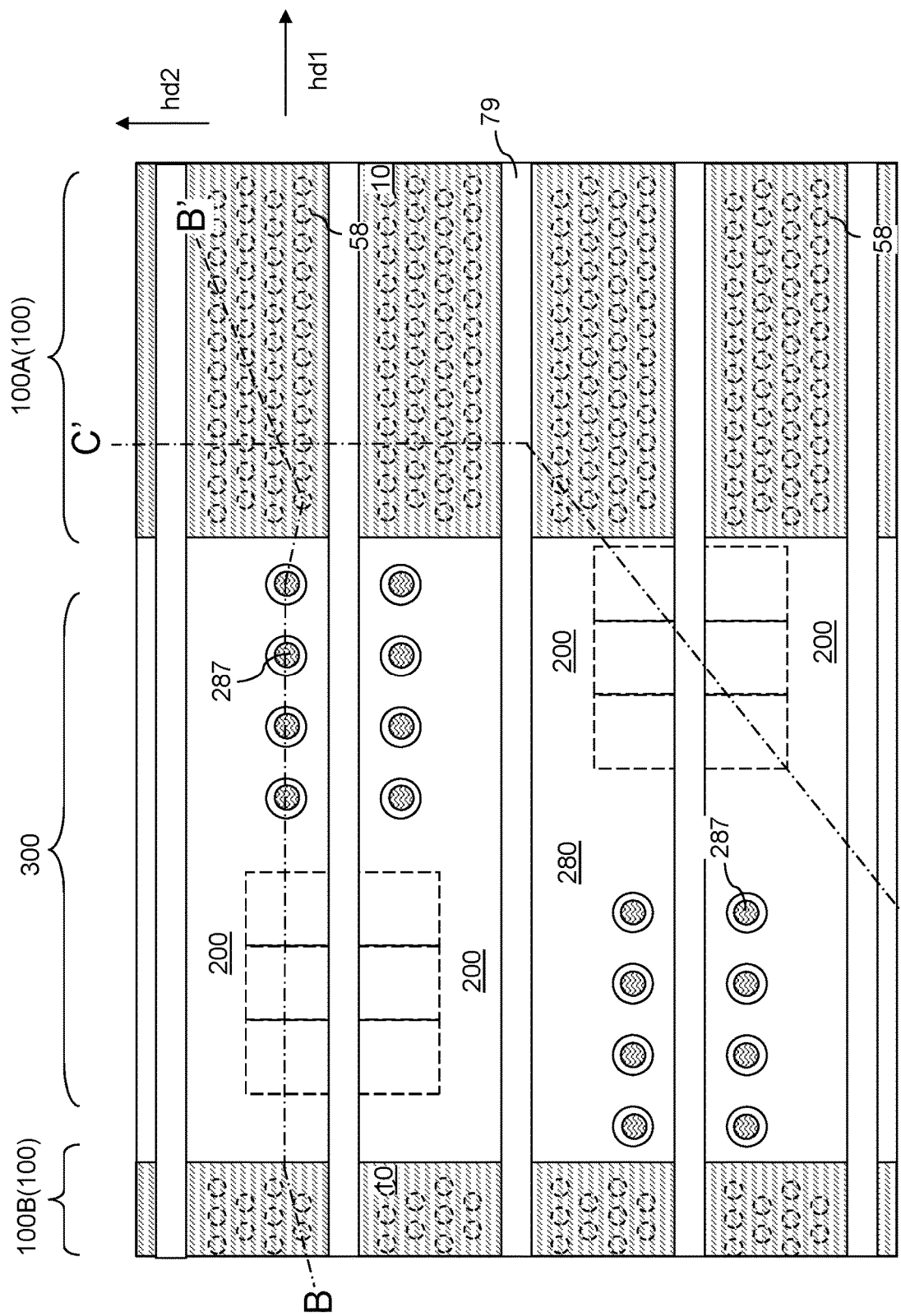
FIG. 14A is a top-down view of the exemplary structure after formation of line trenches vertically extending through the semiconductor material layers, the upright-stepped dielectric material portions, and the alternating stack according to an embodiment of the present disclosure.
Figure 14B:
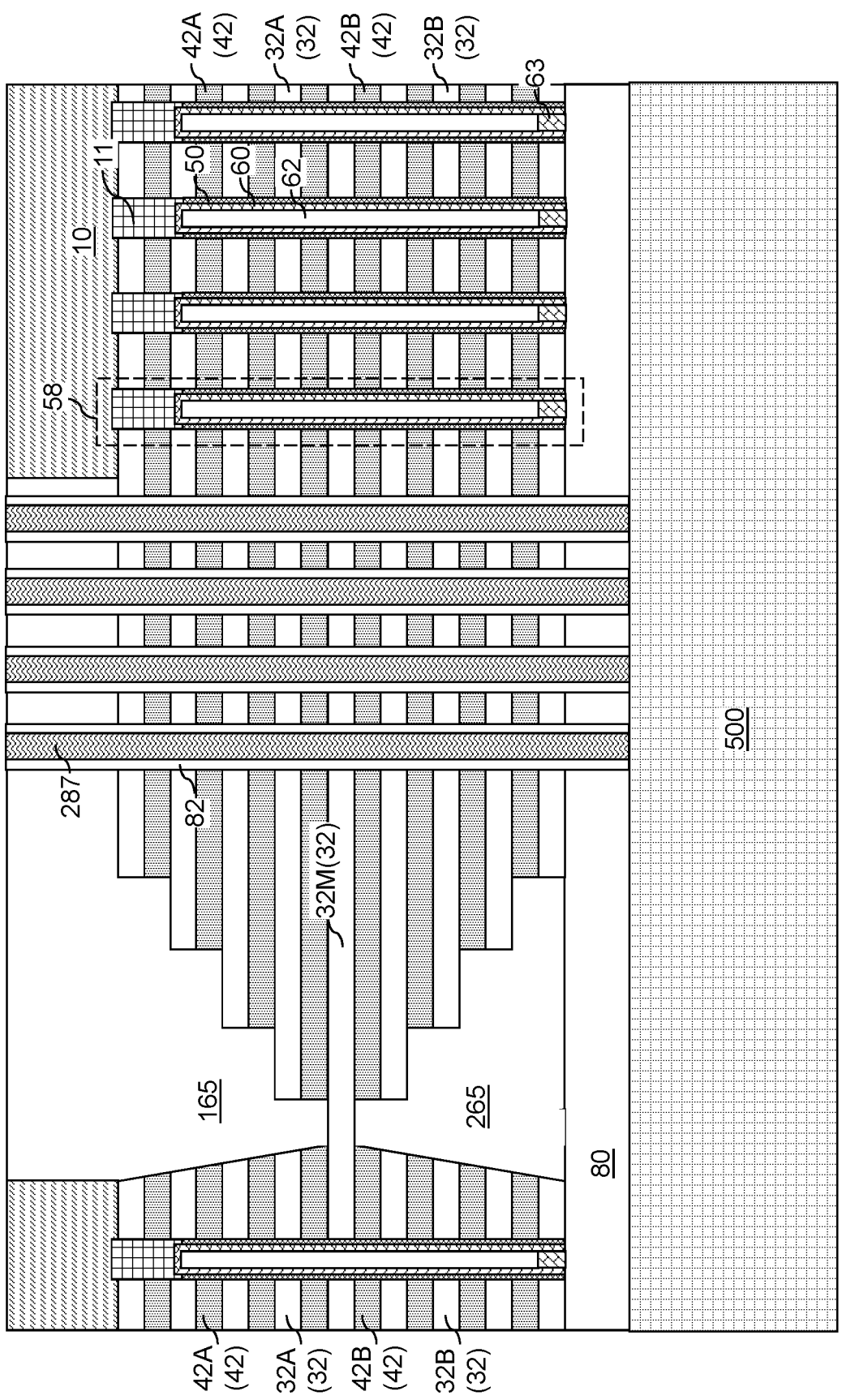
FIG. 14B is a vertical cross-sectional view of the exemplary structure along the hinged vertical plane B-B' of FIG. 14A.
Figure 14C:
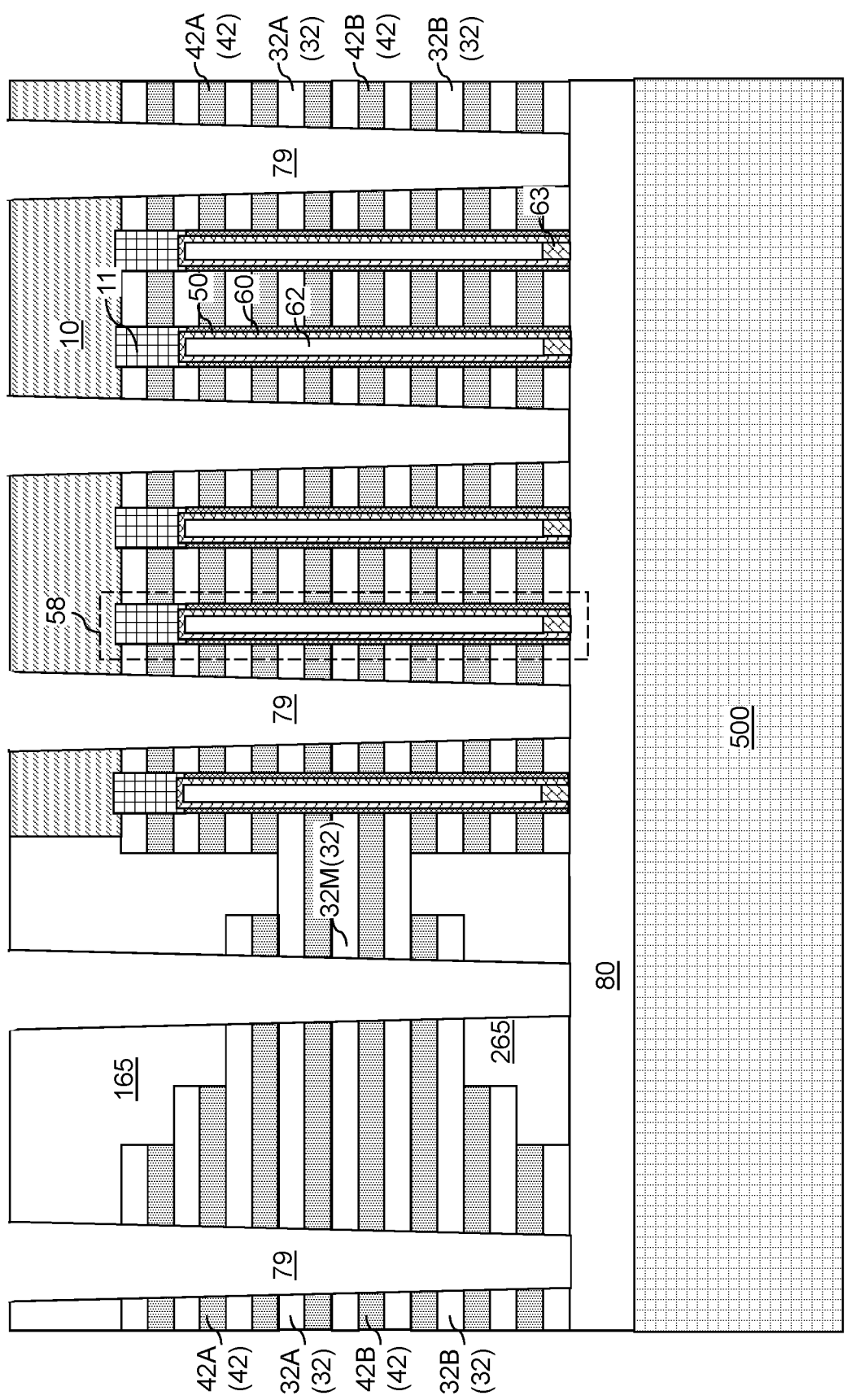
FIG. 14C is a vertical cross-sectional view of the exemplary structure along the hinged vertical plane C-C' of FIG. 14A.

Referring to FIGS. 14A-14C, a photoresist layer (not shown) can be applied over the backside surface of the semiconductor material layer 10 and the substrate-side planar surface of the upright-stepped dielectric material portion 165, and can be lithographically patterned to form line-shaped openings that laterally extend along a horizontal direction connecting the first memory array region 100A and the second memory array region 100B. For example, the line-shaped openings may laterally extend along the first horizontal direction hd1 with a uniform width along the second horizontal direction hd2. The width of each line-shaped opening along the second horizontal direction hd2 can be greater than the thickness of each sacrificial material layer 42, and may be in a range from twice the thickness of the sacrificial material layer 42 to 60 times the thickness of each sacrificial material layer 42.

An anisotropic etch process can be performed to etch unmasked portions of the semiconductor material layer 10, the upright-stepped dielectric material portion 165, and the alternating stack (32, 42). Line trenches 79 laterally extending along the first horizontal direction hd1 can be formed. Each line trench 79 can vertically extend at least to a proximal horizontal surface of the contact-level dielectric layer 80, and may extend partially into, or through, the contact-level dielectric layer 80. The semiconductor material layer 10 is divided into multiple semiconductor material layers 10 that are laterally spaced apart along the second horizontal direction hd2 within each memory array region 100. The alternating stack (32, 42) is divided into multiple alternating stacks (32, 42) located between a respective neighboring pair of line trenches 79. The upright-stepped dielectric material portion 165 can be divided into multiple upright-stepped dielectric material portions 165. Each upright-stepped dielectric material portion 165 can be located between a neighboring pair of line trenches 79, and can include a respective set of stepped surfaces that contacts a set of proximal stepped surfaces of an alternating stack (32, 42) as divided by the line trenches 79.

Each alternating stack (32, 42) can laterally extend between a first memory array region 100A and a second memory array region 100B, and can include a narrow connection region 200 that is adjacent to an upright-stepped dielectric material portion 165. Each connection region 200 of an alternating stack (32, 42) has a width that is the distance between a neighboring pair of line trenches 79 less the width of an upright-stepped dielectric material portion 165. Each alternating stack (32, 42) can include a respective first layer stack of first insulating layers 32A (which are patterned portions of the first insulating layers 32A at the processing steps of FIGS. 13A-13C) and first sacrificial material layers 42A (which are patterned portions of the first sacrificial material layers 42A at the processing steps of FIGS. 13A-13C), a respective second layer stack of second insulating layers 32B (which are patterned portions of the second insulating layers 32B at the processing steps of FIGS. 13A-13C) and second sacrificial material layers 42B (which are patterned portions of the second sacrificial material layers 42B at the processing steps of FIGS. 13A-13C), and a respective mid-level insulating layer 32M (which is a patterned portion of the mid-level insulating layer 32M at the processing steps of FIGS. 13A-13C).

In one embodiment, each line trench 79 may have a tapered vertical cross-sectional profile along the widthwise direction, i.e., along a vertical plane that is perpendicular to the lengthwise direction (such as the first horizontal direction hd1). In this case, the width of each line trench 79 at a most proximal insulating layer 32 (i.e., the first insulating layer 32A in contact with the semiconductor material layer 10) may be greater than the width of each line trench 79 at a most distal insulating layer 32 (i.e., the second insulating layer 32B in contact with the contact-level dielectric layer 80). In one embodiment, line trench 79 may have tapered lengthwise sidewalls. The taper angle of the tapered lengthwise sidewalls (as measured relative to a vertical direction) in vertical cross-sectional views along vertical planes that are perpendicular to the first horizontal direction hd1 may be in a range from 0.2 degree to 10 degrees, such as from 0.5 degree to 3 degrees, although lesser and greater taper angles may also be employed. The photoresist layer can be removed after the anisotropic etch process.

Figure 15A:
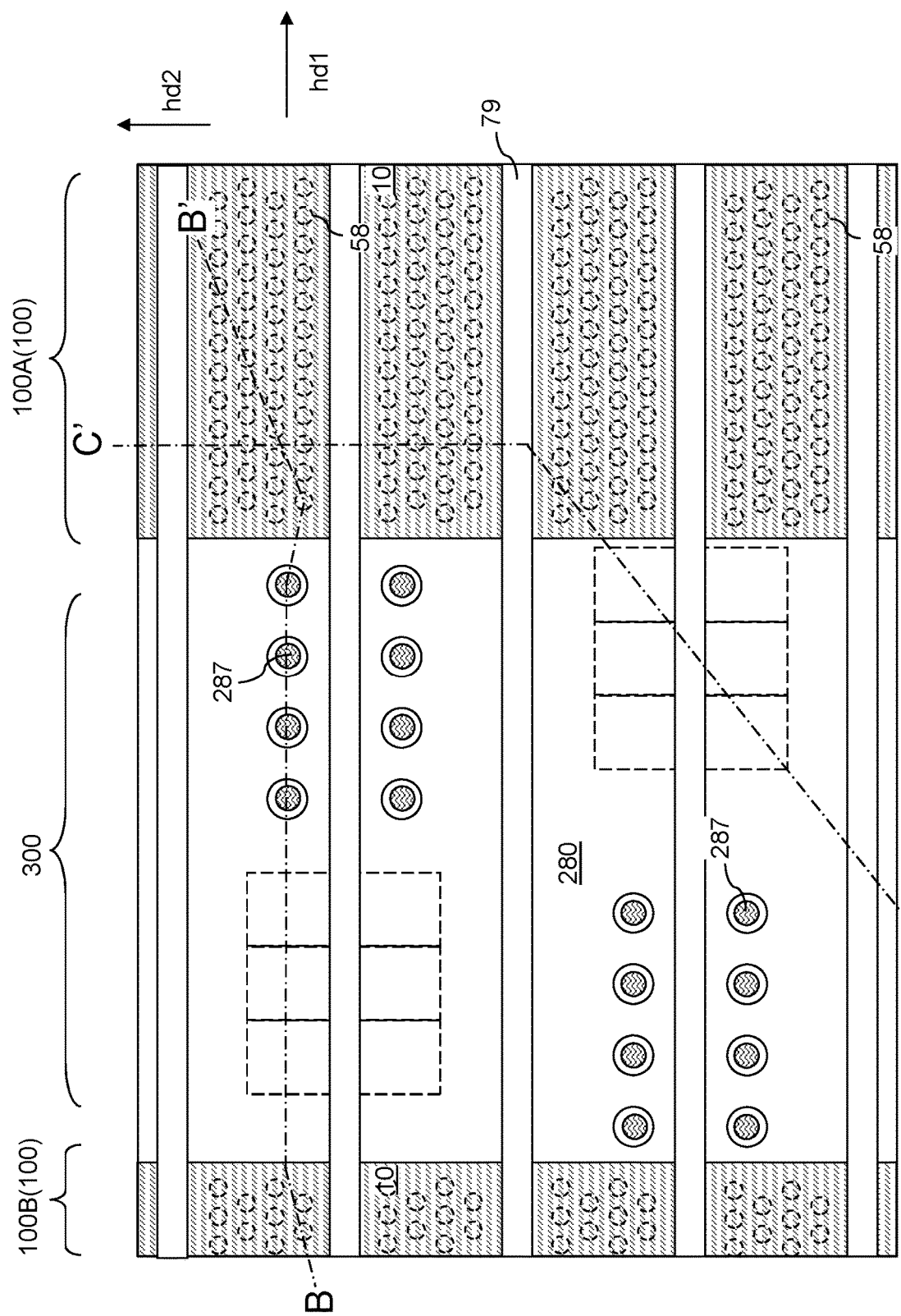
FIG. 15A is a top-down view of the exemplary structure after formation of lateral recesses by removal of sacrificial material layers according to an embodiment of the present disclosure.
Figure 15B:
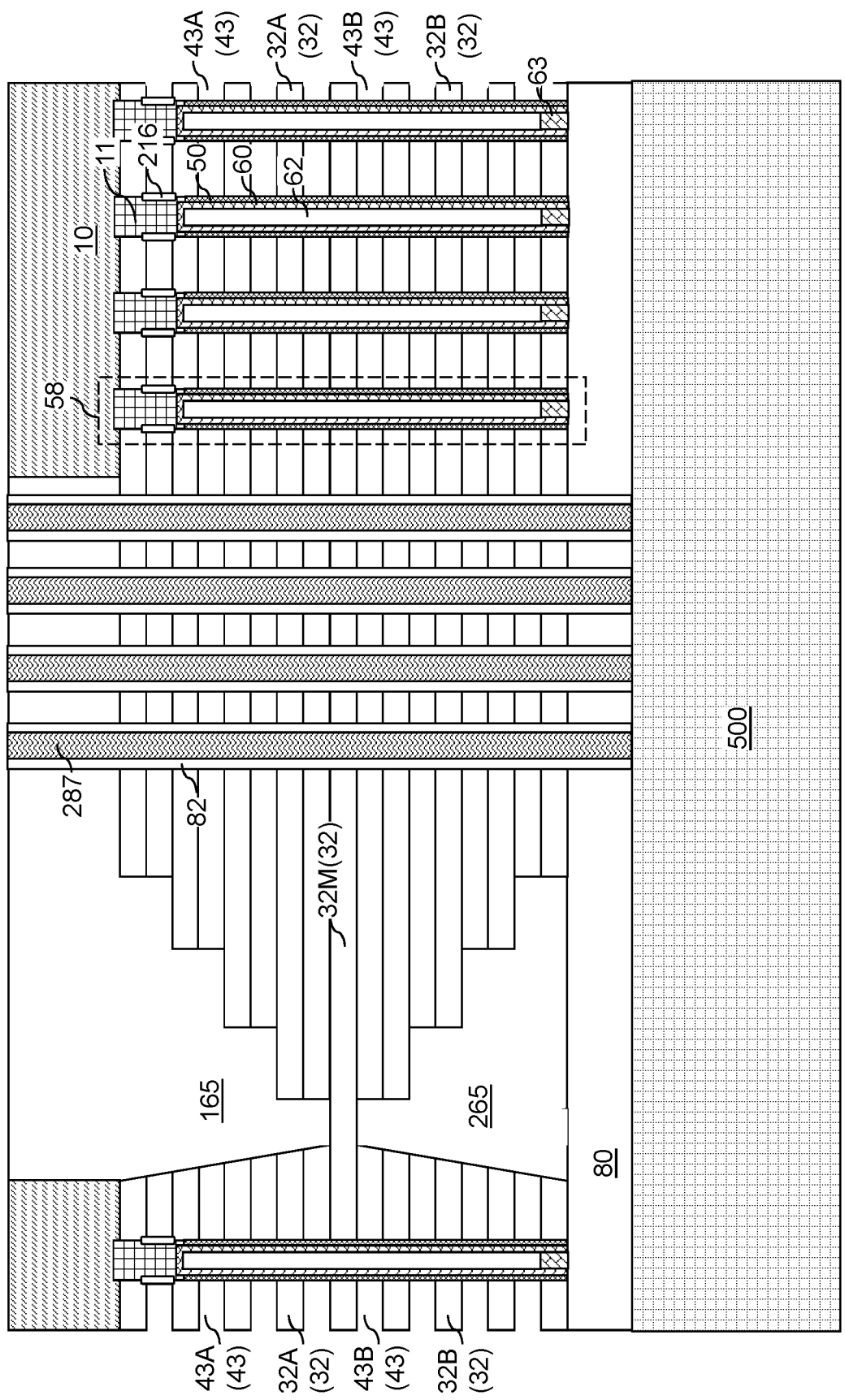
FIG. 15B is a vertical cross-sectional view of the exemplary structure along the hinged vertical plane B-B' of FIG. 15A.
Figure 15C:
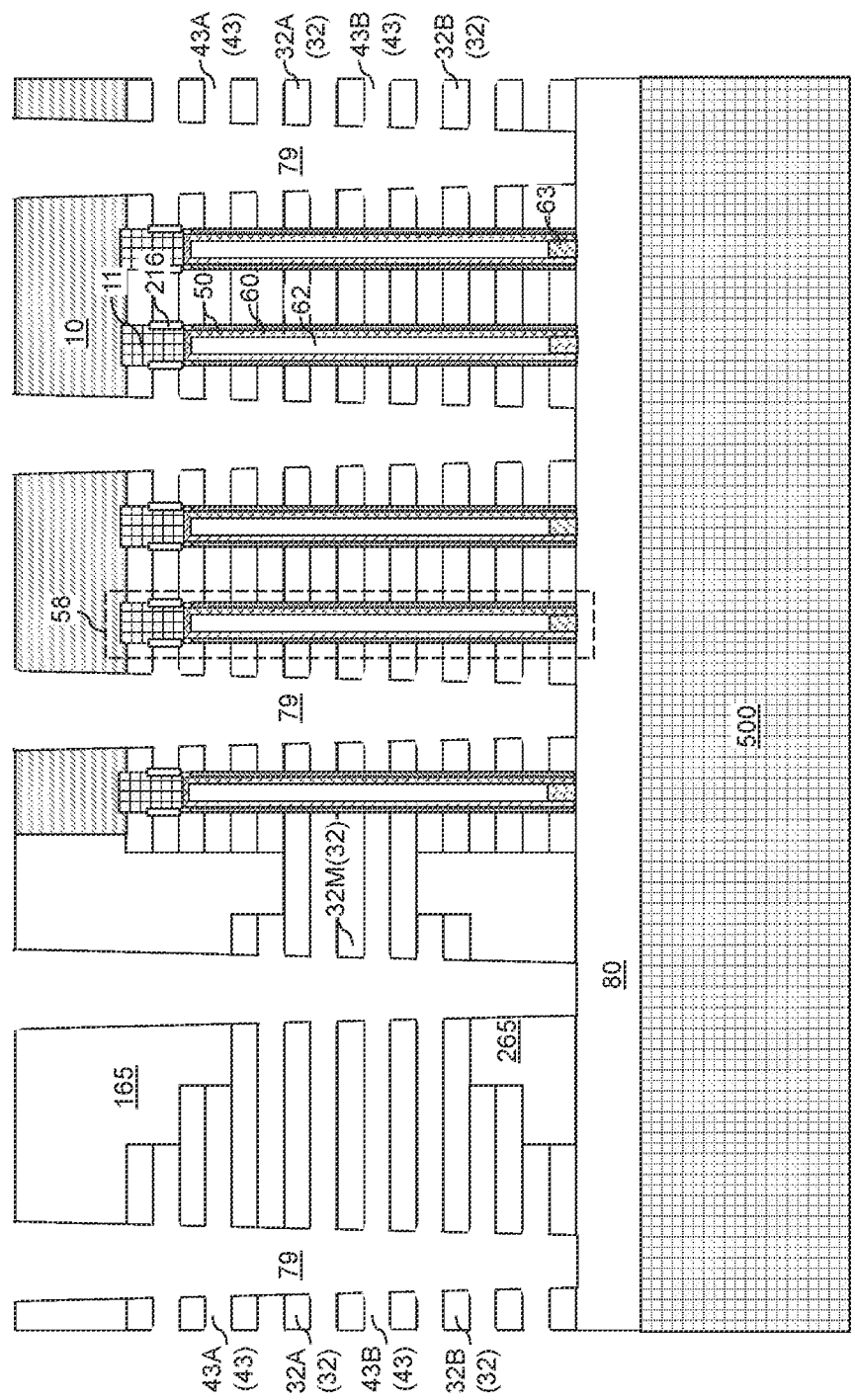
FIG. 15C is a vertical cross-sectional view of the exemplary structure along the hinged vertical plane C-C' of FIG. 15A.

Referring to FIGS. 15A-15C, an etchant that selectively etches the second material of the sacrificial material layers 42 with respect to the first material of the insulating layers 32 can be introduced into the line trenches 79, for example, employing an etch process. Lateral recesses 43 are formed in volumes from which the sacrificial material layers 42 are removed. The removal of the second material of the sacrificial material layers 42 can be selective to the first material of the insulating layers 32, the material of the upright-stepped dielectric material portions 165, the material of the retro-stepped dielectric material portions 265, the semiconductor material of the semiconductor material layer 10, and the material of the outermost layer of the memory films 50. In one embodiment, the sacrificial material layers 42 can include silicon nitride, and the materials of the insulating layers 32, the upright-stepped dielectric material portions 165, and the retro-stepped dielectric material portions 265 can include silicon oxide materials (such as undoped silicate glass or a doped silicate glass).

The etch process that removes the second material selective to the first material and the outermost layer of the memory films 50 can be a wet etch process employing a wet etch solution, or can be a gas phase (dry) etch process in which the etchant is introduced in a vapor phase into the line trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures (not illustrated), the upright-stepped dielectric material portions 165, the retro-stepped dielectric material portions 265, and the memory opening fill structures 58 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. In one embodiment, the memory array regions 100 may comprise an array of monolithic three-dimensional NAND strings having a plurality of device levels disposed on the semiconductor material layer 10. In this case, each lateral recess 43 can define a space for receiving a respective word line of the array of monolithic three-dimensional NAND strings.

Each of the plurality of lateral recesses 43 can extend substantially parallel to the top surface of the substrate 8. A lateral recess 43 can be vertically bounded by a top surface of an underlying insulating layer 32 and a bottom surface of an overlying insulating layer 32. In one embodiment, each lateral recess 43 can have a uniform height throughout. The lateral recesses 43 include first lateral recesses 43A that are formed within volumes from which the first sacrificial material layers 42A are removed, and second lateral recesses 43B that are formed within volumes from which the second sacrificial material layers 42B are removed.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 216. Semiconductor oxide liners (not shown) can be formed on physically exposed surfaces of the semiconductor material layer 10. In one embodiment, each tubular dielectric spacer 216 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 216 include a dielectric material that includes the same semiconductor element as the pedestal channel portions 11 and additionally includes at least one non-metallic element such as oxygen and/or nitrogen such that the material of the tubular dielectric spacers 216 is a dielectric material. In one embodiment, the tubular dielectric spacers 216 can include a dielectric oxide, a dielectric nitride, or a dielectric oxynitride of the semiconductor material of the pedestal channel portions 11.

Figure 16A:
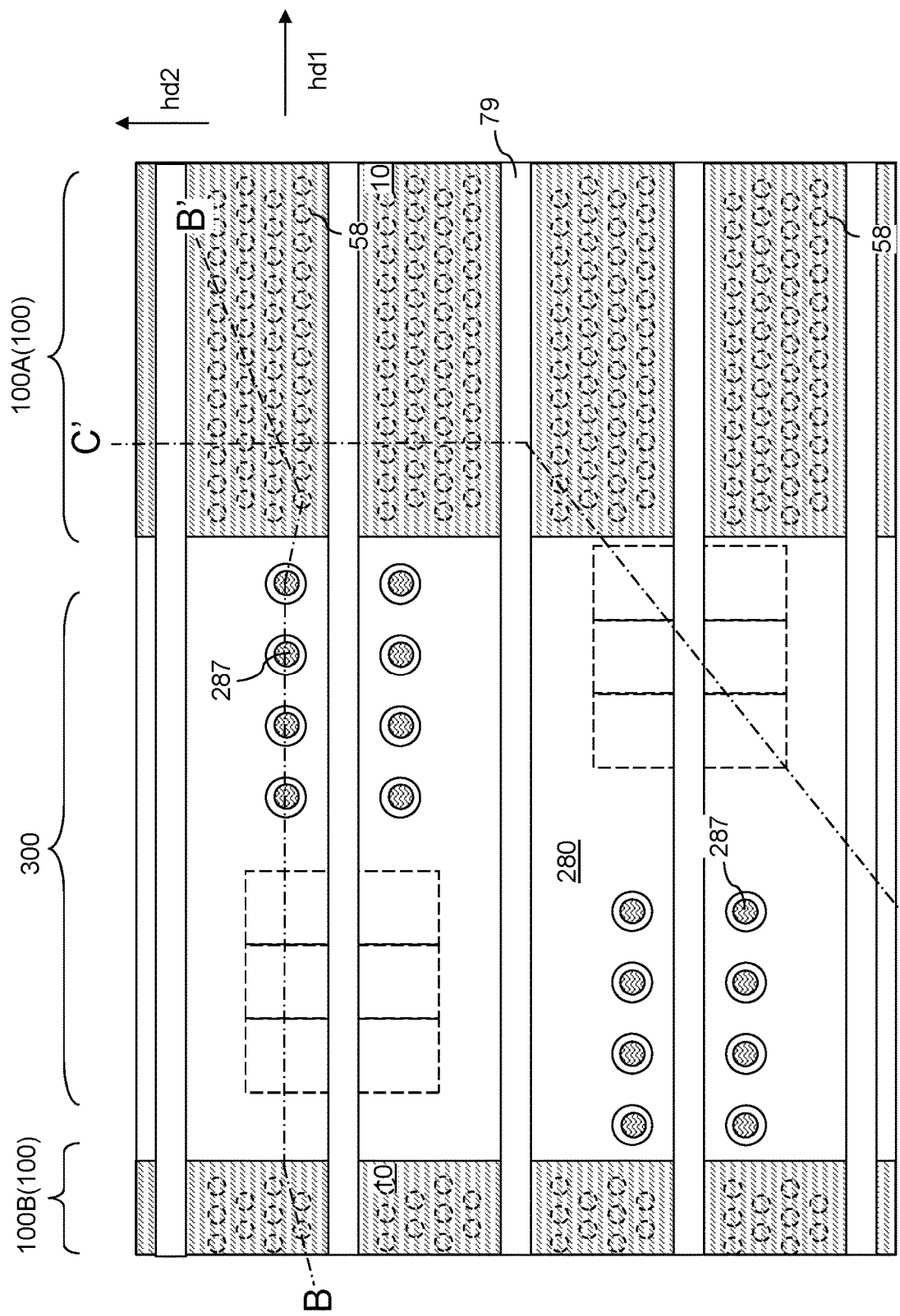
FIG. 16A is a top-down view of the exemplary structure after formation of electrically conductive layers according to an embodiment of the present disclosure.
Figure 16B:
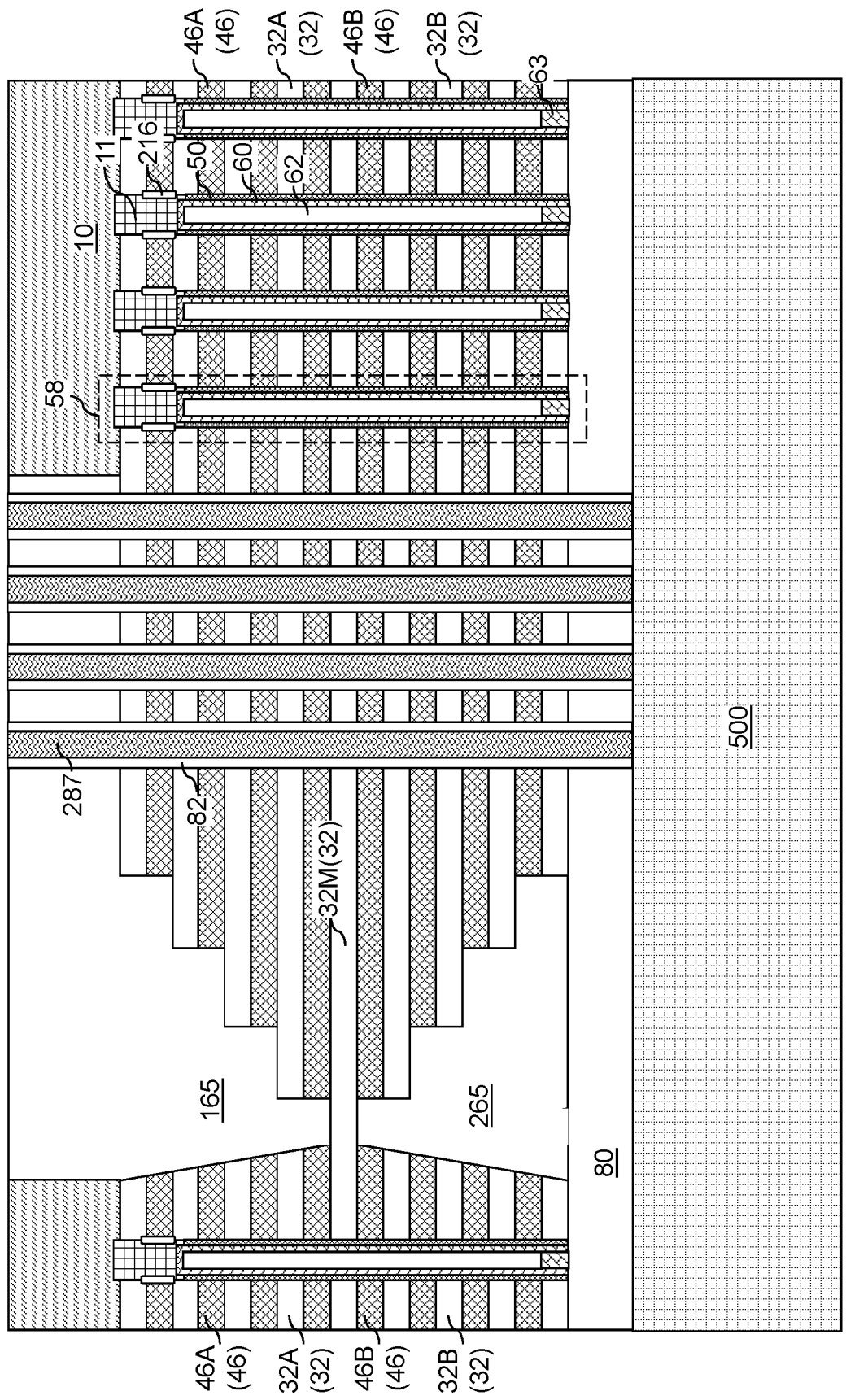
FIG. 16B is a vertical cross-sectional view of the exemplary structure along the hinged vertical plane B-B' of FIG. 16A.
Figure 16C:
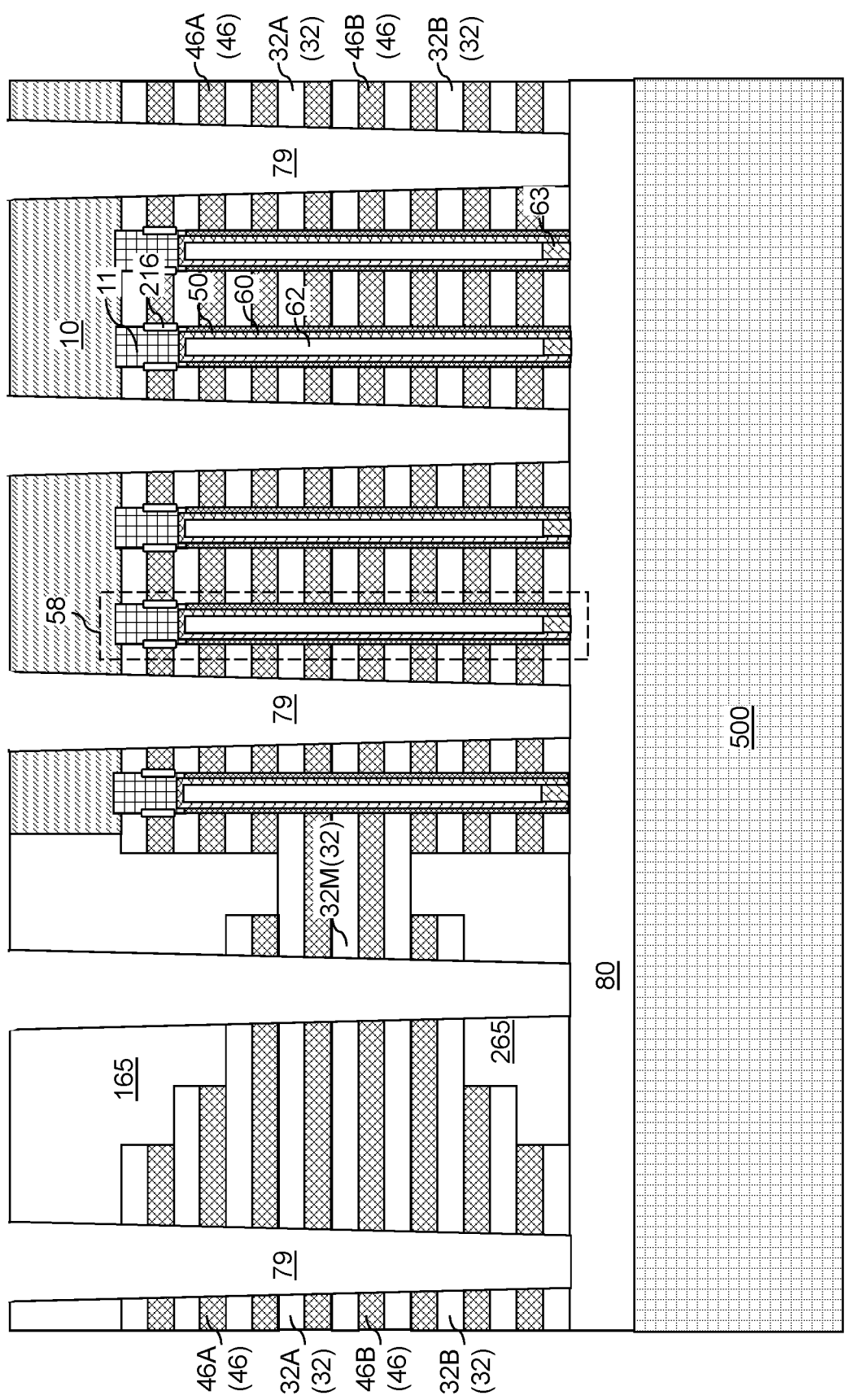
FIG. 16C is a vertical cross-sectional view of the exemplary structure along the hinged vertical plane C-C' of FIG. 16A.

Referring to FIGS. 16A-16C, a backside blocking dielectric layer can be optionally formed by a conformal deposition process. The backside blocking dielectric layer, if present, comprises a dielectric material that functions as a portion of a control gate dielectric for the control gates to be subsequently formed in the lateral recesses 43. In one embodiment, the backside blocking dielectric layer includes a dielectric metal oxide layer such as an aluminum oxide layer. The thickness of the backside blocking dielectric layer can be in a range from 1 nm to 15 nm, such as 2 to 6 nm, although lesser and greater thicknesses can also be employed.

A metallic barrier layer can be deposited in the lateral recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of lateral recesses 43, on the sidewalls of the at least one the line trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 can be formed in the plurality of lateral recesses 43, and a continuous metallic material layer can be formed on the sidewalls of each line trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the line trenches 79 or above the semiconductor material layers 10 or above the upright-stepped dielectric material portions 165.

The deposited metallic material of the continuous electrically conductive material layer is etched back from the sidewalls of each line trench 79, from above the semiconductor material layers 10, and from above the upright-stepped dielectric material portions 165, for example, by an isotropic wet etch, an anisotropic dry etch, or a combination thereof. Each remaining portion of the deposited metallic material in the lateral recesses 43 comprises an electrically conductive layer 46. Each electrically conductive layer 46 can be a conductive line structure. Thus, the sacrificial material layers 42 are replaced with the electrically conductive layers 46. The electrically conductive layers 46 include first electrically conductive layers 46A formed in the first backside recesses 43A and second electrically conductive layers 46B formed in the second backside recesses 43B.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Furthermore, one or more uppermost electrically conductive layers 46 may function as source side select gate electrodes and one or more lowermost electrically conductive layers 46 may function as drain side select gate electrodes.

Figure 17A:
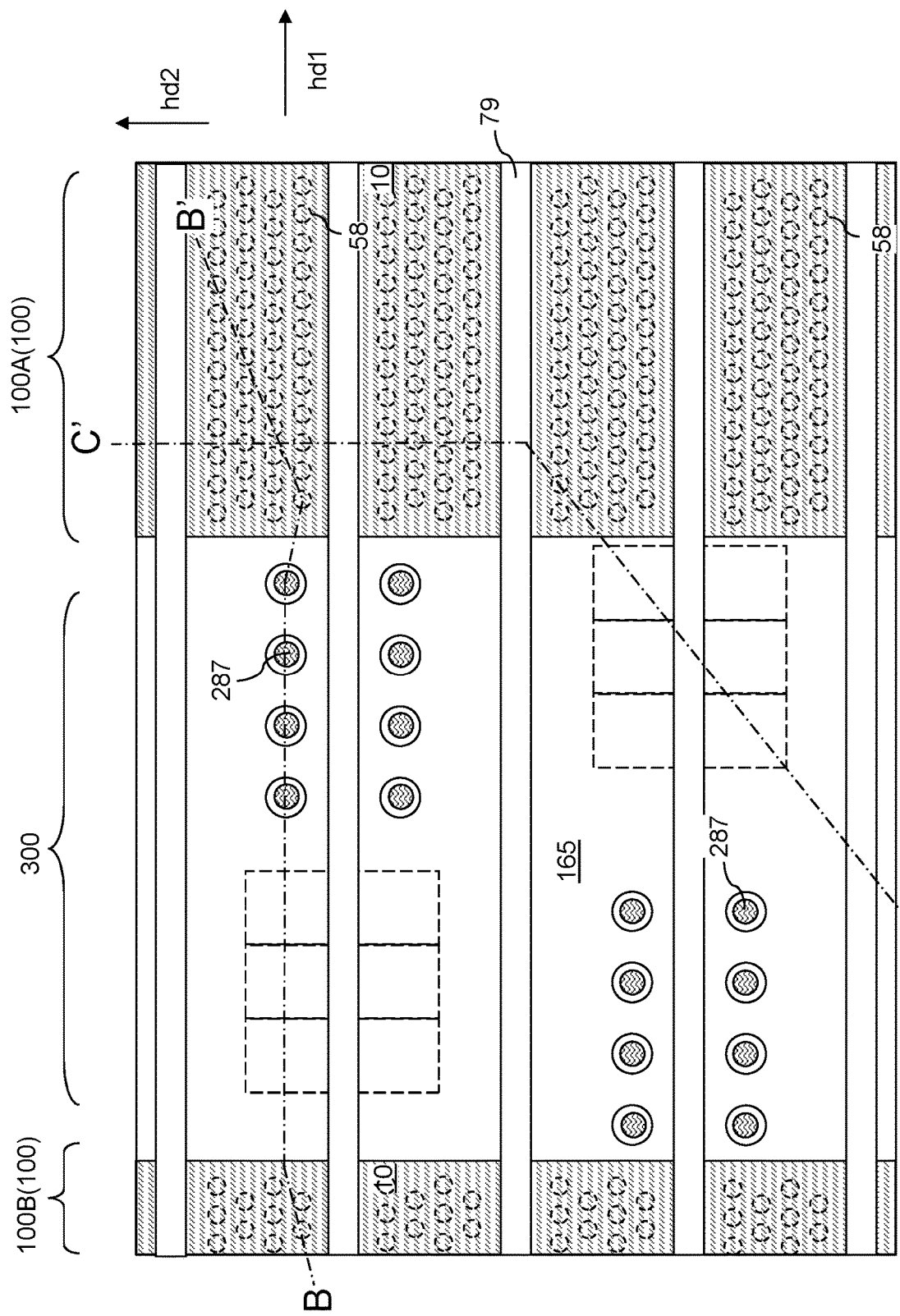
FIG. 17A is a top-down view of the exemplary structure after formation of dielectric line trench fill structures according to an embodiment of the present disclosure.
Figure 17B:
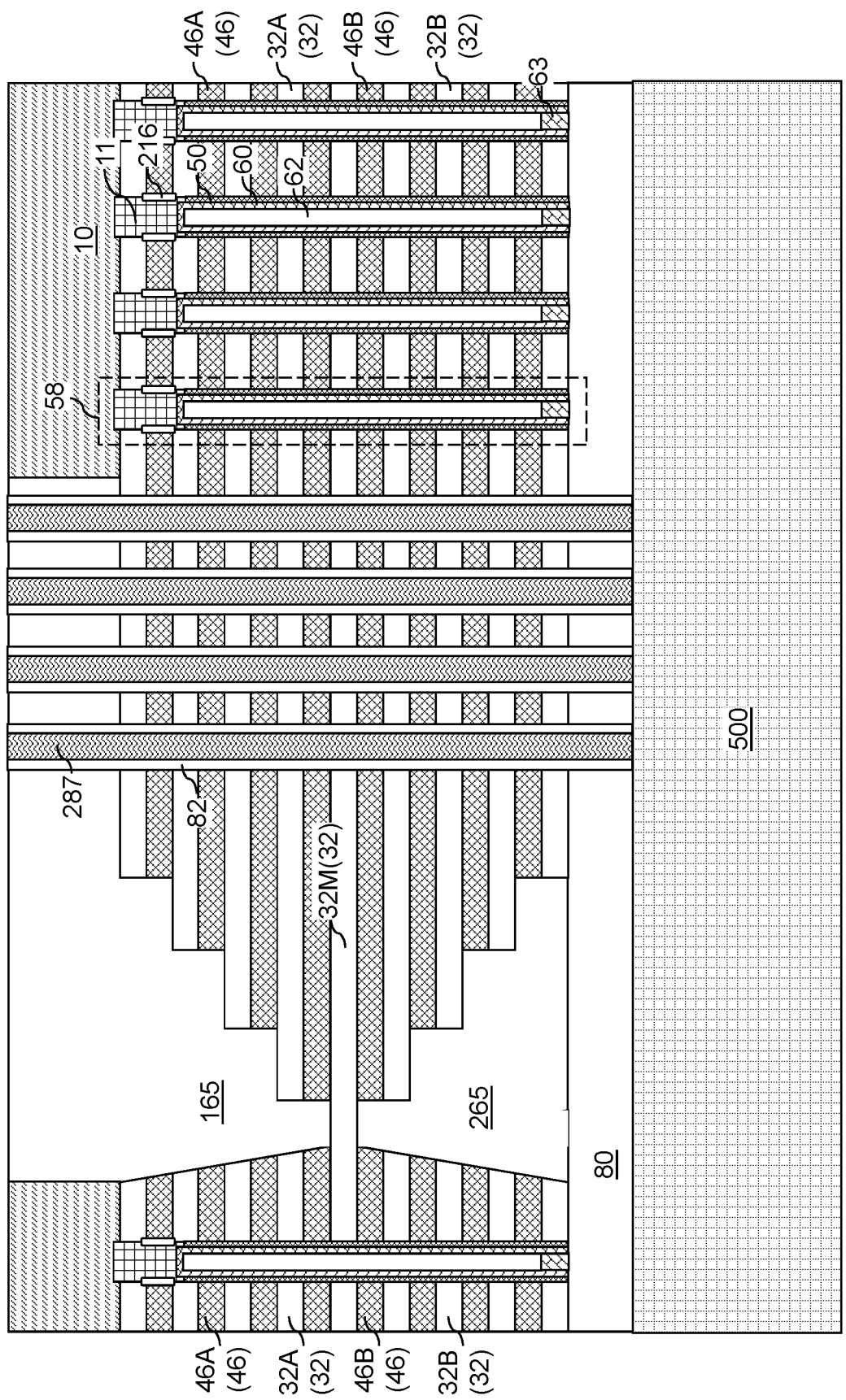
FIG. 17B is a vertical cross-sectional view of the exemplary structure along the hinged vertical plane B-B' of FIG. 17A.
Figure 17C:
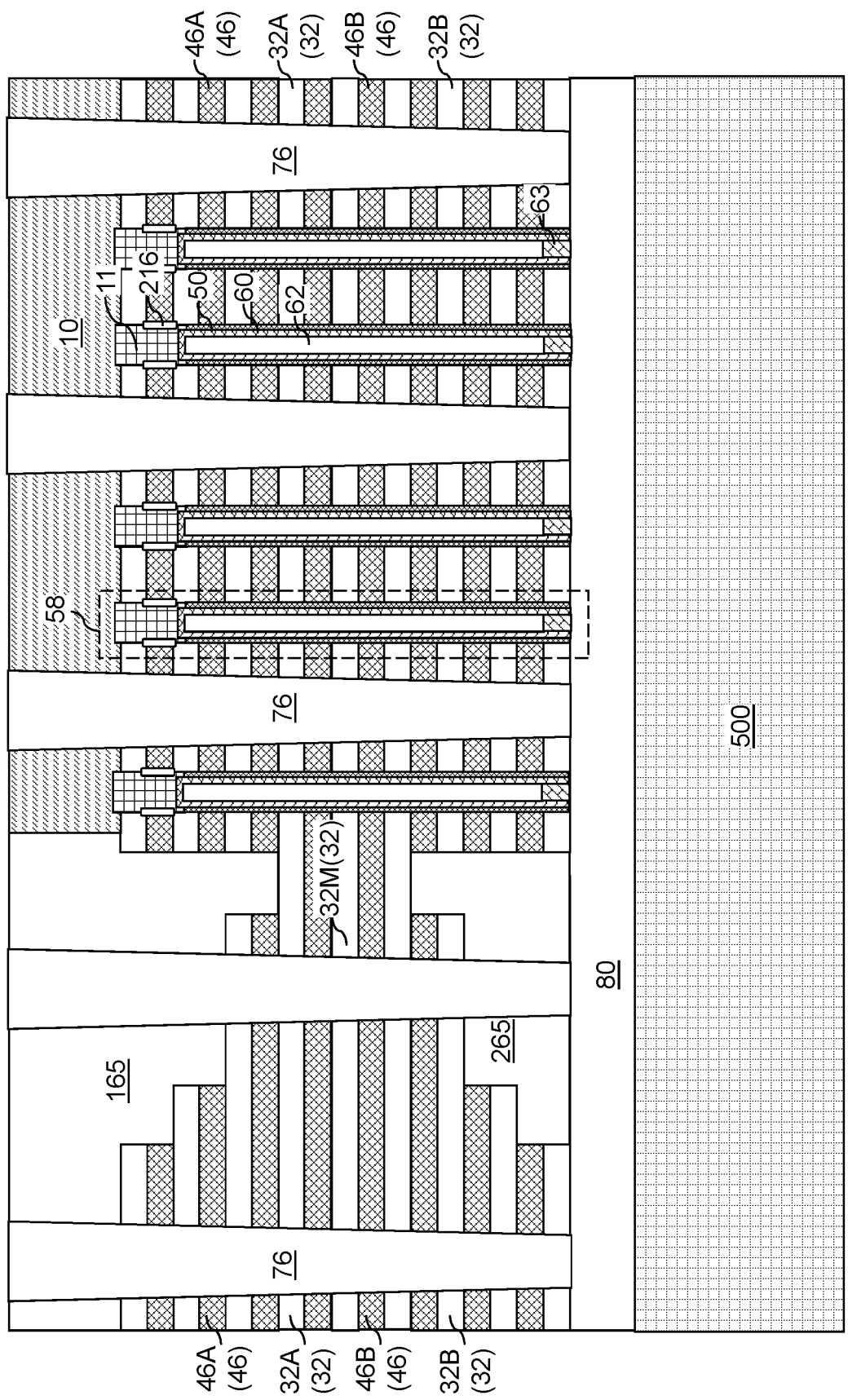
FIG. 17C is a vertical cross-sectional view of the exemplary structure along the hinged vertical plane C-C' of FIG. 17A.

Referring to FIGS. 17A-17C, a dielectric fill material such as undoped silicate glass or a doped silicate glass can be deposited in the line trenches 79 and over the semiconductor material layers 10 and the upright-stepped dielectric material portions 165. Excess portions of the dielectric fill material can be removed from above the horizontal plane including the backside surface of the semiconductor material layers 10. Each remaining portion of the dielectric fill material filling the line trenches 79 comprises a dielectric line trench fill structure 76. Top surfaces (i.e., substrate-side planar surfaces) of the dielectric line trench fill structures 76 may be located within the horizontal plane including the backside surfaces of the semiconductor material layers 10. The substrate-side planar surface of each dielectric line trench fill structure 76 may have a greater width than an interconnect-side planar surface of the dielectric line trench fill structure 76 that contacts the first carrier substrate 500. Alternatively, an electrically conductive source local interconnect surrounded by a dielectric spacer may be formed in each line trench 79 instead of the dielectric line trench fill structure 76.

Figure 18A:
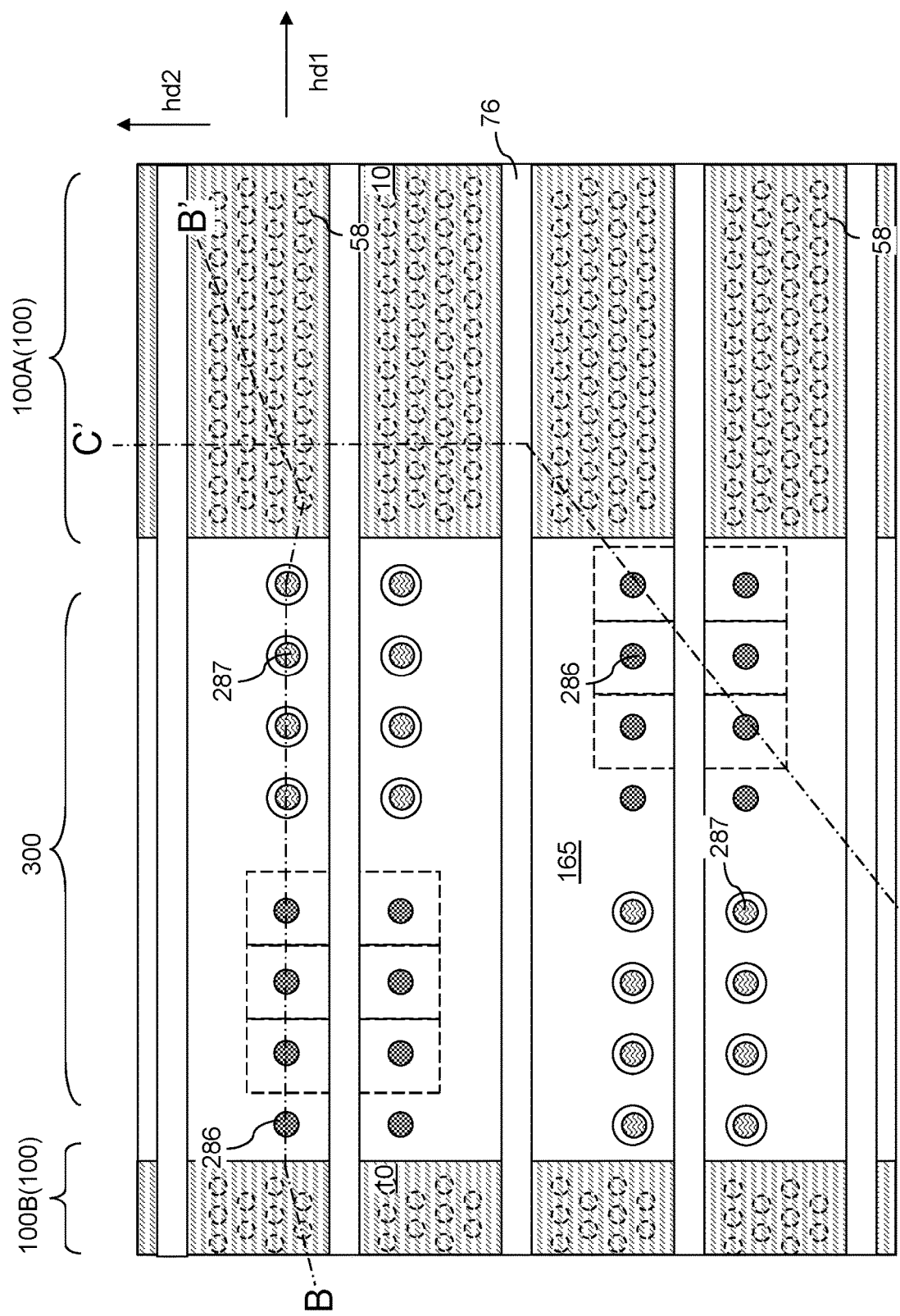
FIG. 18A is a top-down view of the exemplary structure after formation of substrate-side contact via structures according to an embodiment of the present disclosure.
Figure 18B:
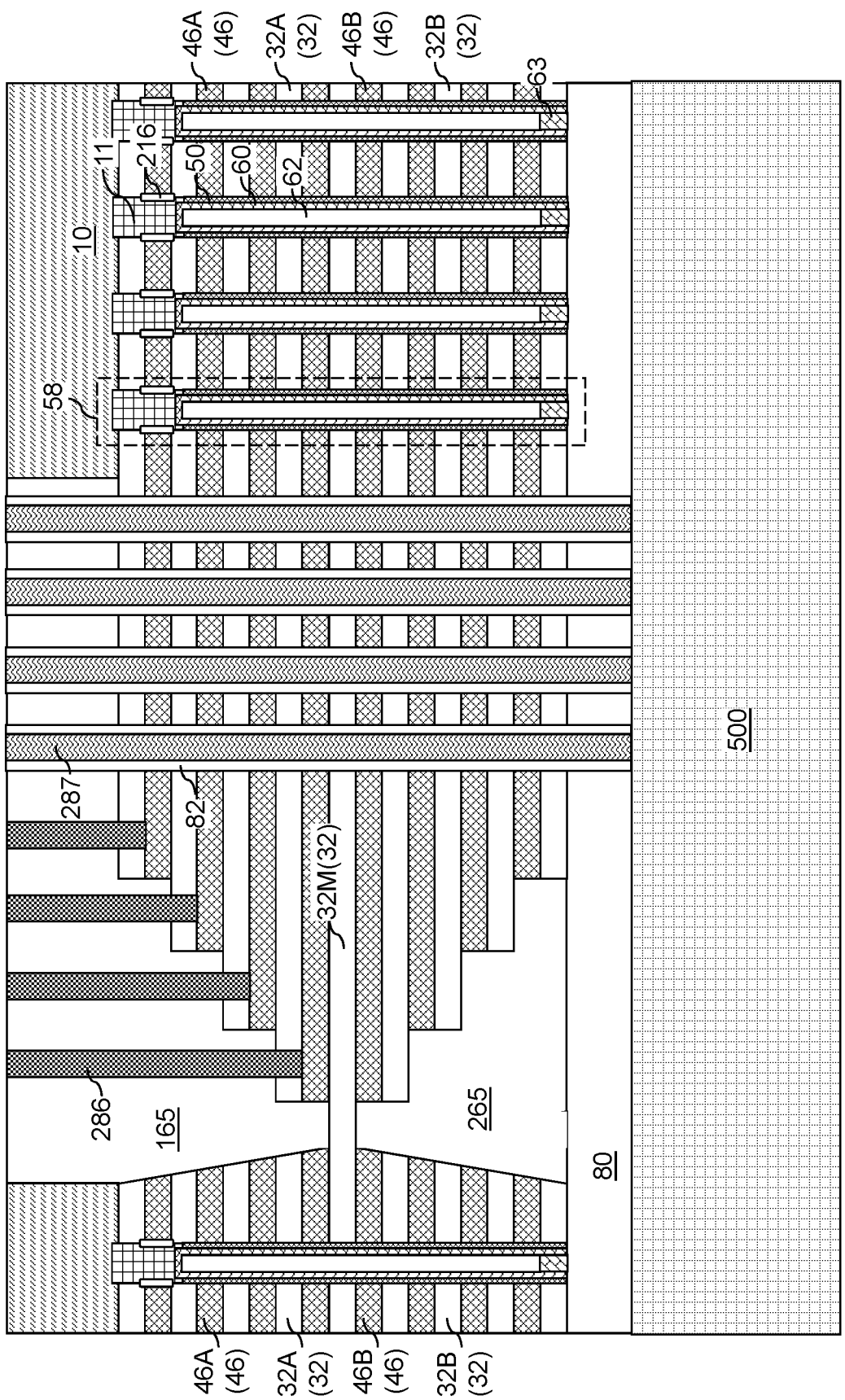
FIG. 18B is a vertical cross-sectional view of the exemplary structure along the hinged vertical plane B-B' of FIG. 18A.
Figure 18C:
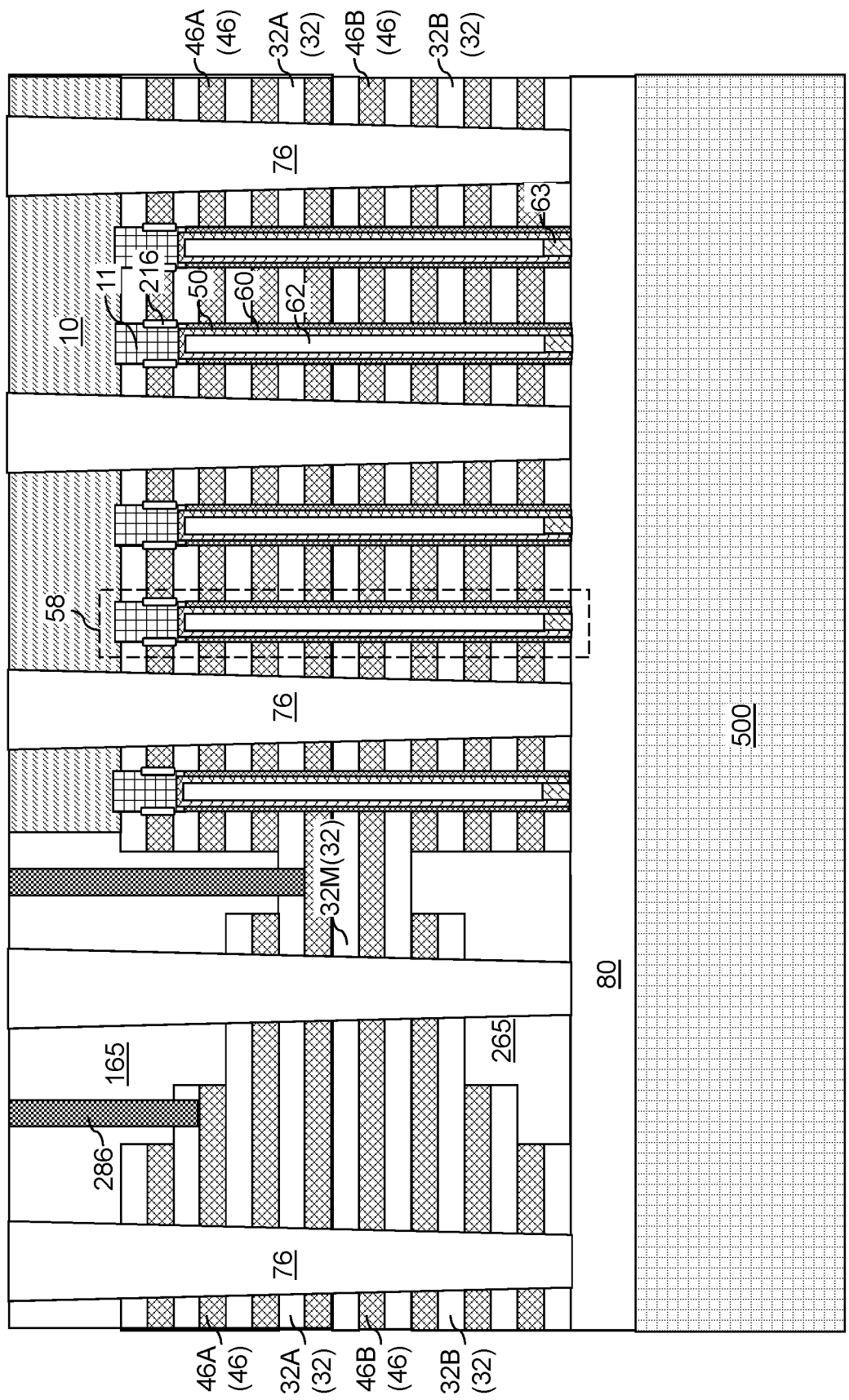
FIG. 18C is a vertical cross-sectional view of the exemplary structure along the hinged vertical plane C-C' of FIG. 18A.

Referring to FIGS. 18A-18C, a photoresist layer (not shown) can be applied over the backside surfaces of the semiconductor material layers 10 and the substrate-side planar surfaces of the upright-stepped dielectric material portions 165, and can be lithographically patterned to form arrays of openings in areas overlying the upright-stepped dielectric material portions 165. Specifically, each opening in the photoresist layer can be formed within the area of a horizontal surface within a set of proximal stepped surfaces of a respective first layer stack of first insulating layers 32A and first electrically conductive layers 46A. An anisotropic etch process can be performed to etch through unmasked portions of the upright-stepped dielectric material portions 165 and any first insulating layer 32A in contact with an upright-stepped dielectric material portion 165 to form contact via cavities, which are herein referred to as substrate-side contact via cavities. A horizontal surface of a respective first electrically conductive layer 46A can be physically exposed at the bottom of each substrate-side contact via cavity.

At least one conductive material such as a combination of a metallic nitride liner material (e.g., TiN, TaN, and/or WN) and a metallic fill material can be deposited in the substrate-side contact via cavities. Excess portions of the at least one conductive material can be removed from above the horizontal plane including the substrate-side planar surface of the upright-stepped dielectric material portions 165 by a planarization process. The planarization process may employ a recess etch process and/or a chemical mechanical planarization process. Each remaining portion of the at least one conductive material filling the substrate-side contact via cavities constitute a contact via structure, which is herein referred to as a substrate-side contact via structure 286.

Generally, substrate-side contact via structures 286 can be formed through the upright-stepped dielectric material portions 165 on a proximal surface of a respective one of the first electrically conductive layers 46A. In one embodiment, substrate-side end surfaces of the substrate-side contact via structures 286 can be located within the horizontal plane including the substrate-side planar surfaces of the upright-stepped dielectric material portions 165.

Figure 19A:
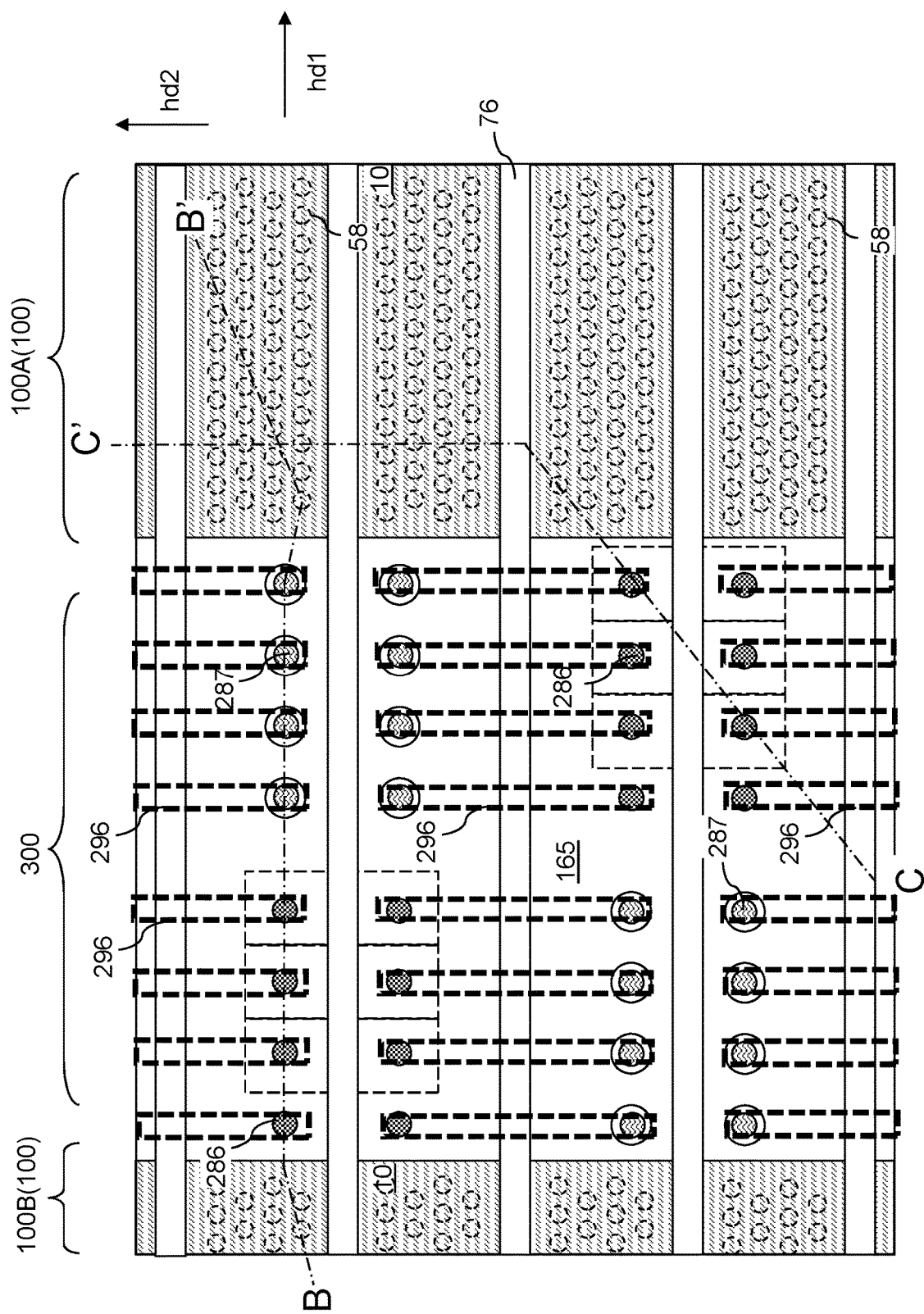
FIG. 19A is a partial see-through top-down view of the exemplary structure after formation of substrate-side metal interconnect structures along horizontal plane A-A' in FIG. 19B according to an embodiment of the present disclosure.
Figure 19B:
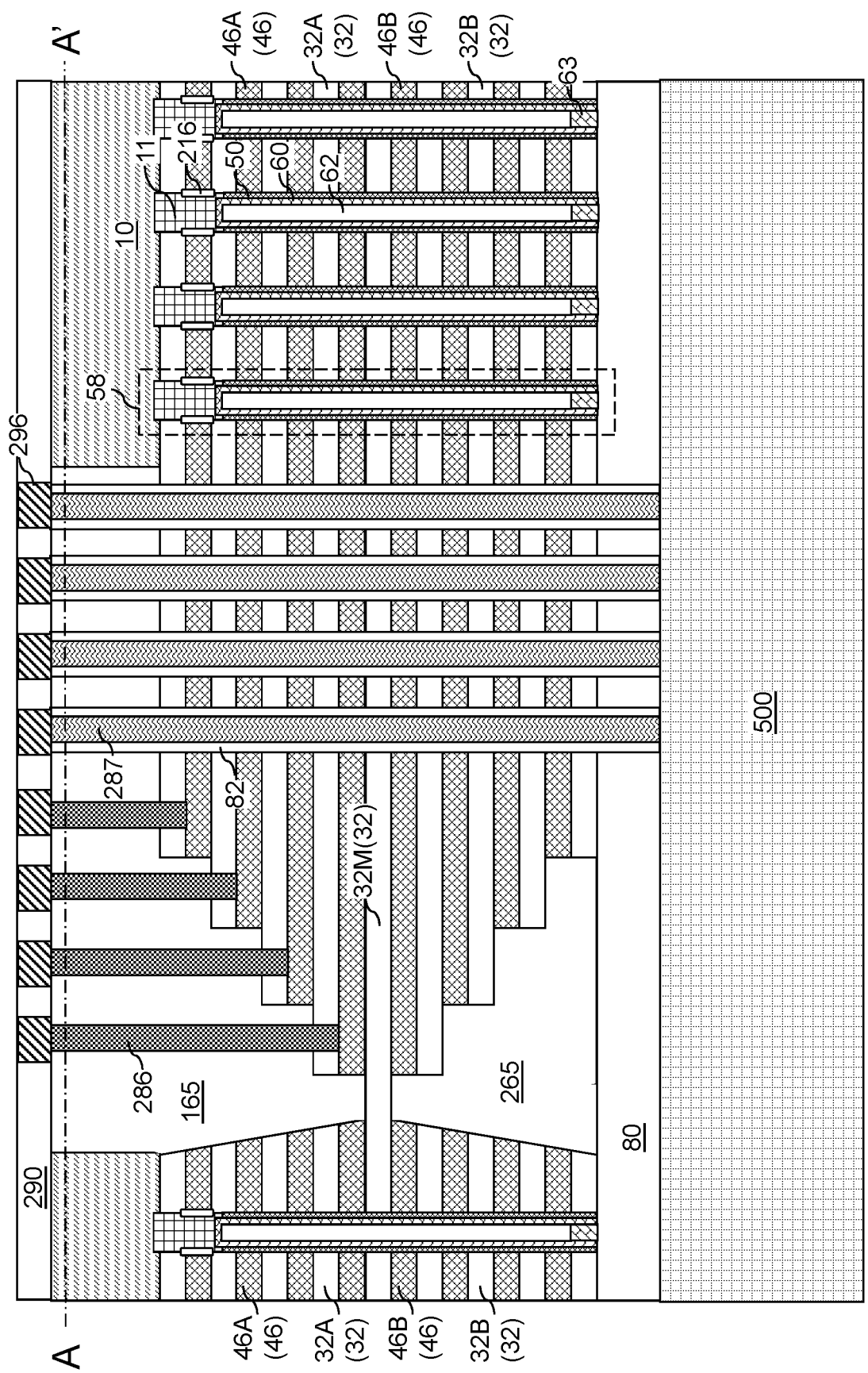
FIG. 19B is a vertical cross-sectional view of the exemplary structure along the hinged vertical plane B-B' of FIG. 19A.
Figure 19C:
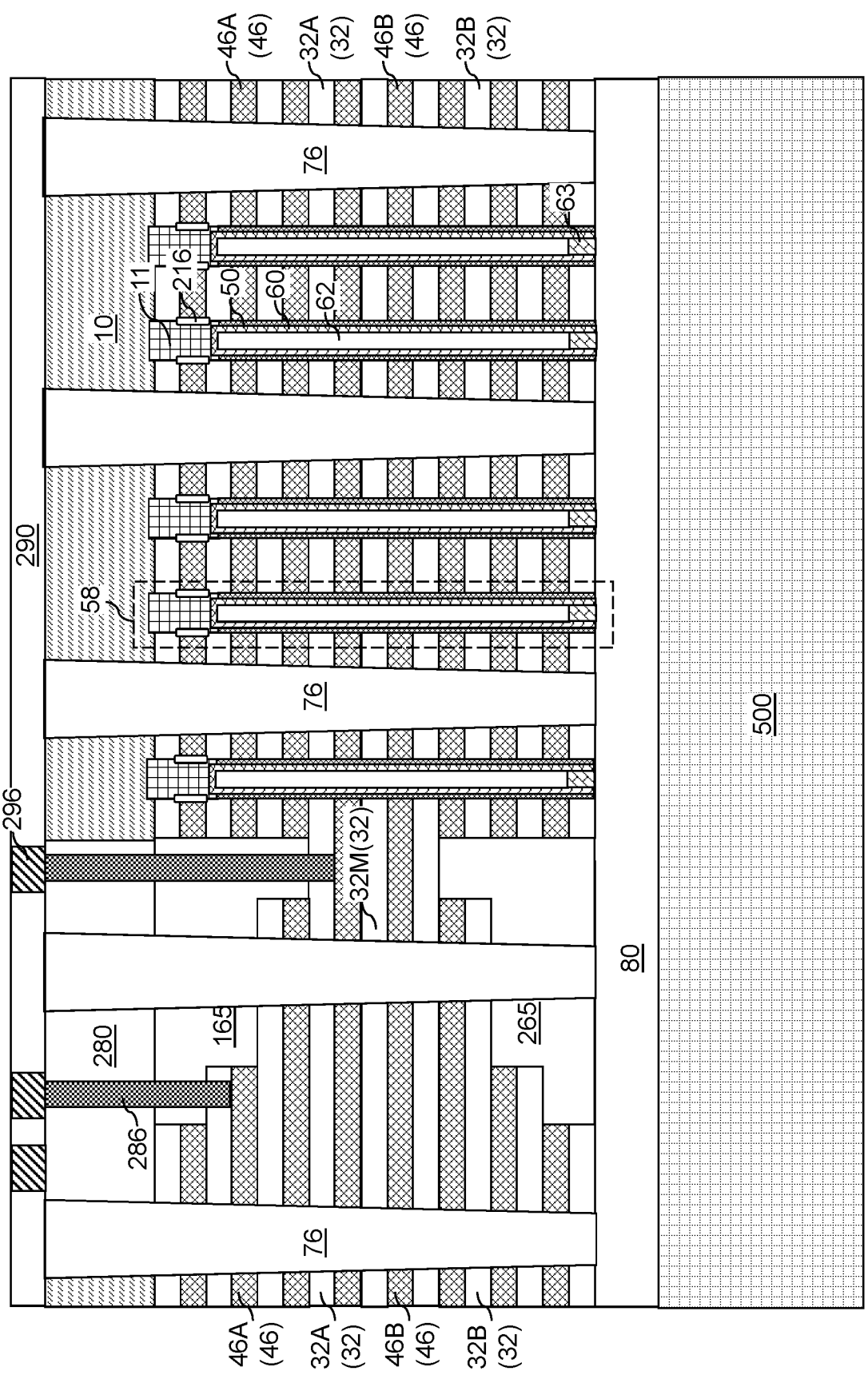
FIG. 19C is a vertical cross-sectional view of the exemplary structure along the hinged vertical plane C-C' of FIG. 19A.

Referring to FIGS. 19A-19C, a first backside insulating layer 290 can be deposited over the semiconductor material layers 10 and the upright-stepped dielectric material portions 165. The first backside insulating layer 290 includes a dielectric material such as undoped silicate glass or a doped silicate glass. Cavities (which may include line cavities) can be formed through the first backside insulating layer 290 by a combination of a lithographic patterning step and an anisotropic etch step. Metal interconnect structures such as metal lines can be formed within the cavities in the first backside insulating layer 290. The metal interconnect structures that are embedded within the first backside insulating layer 290 are herein referred to as substrate-side metal interconnect structures 296. Metal lines within the substrate-side metal interconnect structures 296 are herein referred to as source-side metal lines.

The pattern of the substrate-side metal interconnect structures 296 can be selected such that the substrate-side metal interconnect structures 296 provide laterally electrically conductive paths between each substrate-side end surface of a substrate-side contact via structure 286 and the substrate-side end surface of a respective one of the sacrificial via structures 287. While the present disclosure is described employing an embodiment in which the substrate-side metal interconnect structures 296 are formed as source-side metal lines contacting the substrate-side planar surfaces of the upright-stepped dielectric material portions 165, embodiments are expressly contemplated herein in which multiple backside insulating layers (not shown) are formed and the substrate-side metal interconnect structures 296 are formed as multi-level structures including metal lines and metal via structures embedded within the multiple backside insulating layers. Generally, a subset of the substrate-side metal interconnect structures 296 can provide an electrically conductive path between a substrate-side end surface of a substrate-side contact via structure 286 and a substrate-side end surface of a respective one of the sacrificial via structures 287. In one embodiment, each substrate-side metal interconnect structure 296 may electrically connect a respective substrate-side contact via structure 286 with its respective sacrificial via structure 287 located on an opposite side the respective line trench 79 from the respective substrate-side contact via structure 286. Thus, the substrate-side metal interconnect structures 296 may extend over a respective line trench 79 filled with a respective dielectric line trench fill structure 76.

Figure 20:
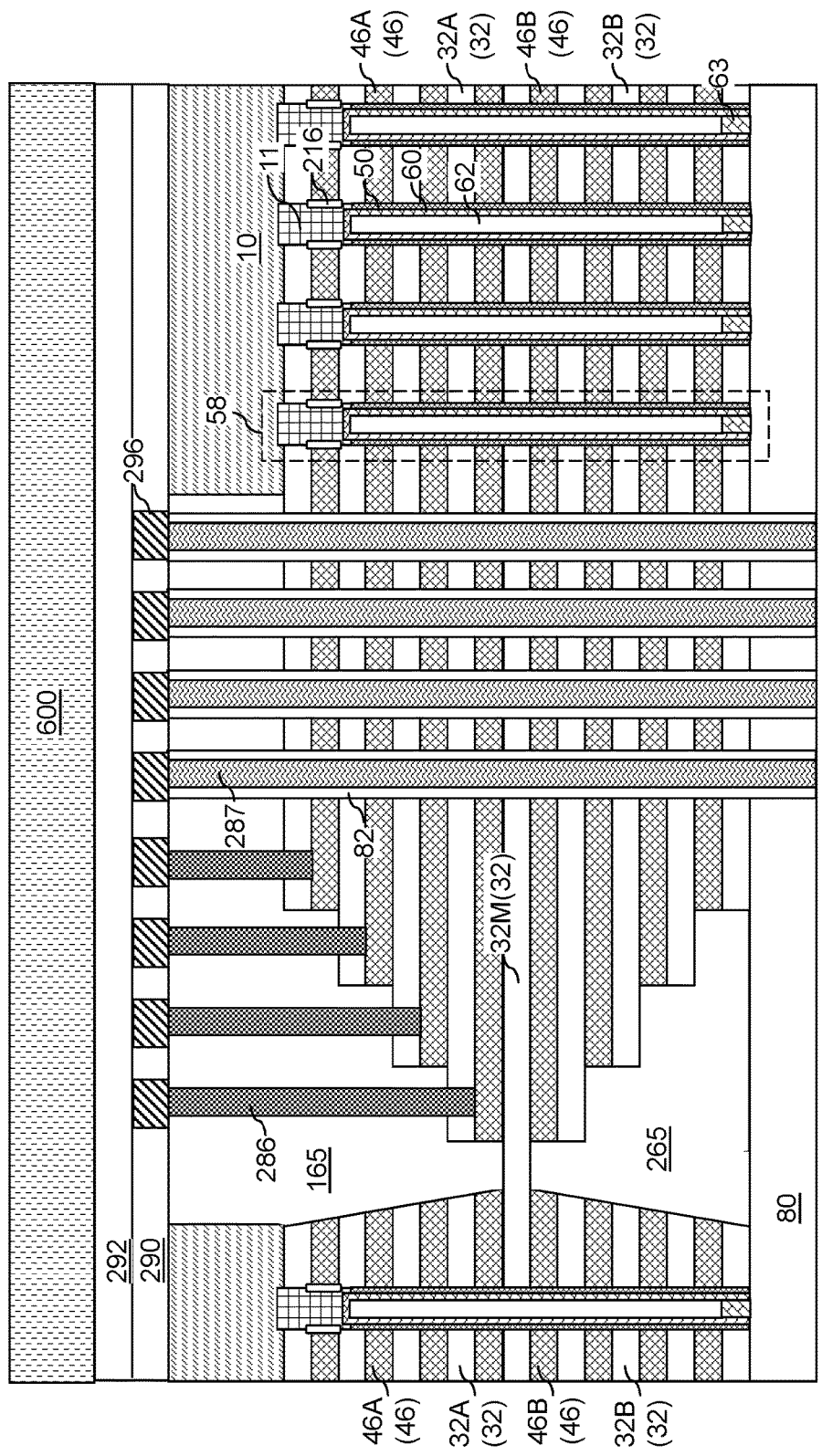
FIG. 20 is a vertical cross-sectional view of the exemplary structure after formation of a backside insulating layer, attachment of a second carrier substrate to the backside insulating layer, and detachment of the first carrier substrate according to an embodiment of the present disclosure.

Referring to FIG. 20, an additional backside insulating layer such as a second backside insulating layer 292 can be deposited on the first backside insulating layer 290. The set of all backside insulating layers is herein referred to as at least one backside insulating layer (290, 292), or as a backside insulating layer (290, 292) when viewed collectively. Subsequently, a second carrier substrate 600 can be attached to a physically exposed planar surface of the at least one backside insulating layer (290, 292). The second carrier substrate 600 can have a thickness in a range from 300 microns to 1 mm, and includes a material that can provide structural support to the alternating stack (32, 46) during subsequent processing steps. The second carrier substrate 600 may include a semiconductor (e.g., silicon) substrate, an insulating (e.g., glass or plastic) substrate, or a conductive substrate. In case the second carrier substrate 600 comprises a silicon substrate, the bonding between the at least one backside insulating layer (290, 292) and the second carrier substrate 600 may comprise, for example, silicon oxide-to-silicon bonding. In some embodiments, a temporary adhesive layer (not shown) may be employed to bond the at least one backside insulating layer (290, 292) and the second carrier substrate 600. In some embodiment, the second carrier substrate 600 may include a network of microchannels having a width in a range from 100 nm to 1,000 nm and a depth in a range from 100 nm to 1,000 nm and an inter-channel spacing in a range from 300 nm to 3,000 nm, and a sacrificial high etch rate silicon oxide material such as borosilicate glass may be deposited on a bonding surface of the second carrier substrate 600 to facilitate bonding with the at least one backside insulating layer (290, 292) and subsequent detachment of the second carrier substrate 600. The first carrier substrate 500 can be subsequently detached from the contact-level dielectric layer 80 by performing a suitable detachment process, which may include a mechanical separation, an isotropic etch process, a thermal anneal, and/or irradiation by suitable light (such as ultraviolet irradiation).

Figure 21:
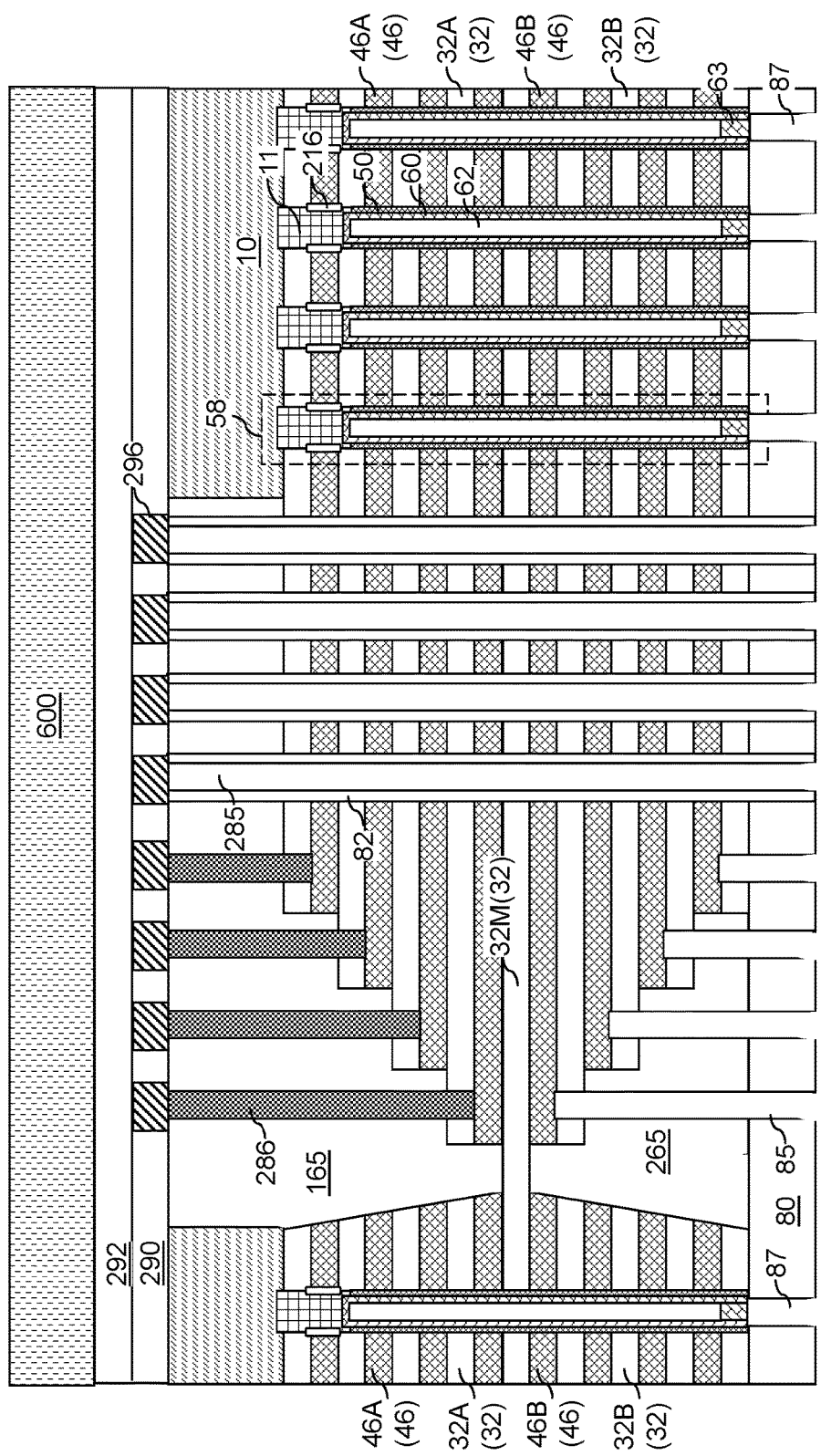
FIG. 21 is a vertical cross-sectional view Of the exemplary structure after formation of through-substrate via cavities and interconnect-side contact via cavities according to an embodiment of the present disclosure.

Referring to FIG. 21, the exemplary structure can be flipped such that the contact-level dielectric layer 80 faces upward, i.e., in an upside-down orientation. A selective etch process that etches the material of the sacrificial via structures (if present) 287 can be performed to remove the sacrificial via structures 287. The selective etch process etches the material of the sacrificial via structures 287 selective to the materials of the contact-level dielectric layer 80, the tubular dielectric spacers 82, and the substrate-side metal interconnect structures 296. For example, a wet etch process may be employed. Through-stack via cavities 285 can be formed in volumes from which the sacrificial via structures 287 are removed. Alternatively, this removal step may be omitted if an electrically conductive layer of the laterally-isolated through-stack connection via structure is formed in place of the sacrificial via structures 287 at an earlier step.

A photoresist layer (not shown) can be applied over the contact-level dielectric layer 80, and can be lithographically patterned to form arrays of openings in areas overlying the retro-stepped dielectric material portions 265. Specifically, each opening in the photoresist layer can be formed within the area of a horizontal surface within a set of distal stepped surfaces of a respective second layer stack of second insulating layers 32B and second electrically conductive layers 46B. An anisotropic etch process can be performed to etch through unmasked portions of the retro-stepped dielectric material portions 265 and any second insulating layer 32B in contact with an retro-stepped dielectric material portion 265 to form contact via cavities, which are herein referred to as interconnect-side contact via cavities. A horizontal surface of a respective second electrically conductive layer 46B can be physically exposed at the bottom of each interconnect-side contact via cavity 85.

Another photoresist layer (not shown) can be applied over the contact-level dielectric layer 80, and can be lithographically patterned to form openings in areas that overlie the drain regions 63. An anisotropic etch process can be performed to form drain contact via cavities 87 over each drain region 63 of the memory opening fill structures 58. Alternatively, two or more, or all of the cavities (285, 85, 87) can be formed during the same patterning and etching steps.

Figure 22:
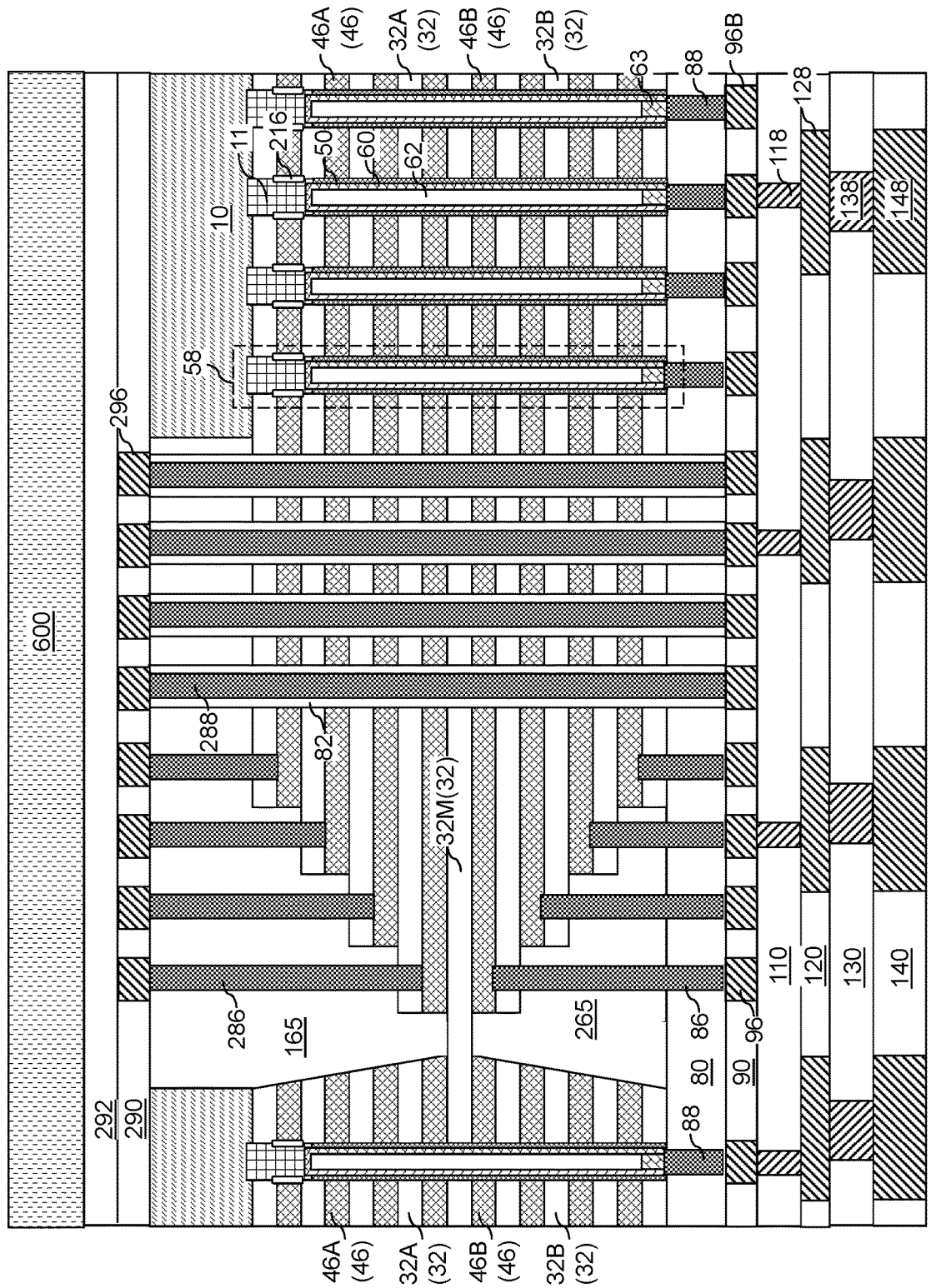
FIG. 22 is a vertical cross-sectional view of the exemplary structure after formation of interconnect-level dielectric layers embedding memory-side metal interconnect structures and memory-side metal bonding pads according to an embodiment of the present disclosure.

Referring to FIG. 22, at least one conductive material such as a combination of a metallic nitride liner material (e.g., TiN, TaN, and/or WN) and a metallic fill material can be deposited in the through-stack via cavities (if present) 285, the interconnect-side contact via cavities 285, and the drain contact via cavities 87. Excess portions of the at least one conductive material can be removed from above the horizontal plane including the distal planar surface of the contact-level dielectric layer 80 by a planarization process. The planarization process may employ a recess etch process and/or a chemical mechanical planarization process. Each remaining portion of the at least one conductive material filling the interconnect-side contact via cavities 85 constitute a contact via structure, which is herein referred to as an interconnect-side contact via structure 86. Each remaining portion of the at least one conductive material filling the through-stack via cavities 285 constitute a contact via structure, which is herein referred to as a connection via structure 288. Each contiguous combination of a connection via structure 288 and a tubular dielectric spacer 82 constitutes a laterally-isolated through-stack connection via structure (288, 82). Each remaining portion of the at least one conductive material filling the drain contact via cavities 87 constitute a contact via structure, which is herein referred to as a drain contact via structure 88.

Generally, interconnect-side contact via structures 86 can be formed through the retro-stepped dielectric material portions 265 on a distal surface of a respective one of the second electrically conductive layers 46B. In one embodiment, interconnect-side end surfaces (i.e., distal surfaces) of the interconnect-side contact via structures 86 can be located within the horizontal plane including the distal surface of the contact-level dielectric layer 80.

Each laterally-isolated through-stack connection via structure (288, 82) vertically extending through each layer within an alternating stack (32, 46), an upright-stepped dielectric material portion 165, and the contact-level dielectric layer 80. A substrate-side end surface of a connection via structure 288 can contact a substrate-side metal interconnect structure 296, which electrically connects a respective pair of a substrate-side contact via structure 286 (and thus a first electrically connective layer 46A) and the connection via structure 288. The source-side end surfaces of the laterally-isolated through-stack connection via structures (288, 82) can be located within the horizontal plane including the substrate-side end surfaces of the substrate-side contact via structures 286. The interconnect-side end surfaces of the laterally-isolated through-stack connection via structures (288, 82) can be located within the horizontal plane including the interconnect-side end surfaces of the interconnect-side contact via structures 86.

A first-line-level dielectric layer 90 can be formed on the contact-level dielectric layer 80, and first-line-level metal lines 96 can be formed in the first-line-level dielectric layer 90. The first-line-level metal lines 96 can include bit lines 96B that contact a respective set of drain contact via structures 88, first word-line-connection metal lines contacting the interconnect-side contact via structures 86, second word-line-connection metal lines contacting the connection via structures 288, and additional metal lines.

A first-via-level dielectric layer 110 can be deposited over the first-line-level dielectric layer 90, and first-via-level metal via structures 118 can be formed therein. A second-line-level dielectric layer 120 can be deposited over the first-via-level dielectric layer 110, and second-line-level metal lines 128 can be formed therein. A second-via-level dielectric layer 130 can be deposited over the second-line-level dielectric layer 120, and second-via-level metal via structures 138 can be formed therein. A pad-level dielectric layer 140 can be formed over the second-via-level dielectric layer 130, and memory-side metal bonding pads 148 can be formed therein. The first-line-level dielectric layer 90, the first-via-level dielectric layer 110, the second-line-level dielectric layer 120, the second via-level dielectric layer 130, and the pad-level dielectric layer 140 are herein collectively referred to as interconnect-level dielectric layers (90, 110, 120, 130, 140). The first-line-level metal lines 96, the first-via-level metal via structures 118, the second-line-level metal lines 128, and the second-via-level metal via structures 138 are herein collectively referred to as memory-side metal interconnect structures (96, 118, 128, 138). While the present disclosure is described employing an embodiment in which the as interconnect-level dielectric layers (90, 110, 120, 130, 140) embed two levels of metal line structures and two levels of metal via structures, embodiments are expressly contemplated herein in which lesser or greater numbers of metal line levels and metal via levels are employed.

Generally, the memory-side metal interconnect structures (96, 118, 128, 138) are electrically connected to drain regions located within the memory opening fill structures 58 and to the electrically conductive layers 46. A substrate including a semiconductor material layer 10 is located on a proximal side of the alternating stack of insulating layers 32 and electrically conductive layers 46. The interconnect-level dielectric layers (90, 110, 120, 130, 140) embed the memory-side metal interconnect structures (96, 118, 128, 138), and are located on an opposite side of the substrate with respect to the alternating stack (32, 46). The memory-side metal bonding pads 148 are embedded in the interconnect-level dielectric layers 140, and are electrically connected to the memory-side metal interconnect structures (96, 118, 128, 138). An assembly of a memory die 900 and a second carrier substrate 600 is provided.

Figure 23:
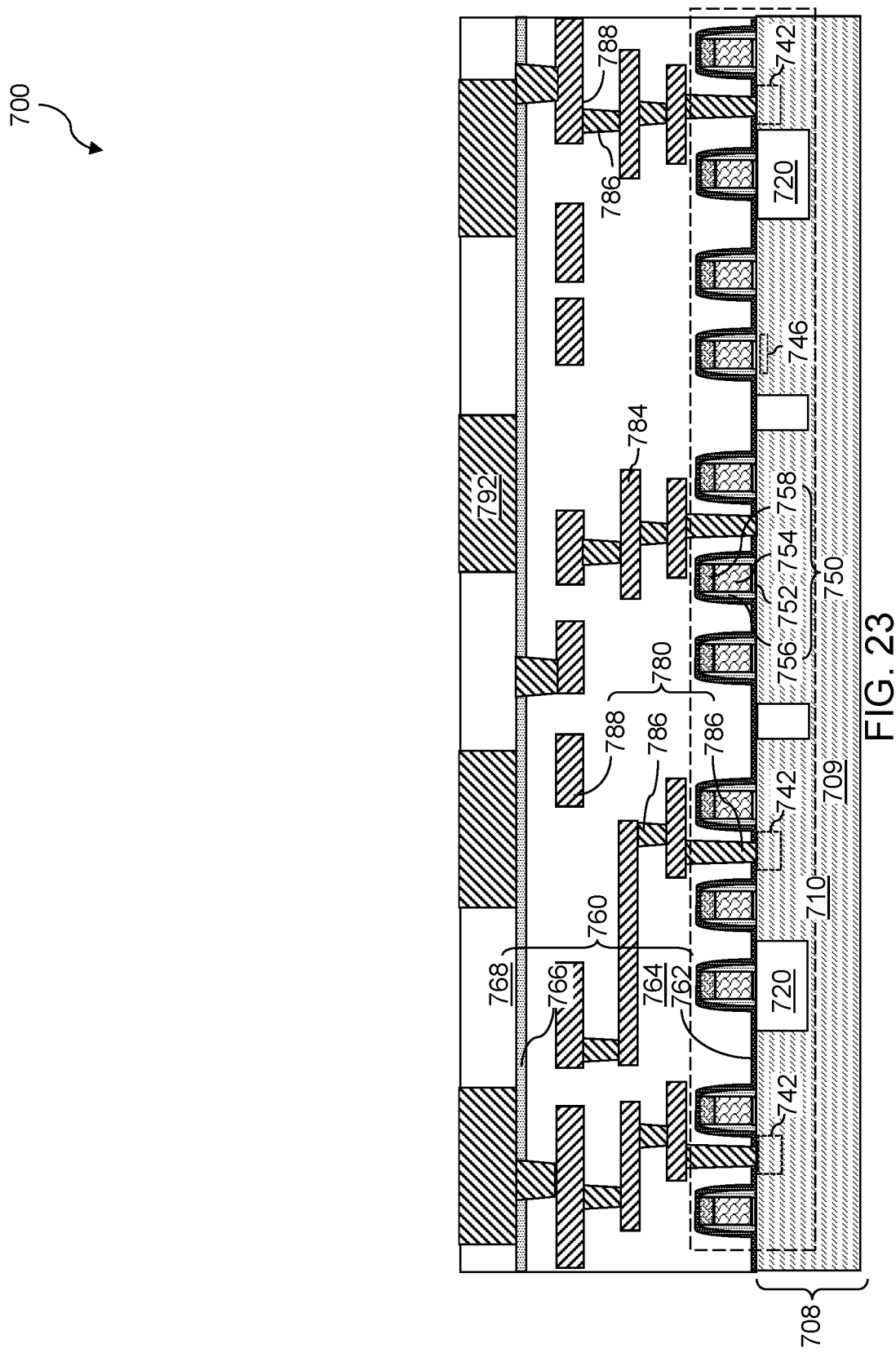
FIG. 23 is a vertical cross-sectional view of a logic die including a logic circuit and logic-side dielectric material layers embedding logic-side metal interconnect structures and logic-side metal bonding pads according to an embodiment of the present disclosure.

Referring to FIG. 23, a logic die 700 according to an embodiment of the present disclosure is illustrated. The logic die 700 can include a logic-die substrate 708 and semiconductor devices 710 formed thereupon. The logic-die substrate 708 includes a logic-die substrate semiconductor layer 709 at least at an upper portion thereof. Shallow trench isolation structures 720 may be formed in an upper portion of the logic-die substrate semiconductor layer 709 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Generally, the semiconductor device 710 can include a logic circuit configured to control operation of memory elements within the memory stack structures 55 in the memory die 900. Each gate structure 750 may include, for example, a gate dielectric 752, a gate electrode 754, a dielectric gate spacer 756 and a gate cap dielectric 758.

Dielectric material layers are formed over the semiconductor devices, which are herein referred to as logic-side dielectric material layers 760. The logic-side dielectric material layers 760 may include, for example, a dielectric liner 762 (such as a silicon nitride liner that blocks diffusion of mobile ions and/or apply appropriate stress to underlying structures), logic-side interconnect dielectric layers 764 that overlie the dielectric liner 762, a silicon nitride layer (e.g., hydrogen diffusion barrier) 766 that overlies the logic-side interconnect dielectric layers 764, and a logic-side bonding-pad-level dielectric layer 768.

The logic-side dielectric material layers 760 function as a matrix for logic-side metal interconnect structures 780 that provide electrical connection between the semiconductor devices 710 and logic-side metal bonding pads 792. The logic-side metal bonding pads 792 are embedded within the logic-side bonding-pad-level dielectric layer 768. Each dielectric material layer within the logic-side interconnect dielectric layers 764 may include any of doped silicate glass, undoped silicate glass, organosilicate glass, silicon nitride, silicon oxynitride, and dielectric metal oxides (such as aluminum oxide). In one embodiment, the logic-side interconnect dielectric layers 764 may comprise, or consist essentially of, dielectric material layers having dielectric constants that do not exceed the dielectric constant of undoped silicate glass (silicon oxide) of 3.9. The logic-side metal interconnect structures 780 are formed within the dielectric layer stack of the logic-side dielectric material layers 760. The logic-side metal interconnect structures 780 may include various metal via structures 786 and various metal line structures 788.

Generally, the logic die 700 includes a support (i.e., driver/peripheral) circuitry configured to control operation of the three-dimensional memory device within the memory die 900. The logic-side metal bonding pads 792 can have a mirror image pattern of a pattern of the memory-side metal bonding pads 148.

Figure 24:
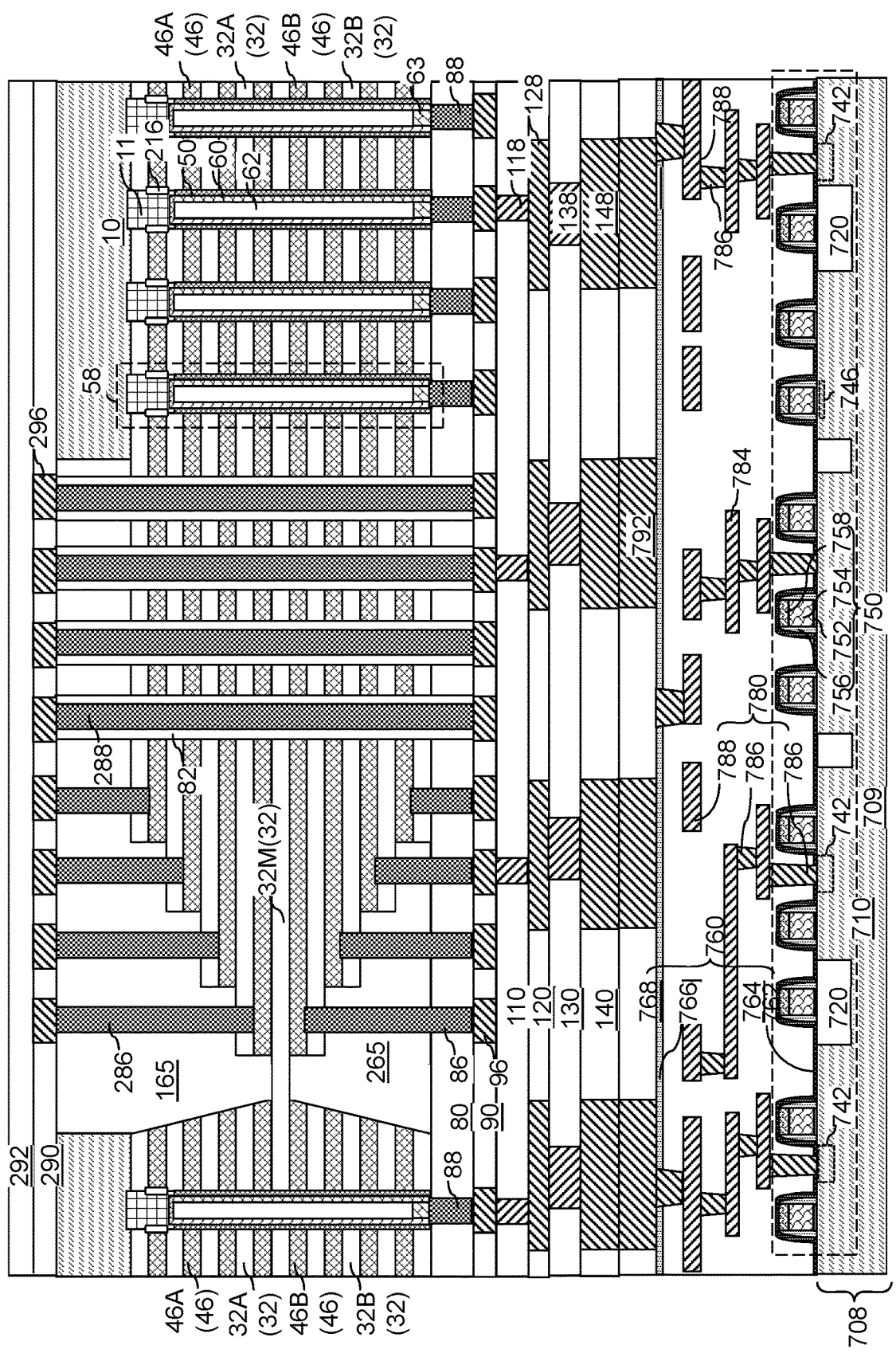
FIG. 24 is a vertical cross-sectional view of a bonded assembly of the logic die and the memory die of FIG. 22 after detaching the second carrier substrate according to an embodiment of the present disclosure.
Figure 25:
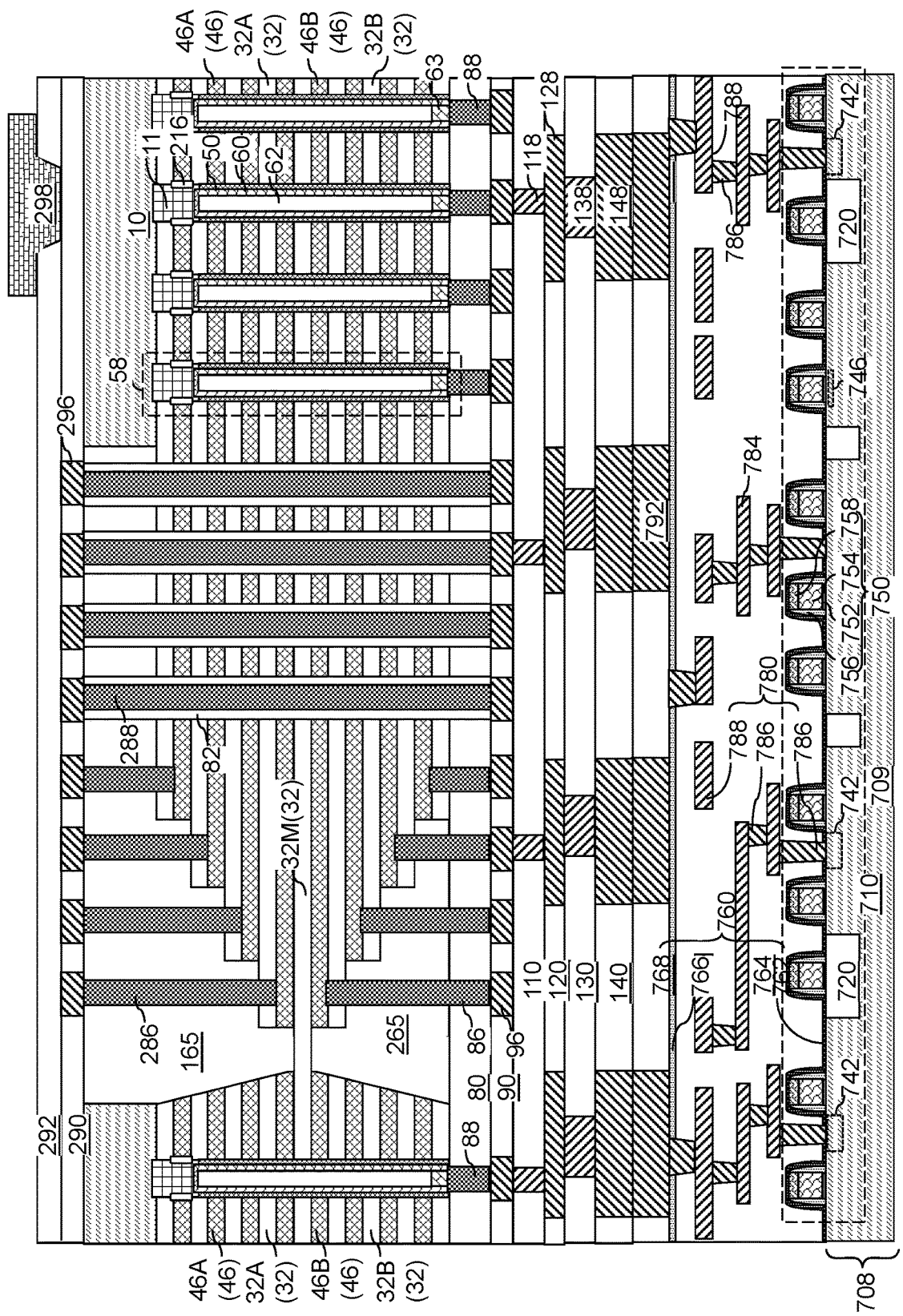
FIG. 25 is a vertical cross-sectional view of the bonded assembly after formation of backside external bonding pads according to an embodiment of the present disclosure.

Referring to FIG. 24, the logic die 700 can be bonded to the memory die 900. For example, the logic-side metal bonding pads 792 can be bonded to a respective one of the memory-side metal bonding pads 148 through metal-to-metal bonding. In case the logic-side bonding-pad-level dielectric layer 768 and the pad-level dielectric layer 140 include silicon oxide, oxide-to-oxide bonding may be used in addition to, or in lieu of, metal-to-metal bonding. The second carrier substrate 600 can be detached from the assembly of the memory die 900 and the logic die 700.

Generally, the logic-side metal bonding pads 792 can be bonded to a respective one of the memory-side metal bonding pads 148. The logic die 700 includes a support circuitry configured to control operation of the three-dimensional memory device within the memory die 900. The support circuitry may comprise bit line drivers, word line drivers, sense amplifiers, bit line address decoders, word line address decoders, input/output control circuits, and various other circuits that can be employed to control operation of the three-dimensional memory arrays in the memory die 900.

Referring to FIG. 24, backside contact structures can be optionally formed through the backside insulating layer (290, 292). The backside contact structures may include, for example, source contact metal pads 298 that are formed through the backside insulating layer (290, 292) in electrical contact with source electrode(s) and/or local interconnects (not shown for clarity). In one embodiment, the source contact metal pads 298 may be formed as bonding pads, which may be employed for C4 bonding or for wire bonding.

Referring to all drawings and according to various embodiments of the present disclosure, a semiconductor structure comprising a memory die 900 is provided. The memory die 900 comprises: an alternating stack of insulating layers 32 and electrically conductive layers 46 located over a substrate (e.g., remaining portion of the substrate 8 including a semiconductor material layer 10); and memory stack structures 55 vertically extending through the alternating stack (32, 46), wherein: the alternating stack (32, 46) comprises a first layer stack including first insulating layers 32A and first electrically conductive layers 46A and a second layer stack including second insulating layers 32B and second electrically conductive layers 46B and vertically spaced from the substrate by the first alternating stack; the first layer stack (32A, 46A) comprises a first staircase region in which the first electrically conductive layers 46A have respective lateral extents that increase with a vertical distance from the substrate to provide first stepped surfaces; and the second layer stack (32B, 46B) comprises a second staircase region in which the second electrically conductive layers 46B have respective lateral extents that decrease with the vertical distance from the substrate to provide second stepped surfaces.

In one embodiment, the memory die 900 further comprises: an upright-stepped dielectric material portion 165 contacting the first stepped surfaces and having a first variable horizontal-cross-sectional area that decreases with the vertical distance from the substrate (such as the semiconductor material layer 10); and a retro-stepped dielectric material portion 265 contacting the second stepped surfaces having a second variable horizontal-cross-sectional area that increases with the vertical distance from the substrate.

In one embodiment, the memory die 900 further comprises: substrate-side contact via structures 286 vertically extending through the upright-stepped dielectric material portion 165 and contacting a proximal surface of a respective one of the first electrically conductive layers 46A; and interconnect-side contact via structures 86 vertically extending through the retro-stepped dielectric material portion 265 and contacting a distal surface of a respective one of the second electrically conductive layers 46B.

In one embodiment, the substrate comprises a semiconductor material layer 10 having a front surface in contact with a proximal planar surface of the alternating stack (32, 46) and a backside surface located on an opposite side of the front surface; and the memory die 900 comprises a contact-level dielectric layer 80 located on a distal planar surface of the alternating stack (32, 46).

In one embodiment, substrate-side end surfaces of the substrate-side contact via structures 286 are located within a horizontal plane including a planar surface of the upright-stepped dielectric material portion 165. In one embodiment, a backside surface of the semiconductor material layer 10 is located within the horizontal plane including the planar surface of the upright-stepped dielectric material portion 165; and a sidewall of the upright-stepped dielectric material portion 165 contacts the semiconductor material layer 10. In one embodiment, interconnect-side end surfaces of the interconnect-side contact via structures 86 are located within a horizontal plane including a distal surface of the contact-level dielectric layer 80.

In one embodiment, the memory die 900 further comprises: laterally-isolated through-stack connection via structures (82, 288) comprising a respective combination of a connection via structure 288 and a tubular dielectric spacer 82 and vertically extending through each layer within the alternating stack (32, 46); and substrate-side metal interconnect structures 296 electrically connecting a respective pair of one of the substrate-side contact via structures 286 and one of the connection via structures 288. In one embodiment, each of the substrate-side metal interconnect structures 296 comprises a source-side metal line contacting a planar surface of the upright-stepped dielectric material portion 165. In one embodiment, the memory die 900 further comprises a backside insulating layer (290, 292) contacting a backside surface of the semiconductor material layer 10 and the planar surface of the upright-stepped dielectric material portion 165 and embedding the substrate-side metal interconnect structures 196.

In one embodiment, the laterally-isolated through-stack connection via structures (82, 288) vertically extend through the contact-level dielectric layer 80 and the upright-stepped dielectric material portion 165; source-side end surfaces of the laterally-isolated through-stack connection via structures (82, 288) are located within a horizontal plane including substrate-side end surfaces of the substrate-side contact via structures 286; and interconnect-side end surfaces of the laterally-isolated through-stack connection via structures (82, 288) are located within a horizontal plane including interconnect-side end surfaces of the interconnect-side contact via structures 86.

In one embodiment, the memory die 900 further comprises interconnect-level dielectric layers (90, 110, 120, 130, 140) embedding metal interconnect structures (96, 118, 128, 138) and located on an opposite side of the substrate with respect to the alternating stack (32, 46), wherein the metal interconnect structures (96, 118, 128, 138) are electrically connected to the electrically conductive layers 46.

In one embodiment, semiconductor structure further comprises a logic die 700 comprising a logic circuit configured to control operation of memory elements within the memory stack structures 55, and comprising logic-side dielectric material layers 760 embedding logic-side metal interconnect structures 780 and logic-side metal bonding pads 792, wherein: the memory die 900 comprises memory-side metal bonding pads 148 embedded in the interconnect-level dielectric layers (90, 110, 120, 130, 140) and electrically connected to the metal interconnect structures (96, 118, 128, 138); and the logic die 700 is bonded to the memory die 900 through metal-to-metal bonding between the logic-side metal bonding pads 792 and the memory-side metal bonding pads 148.

The various embodiments of the present disclosure can be employed to provide a three-dimensional memory array including double-sided stepped surfaces. The number of electrically conductive layers that can be employed for the three-dimensional memory array can be increased, and may be doubled, through use of the double-sided stepped surfaces. The increased number of electrically conductive layers may be advantageously employed to increase device density in the three-dimensional memory array. Furthermore, the area of each staircase region can be reduced by half compared to having the staircase regions located on the same side of the memory die. Finally, the chip length can also be reduced to improve the fit of the dies in the package. Logic circuits for operating the three-dimensional memory array can be provided in a logic die 700, which can be bonded to the memory die 900 through metal-to-metal bonding or through other suitable bonding methods.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die, the memory die comprising:
    an alternating stack of insulating layers and electrically conductive layers located over a substrate; and
    memory stack structures vertically extending through the alternating stack,
wherein:
    the alternating stack comprises a first layer stack including first insulating layers and first electrically conductive layers and a second layer stack including second insulating layers and second electrically conductive layers and vertically spaced from the substrate by the first layer stack;
    the first layer stack comprises a first staircase region in which the first electrically conductive layers have respective lateral extents that increase with a vertical distance from the substrate to provide first stepped surfaces;
    the second layer stack comprises a second staircase region in which the second electrically conductive layers have respective lateral extents that decrease with the vertical distance from the substrate to provide second stepped surfaces;
    an upright-stepped dielectric material portion contacting the first stepped surfaces and having a first variable horizontal-cross-sectional area that decreases with the vertical distance from the substrate;
    a retro-stepped dielectric material portion contacting the second stepped surfaces having a second variable horizontal-cross-sectional area that increases with the vertical distance from the substrate;
    substrate-side contact via structures vertically extending through the upright-stepped dielectric material portion and contacting a proximal surface of a respective one of the first electrically conductive layers; and
    interconnect-side contact via structures vertically extending through the retro-stepped dielectric material portion and contacting a distal surface of a respective one of the second electrically conductive layers;

wherein:
the substrate comprises a semiconductor material layer having a front surface in contact with a proximal planar surface of the alternating stack and a backside surface located on an opposite side of the front surface;
the memory die comprises a contact-level dielectric layer located on a distal planar surface of the alternating stack;
substrate-side end surfaces of the substrate-side contact via structures are located within a horizontal plane including a planar surface of the upright-stepped dielectric material portion;
a backside surface of the semiconductor material layer is located within the horizontal plane including the planar surface of the upright-stepped dielectric material portion; and
a sidewall of the upright-stepped dielectric material portion contacts the semiconductor material layer.

2. The semiconductor structure of claim 1, wherein interconnect-side end surfaces of the interconnect-side contact via structures are located within a horizontal plane including a distal surface of the contact-level dielectric layer.

3. The semiconductor structure of claim 1, wherein the memory die further comprises:
laterally-isolated through-stack connection via structures comprising a respective combination of a connection via structure and a tubular dielectric spacer and vertically extending through each layer within the alternating stack; and
substrate-side metal interconnect structures electrically connecting a respective pair of one of the substrate-side contact via structures and one of the connection via structures.

4. The semiconductor structure of claim 3, wherein each of the substrate-side metal interconnect structures comprises a source-side metal line contacting a planar surface of the upright-stepped dielectric material portion, and wherein each memory stack structure comprises a vertical semiconductor channel and a memory film.

5. The semiconductor structure of claim 4, wherein the memory die further comprises a backside insulating layer contacting a backside surface of the semiconductor material layer and the planar surface of the upright-stepped dielectric material portion and embedding the substrate-side metal interconnect structures.

6. The semiconductor structure of claim 3, wherein:
the laterally-isolated through-stack connection via structures vertically extend through the contact-level dielectric layer and the upright-stepped dielectric material portion;
source-side end surfaces of the laterally-isolated through-stack connection via structures are located within a horizontal plane including substrate-side end surfaces of the substrate-side contact via structures; and
interconnect-side end surfaces of the laterally-isolated through-stack connection via structures are located within a horizontal plane including interconnect-side end surfaces of the interconnect-side contact via structures.

7. The semiconductor structure of claim 1, wherein the memory die further comprises interconnect-level dielectric layers embedding metal interconnect structures and located on an opposite side of the substrate with respect to the alternating stack, wherein the metal interconnect structures are electrically connected to the electrically conductive layers.

8. The semiconductor structure of claim 7, further comprising a logic die comprising a logic circuit configured to control operation of memory elements within the memory stack structures, and comprising logic-side dielectric material layers embedding logic-side metal interconnect structures and logic-side metal bonding pads, wherein:
the memory die comprises memory-side metal bonding pads embedded in the interconnect-level dielectric layers and electrically connected to the metal interconnect structures; and
the logic die is bonded to the memory die through metal-to-metal bonding between the logic-side metal bonding pads and the memory-side metal bonding pads.

* * * * *